United States Patent
Ishikawa et al.

(10) Patent No.: US 11,156,918 B2
(45) Date of Patent: Oct. 26, 2021

(54) PHOTOSENSITIVE COMPOSITION, CURED FILM AND ORGANIC EL DISPLAY DEVICE

(71) Applicant: TORAY INDUSTRIES, INC., Tokyo (JP)

(72) Inventors: Akihiro Ishikawa, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 153 days.

(21) Appl. No.: 16/491,497

(22) PCT Filed: Mar. 15, 2018

(86) PCT No.: PCT/JP2018/010246
§ 371 (c)(1),
(2) Date: Sep. 5, 2019

(87) PCT Pub. No.: WO2018/180548
PCT Pub. Date: Oct. 4, 2018

(65) Prior Publication Data
US 2020/0033728 A1  Jan. 30, 2020

(30) Foreign Application Priority Data

Mar. 29, 2017 (JP) .............................. JP2017-065228

(51) Int. Cl.
*G03F 7/038* (2006.01)
*G03F 7/004* (2006.01)
(Continued)

(52) U.S. Cl.
CPC .......... *G03F 7/0382* (2013.01); *G03F 7/0045* (2013.01); *G03F 7/028* (2013.01); *H01L 51/5012* (2013.01)

(58) Field of Classification Search
CPC ...... G03F 7/038; G03F 7/0382; G03F 7/0387; G03F 7/039; G03F 7/0392; G03F 7/0395
See application file for complete search history.

(56) References Cited

U.S. PATENT DOCUMENTS

| 2012/0271044 A1* | 10/2012 | Chang ................. G02B 5/208 540/140 |
| 2016/0079333 A1* | 3/2016 | Shishido ............. H01L 27/3244 257/72 |

(Continued)

FOREIGN PATENT DOCUMENTS

| JP | 9-319076 A | 12/1997 |
| JP | 2008077859 A * | 4/2008 |

(Continued)

OTHER PUBLICATIONS

Shin-Etsu MicroSi, The Difference Between Positive and Negative Photoresist, Mar. 5, 2013, MicroSi, https://www.microsi.com/blog/the-difference-between-positive-and-negative-photoresist/ (Year: 2013).*

(Continued)

*Primary Examiner* — John A McPherson
*Assistant Examiner* — Nicholas E Brown
(74) *Attorney, Agent, or Firm* — Birch, Stewart, Kolasch & Birch, LLP

(57) ABSTRACT

A photosensitive composition containing at least one compound selected from the group of the following (a-1) to (a-3) and containing (b) a photosensitizer:
- (a-1) an epoxy compound having a $C_9$-$C_{19}$ long-chain alkyl group,
- (a-2) a resin having a structure represented by the following general formula (1), and
- (a-3) a resin having a structure represented by the following general formula (2).

(Continued)

A photosensitive composition capable of forming a pixel division layer that has high flexibility and affords excellent light emission reliability to an organic EL display device is provided.

15 Claims, 3 Drawing Sheets

(51) Int. Cl.
*G03F 7/028* (2006.01)
*H01L 51/50* (2006.01)

(56) References Cited

U.S. PATENT DOCUMENTS

2016/0291402 A1* 10/2016 Wang .................. H01L 27/3218
2016/0362588 A1* 12/2016 Moon .................. H01L 51/5246

FOREIGN PATENT DOCUMENTS

| | | | |
|---|---|---|---|
| JP | 2009-155547 A | | 7/2009 |
| JP | 2011-138116 A | | 7/2011 |
| JP | 2012068630 A | * | 4/2012 |
| JP | 2013-91676 A | | 5/2013 |
| KR | 20140096423 A | * | 8/2014 |
| KR | 20150003744 A | * | 1/2015 |
| KR | 20160079319 A | * | 7/2016 |
| KR | 10-2016-0115149 A | | 10/2016 |
| WO | WO-2014129320 A1 | * | 8/2014 |

OTHER PUBLICATIONS

English Machine Translation of JP2012068630A (Year: 2012).*
English Machine Translation of KR20140096423A (Year: 2014).*
English Machine Translation of KR20150003744A (Year: 2015).*
English Machine Translation of KR20160079319A (Year: 2016).*
English Machine Translation of WO2014129320A1 (Year: 2014).*
International Search Report, issued in PCT/JP2018/010246, PCT/ISA/210, dated May 29, 2018.
Written Opinion of the International Searching Authority, issued in PCT/JP2018/010246, PCT/ISA/237, dated May 29, 2018.

* cited by examiner

[Fig. 1]
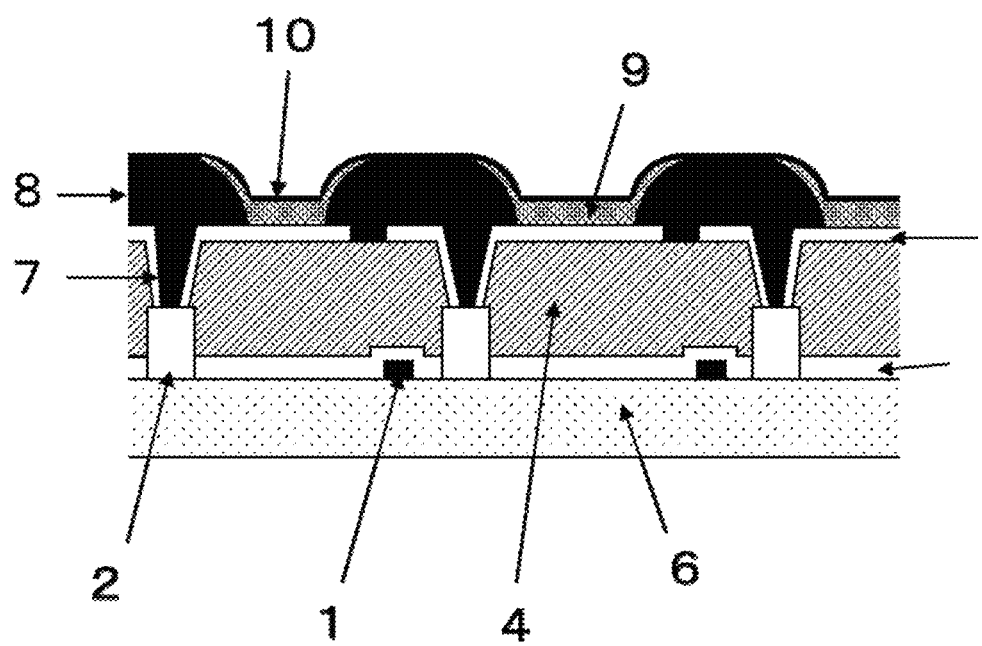

[Fig. 2]
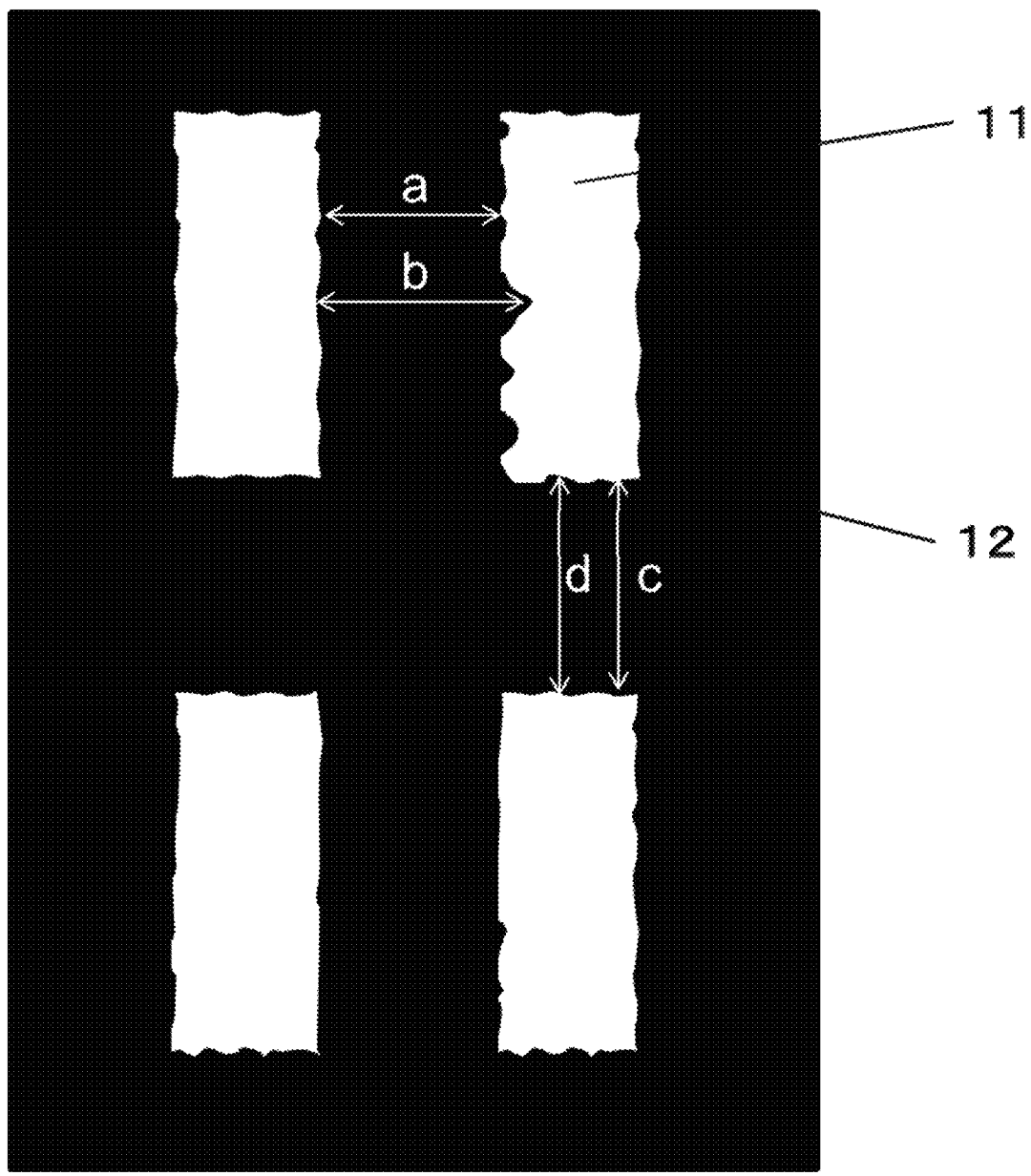

[Fig. 3]
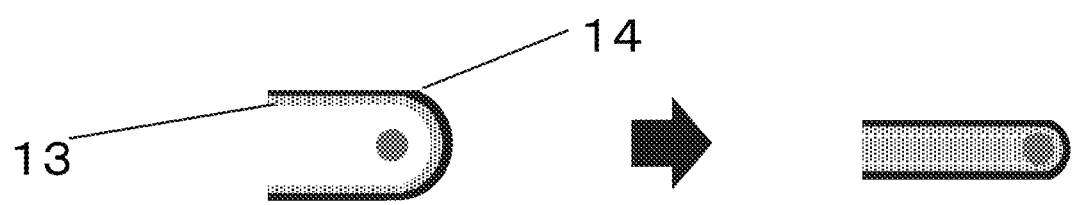
[Fig. 4]
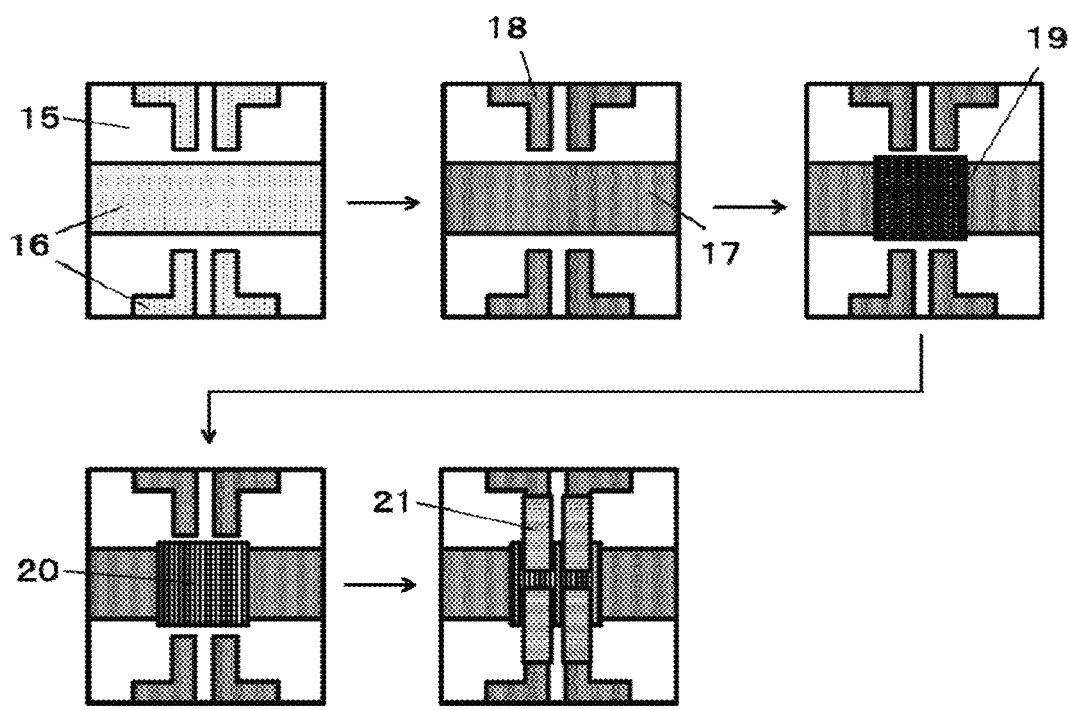

PHOTOSENSITIVE COMPOSITION, CURED FILM AND ORGANIC EL DISPLAY DEVICE

TECHNICAL FIELD

The present invention relates to photosensitive compositions, cured films, and organic EL display devices.

BACKGROUND ART

An organic EL display device is a self-luminous type of display device that emits light by virtue of energy induced by recombination of electrons injected from a cathode and electron holes injected from an anode. It is known that an organic light emitting material used for the light emitting pixels of an organic EL display device is susceptible to gaseous components and water, and that exposure to these decreases the light emission reliability of an organic EL display device. To enhance the light emission reliability, it is essential not only to increase the durability of an organic light emitting material itself but also to enhance the properties of the peripheral materials included in the light emitting element, such as a pixel division layer formed on electrodes and a planarization layer covering a drive circuit. In addition, an organic EL display device reflects outside light incident outdoors, such as sunlight, thus decreases in visibility, and accordingly needs a technology for preventing outside light reflection. A common technology for preventing outside light reflection is, for example, a technology including a polarizing plate on the light extraction side of a light emitting element, but this technology is problematic in that the polarizing plate masks part of the amount of light emitted from the light emitting element, and thus decreases the display luminance. To solve this problem, a disclosed technology allows the pixel division layer to contain dispersed colorant such as pigment for the purpose of decreasing outside light reflection and increasing the display luminance without including a polarizing plate on the display portion of an organic EL display device, wherein the technology thus affords light-shielding property.

CITATION LIST

Patent Literature

Specific examples of such a technology include a photosensitive composition for forming a black pixel division layer (for example, Patent Literature 1 and 2).
  Patent Literature 1: WO2017/057281
  Patent Literature 2: WO2017/169763

SUMMARY OF INVENTION

Technical Problem

In recent years, diversification in the design of a display device is accompanied by development of a flexible organic EL display device which allows the whole panel display portion to be bent and can be folded by a user. Apart from enhancement of the display luminance, recent interest has focused more on a technology for blackening a pixel division layer in view of the capability of the technology to suppress outside light reflection without including a thick and insufficiently flexible polarizing plate and thus to enhance the flexibility of a flexible organic EL display device. However, forming black pixel division layers using a photosensitive compositions described in Patent Literature 1 and 2 has caused a problem in that the flexibility and light emission reliability of the pixel division layers are insufficient. Such a problem is much dependent on the volume of the pixel division layer per unit area in the display portion, and, for example, there is a problem in that the flexibility and light emission reliability are further deteriorated in a case where the pixel division layer having a thickness of 2 μm changed from a thickness of 1 μm is formed in order to obtain better patterning properties and further obtain a high function for suppressing outside light reflection. With the above-mentioned situation in the background, a photosensitive composition capable of forming a pixel division layer having excellent flexibility and light emission reliability has been greatly demanded.

Solution to Problem

To solve the above-mentioned problems, the photosensitive composition according to the present invention has the following constitution. That is, it is a photosensitive composition containing at least one compound selected from the group of the following (a-1) to (a-3) and containing (b) a photosensitizer.
  (a-1) an epoxy compound having a $C_9$-$C_{19}$ long-chain alkyl group,
  (a-2) a resin having a structure represented by the following general formula (1),
  (a-3) a resin having a structure represented by the following general formula (2).

[Chem. 1]

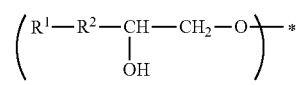

(In the general formula (1), $R^1$ represents a $C_9$-$C_{19}$ long-chain alkyl group, $R^2$ represents $COOCH_2$ or an oxymethylene group, and * represents a bonding position.)

[Chem. 2]

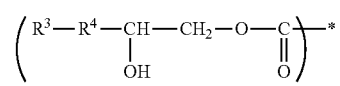

(In the general formula (2), $R^3$ represents a $C_9$-$C_{19}$ long-chain alkyl group, $R^4$ represents $COOCH_2$ or an oxymethylene group, and * represents a bonding position.)

The cured film according to the present invention has the following constitution. That is, it is a cured film composed of a cured product of the above-mentioned photosensitive composition.

The organic EL display device according to the present invention has the following constitution. That is, it is an organic EL display device including the cured film of the above-mentioned photosensitive composition.

The photosensitive composition according to the present invention preferably further contains (c) an inorganic pigment having near infrared shielding property.

In the photosensitive composition according to the present invention, the (c) inorganic pigment having near infrared shielding property preferably contains at least one inorganic pigment selected from the group consisting of an inorganic black pigment having a titanium atom(s), an inorganic black pigment having a zirconium atom(s), and amorphous carbon black.

In the photosensitive composition according to the present invention, the long-chain alkyl group of the compound selected from the group consisting of the (a-1) to the (a-3) is preferably a branched alkyl group having a total of three or more tertiary carbon(s) and/or quaternary carbon(s).

In the photosensitive composition according to the present invention, the long-chain alkyl group of the compound selected from the group consisting of the (a-1) to the (a-3) is preferably a branched alkyl group represented by the following structural formula (50).

[Chem. 3]

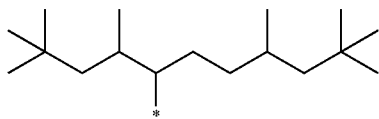

(50)

(In the general formula (50), * represents a binding position.)

It is preferable that the photosensitive composition according to the present invention contains at least one compound of the (a-2) and the (a-3), that the resin having a structure represented by the above-mentioned general formula (1) is a polyimide resin, and that the resin having a structure represented by the above-mentioned general formula (2) is a cardo resin.

The photosensitive composition according to the present invention preferably further contains (d) an organic black pigment.

The photosensitive composition according to the present invention preferably has negative photosensitivity, wherein the (b) photosensitizer contains a compound having two or more radical polymerizable groups and contains a photopolymerization initiator.

The photosensitive composition according to the present invention preferably has positive photosensitivity, wherein the (b) photosensitizer contains a photo-acid generator.

The photosensitive composition according to the present invention preferably further contains (e) a vanadyl phthalocyanine near infrared absorbing dye.

A cured film, 2.0 μm thick, formed of the photosensitive composition according to the present invention preferably has the maximum light transmittance of 5.0% or less in wavelengths from 780 to 1,000 nm and a permittivity of less than 5.0 at a frequency of 1 kHz.

Advantageous Effects of Invention

The photosensitive composition according to the present invention affords a highly linearly patterned cured film having excellent flexibility, and the cured film used as a pixel division layer in an organic EL display device can enhance the light emission reliability.

BRIEF DESCRIPTION OF DRAWINGS

FIG. 1 is a cross-sectional view of the TFT substrate of an organic EL display device, showing an embodiment of the present invention.

FIG. 2 is a schematic view showing the waviness of the pattern edges of a cured film in Examples.

FIG. 3 is a schematic view showing a testing method for evaluating the flexibility of a cured film in Examples.

FIG. 4 is a schematic view showing a method of producing an organic EL display device including a pixel division layer in Examples.

DESCRIPTION OF EMBODIMENTS

The present invention will be described in detail below.

As used herein, a value range denoted using "to" means a range including the value before and the value after the "to" as the lower limit value and the upper limit value respectively.

Visible light means a light having a wavelength range from 380 nm to less than 780 nm, and near infrared light means a light having a wavelength range from 780 nm to 1,000 nm.

Light-shielding property mean a function by virtue of which the intensity of light that has transmitted a cured film is decreased compared with the intensity of light which is incident perpendicularly to the cured film.

"C.I." used to designate a colorant is short for Colour Index Generic Name, and on the basis of a color index issued by The Society of Dyers and Colourists, the Colour Index Generic Names represent the chemical structures and crystal forms of pigments and dyes in reference to the colorants registered in the color index. As used herein, an alkali developing solution refers to an organic alkali aqueous solution unless otherwise specified.

The photosensitive composition according to the present invention means an alkali development type of composition having one photosensitivity of negative photosensitivity and positive photosensitivity, which are below-mentioned. For example, a photosensitive composition does not fall under the photosensitive composition according to the present invention if the former composition has the properties of curing by light irradiation as a UV-curing type of coating material or a UV-curing type of adhesive does, but has no photosensitivity of the above-mentioned negative photosensitivity and positive photosensitivity, and is not an alkali development type.

The weight-average molecular weight (Mw) of a resin means a value that is obtained by analyzing the resin by gel permeation chromatography using tetrahydrofuran as a carrier and that is converted using a calibration curve based on standard polystyrene.

Carbon black and amorphous carbon black are classified according to the practice in a subject technological field, and they may be classified as organic black pigments because the constituent element is carbon, or classified as inorganic black pigments in the light of the electrical properties and optical properties. In the present DESCRIPTION, carbon black and amorphous carbon black are classified as inorganic pigments according to the latter.

The present inventors have made a theoretical examination concerning the above-mentioned problems, and have revealed that a larger amount of colorant component such as pigment tends to make the flexibility lower, and generally has a trade-off relationship with light-shielding property imparted to a pixel division layer. As used herein, the flexibility refers to the less likelihood that cracking or breaking is caused to a pixel division layer curved at a given radius of curvature, and a lower flexibility causes a light emitting abnormality such as a lighting failure and accordingly decreases the value of the display device. The present inventors have also found that irradiating the display portion continuously with outside light such as sunlight outdoors accelerates the deterioration of the light emitting element and decreases the light emission reliability. That is, the present inventors have revealed that an organic EL display device including no polarizing plate needs a higher light emission reliability compared with an organic EL display device including a polarizing plate. As used herein, a decrease in light emission reliability refers to a phenomenon in which keeping an organic EL display device lighted continuously causes the light emitting area in the light emitting element to decrease, with the elapse of the lighting time, compared with the light emitting area in the initial stage of lighting, resulting in a decrease in luminance. The value of a display device decreases as the light emission reliability lowers.

In view of the above-mentioned, the present inventors have vigorously studied and consequently discovered that a compound having both a long-chain alkyl group having a carbon number in a specific range and an epoxy group has or a resin having a specific structure in which the epoxy group of the compound is ring-opened and added has a specially remarkable effect in solving the problems. That is, the present inventors have completed the present invention through the discovery that a photosensitive composition containing at least one compound selected from the group consisting of the above-mentioned (a-1) to (a-3) and containing (b) a photosensitizer makes it possible to form a pixel division layer that achieves excellent flexibility and light emission reliability and, at the same time, retains high pattern linearity.

The photosensitive composition according to the present invention contains at least one compound selected from the group consisting of the following (a-1) to (a-3).

(a-1) an epoxy compound having a $C_9$-$C_{19}$ long-chain alkyl group,
(a-2) a resin having a structure represented by the following general formula (1), and
(a-3) a resin having a structure represented by the following general formula (2).

[Chem. 4]

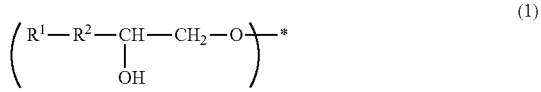

(In the general formula (1), $R^1$ represents a $C_9$-$C_{19}$ long-chain alkyl group, $R^2$ represents $COOCH_2$ or an oxymethylene group, and * represents a bonding position.)

[Chem. 5]

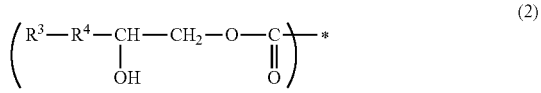

(In the general formula (2), $R^3$ represents a $C_9$-$C_{19}$ long-chain alkyl group, $R^4$ represents $COOCH_2$ or an oxymethylene group, and * represents a binding position.)

Any one of: (a-1) an epoxy compound having a $C_9$-$C_{19}$ long-chain alkyl group, (a-2) a resin having a structure represented by the above-mentioned general formula (1), (a-3) a resin having a structure represented by the above-mentioned general formula (2) can be used independently, or two or more of them can be used in mixture. In addition, (a-2) a resin having a structure represented by the above-mentioned general formula (1) and (a-3) a resin having a structure represented by the above-mentioned general formula (2) is each defined as not belonging to (a-1) an epoxy compound having a $C_9$-$C_{19}$ long-chain alkyl group even if the resins further have an epoxy group in the molecule.

The compound contained in the photosensitive composition according to the present invention and selected from the group consisting of the above-mentioned (a-1) to (a-3) can afford both high flexibility and high light resistance to a finally obtained pixel division layer. The improved light resistance results in enhancing the light emission reliability of an organic EL display device including the pixel division layer. As used herein, light resistance does not mean commonly well known color fastness of a cured film in the presence of oxygen but means deterioration resistance of a light emitting element in an oxygen-free sealed space.

Furthermore, the compound selected from the group consisting of the above-mentioned (a-1) to (a-3) has, as a third effect, an effect decreasing the permittivity of a finally obtained pixel division layer. This effect is greatly advantageous in that the effect does not impair the flexibility of a cured film, compared with, for example, a conventional method in which the permittivity is lowered by allowing the film to contain hollow silica or the like having no light-shielding property so that the film can include voids. In addition, the permittivity-decreasing effect can suppress an excessive increase in the permittivity of a pixel division layer and suppress an adverse effect on driving, such as unevenness of luminance, even in a case where the film is allowed to contain the below-mentioned (c) inorganic pigment having near infrared light-shielding property, wherein the inorganic pigment generally has higher permittivity compared with all organic components constituting the pixel division layer. That is, the film is allowed to contain an inorganic pigment having a higher refractive index and higher light-shielding property per volume, compared with an organic pigment or dye, while the inorganic pigment keeps an increase in the permittivity low. Accordingly, it is possible that the volume of a particle component that is contained in a pixel division layer and needed to express desired light-shielding property is set to a low value. As a result, the layer can obtain high flexibility although the layer exhibits high light-shielding property.

Examples of the $C_9$-$C_{19}$ long-chain alkyl group of (a-1) an epoxy compound having a $C_9$-$C_{19}$ long-chain alkyl group include straight-chain alkyl groups and branched alkyl groups, examples thereof including an n-(or iso)nonyl group, n-(or iso)decyl group, n-(or iso)dodecyl group, n-(or iso)tridecyl group, n-(or iso)tetradecyl group, n-(or iso)pentadecyl group, n-(or iso)palmityl group, n-(or iso)hexadecyl group, n-(or iso)heptadecyl group, n-(or iso)octadecyl group, n-(or iso)stearyl group, and n-(or iso)nonadecyl group. As used herein, n- means a straight-chain form, and iso means a branched form. As used herein, a long-chain refers to having nine or more carbon atoms included in one alkyl group, and does not apply to an alkyl group having eight or less carbon atoms. In addition, the $C_9$-$C_{19}$ long-chain alkyl group of (a-1) and epoxy compound having a $C_9$-$C_{19}$ long-chain alkyl group contains no cyclic alkyl group.

The epoxy group of (a-1) an epoxy compound having a $C_9$-$C_{19}$ long-chain alkyl group encompasses an alicyclic epoxy group and a glycidyl group. In addition, the number of epoxy groups that the (a-1) component has in the molecule is not limited to a particular value.

The (a-1) epoxy compound having a $C_9$-$C_{19}$ long-chain alkyl group can be synthesized as a compound having a monovalent $C_9$-$C_{19}$ long-chain alkyl group and a carboxyl group in the molecule, or as an epoxy-modified product derived from a compound having a monovalent $C_9$-$C_{19}$ long-chain alkyl group and a hydroxyl group. Examples of such epoxy compounds include glycidyl esters, glycidyl ethers, and glycidyl ether/esters, and these compounds are generally available as reactive diluents used to lower the viscosity of and enhance the coatability of non-photosensitive epoxy resin coating materials of a thermosetting type. Commercially available products may be used. In the present invention, the molecular weight per molecule of (a-1) an epoxy compound having a $C_9$-$C_{19}$ long-chain alkyl group is preferably 200 to 3,000, more preferably 300 to 1,000, from the viewpoint of flexibility and light emission reliability.

Specific examples of (a-1) an epoxy compound having a $C_9$-$C_{19}$ long-chain alkyl group include a compound having a $C_9$ branched alkyl group and represented by the structural formula (3) or the structural formula (4), a compound having a $C_{10}$ branched alkyl group and represented by the structural formula (5) or the structural formula (6), a compound having a $C_{12}$ straight-chain alkyl group and represented by the structural formula (7) or the structural formula (8), a compound having a $C_{15}$ branched alkyl group and represented by the structural formula (9) or the structural formula (10), a compound having a $C_{17}$ branched alkyl group and represented by any one of the structural formulae (11), (12), (13), and (14), a compound having a $C_{17}$ straight-chain alkyl group and represented by the structural formula (15) or the structural formula (16), a compound having a $C_{19}$ branched alkyl group and represented by the structural formula (17) or the structural formula (18), a compound having a $C_9$ branched alkyl group and represented by the structural formula (19), a compound having a $C_{12}$ straight-chain alkyl group and represented by the structural formula (20), a compound having a $C_{14}$ straight-chain alkyl group and represented by the structural formula (21), a compound having a $C_{16}$ branched alkyl group and represented by the structural formula (22), a compound having a $C_{18}$ branched alkyl group and represented by the structural formula (23).

[Chem. 6]

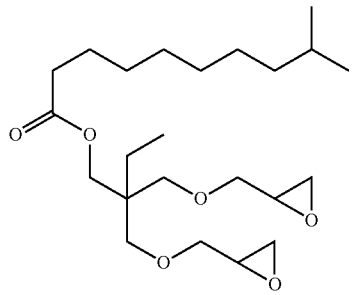

(3)

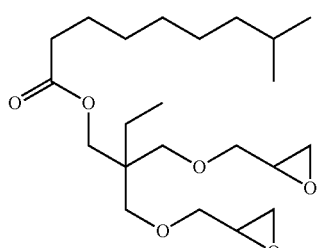

(4)

[Chem. 7]

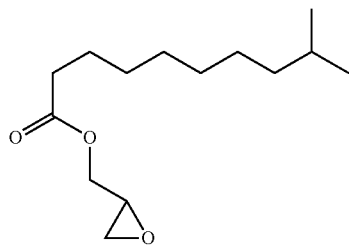

(5)

(6)

[Chem. 8]

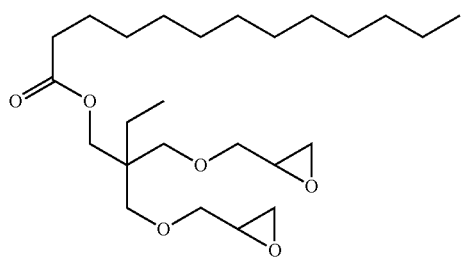

(7)

(8)

[Chem. 9]

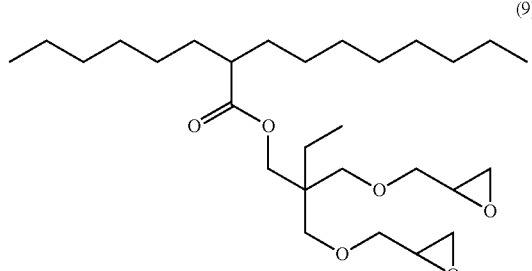

(9)

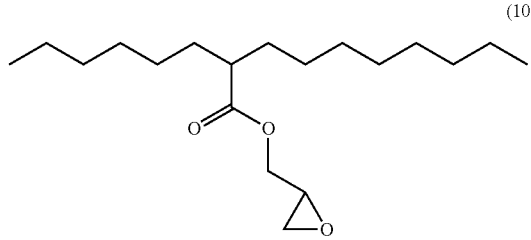

(10)

[Chem. 10]
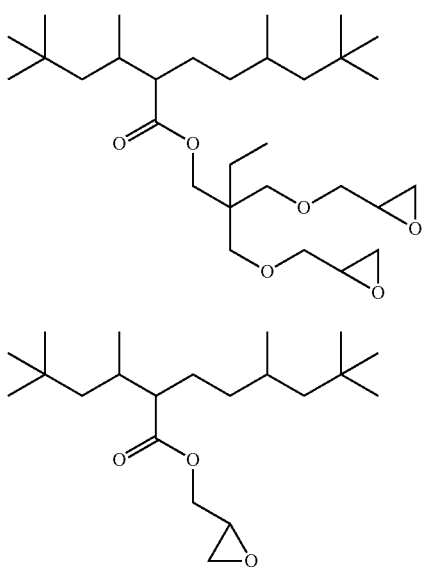
(11)
(12)
[Chem. 11]
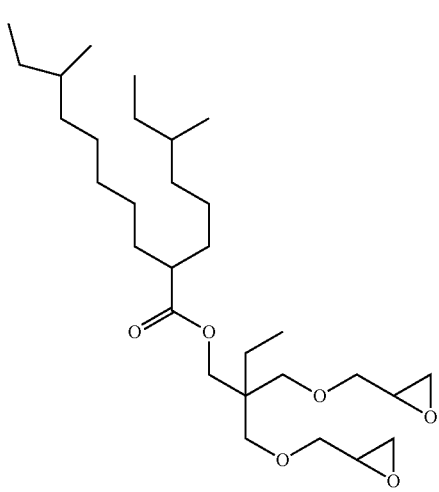
(13)
(14)
[Chem. 12]
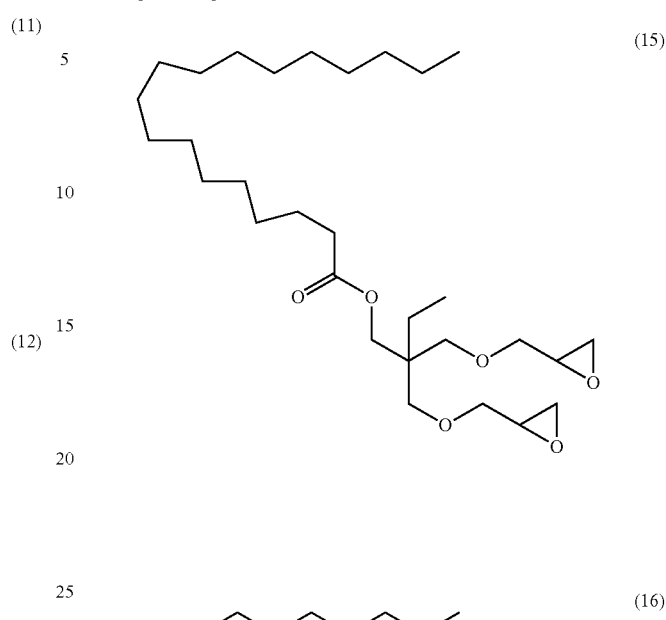
(15)
(16)
[Chem. 13]
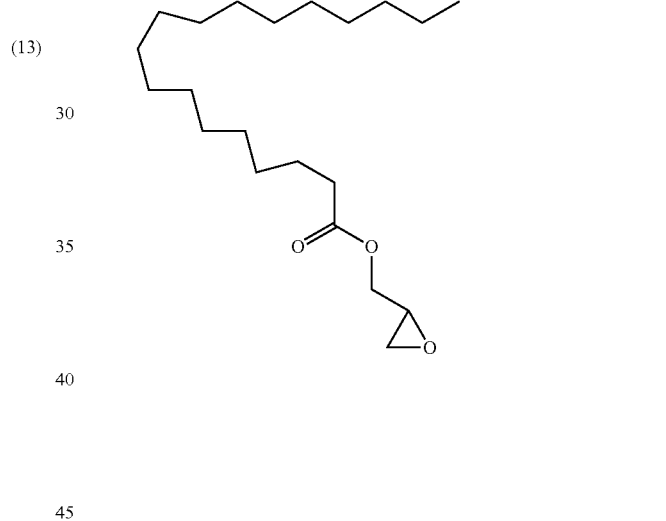
(17)

(18)

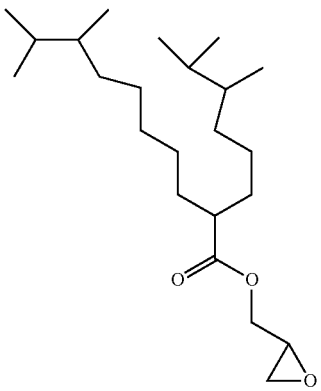

[Chem.14]

(19)

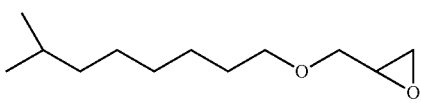

(20)

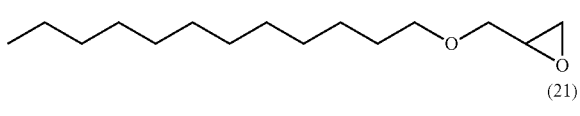

(21)

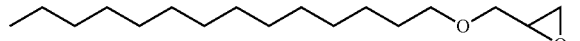

[Chem. 15]

(22)

(23)

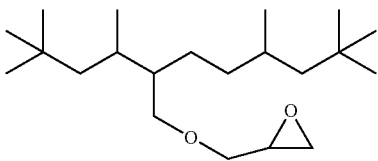

To obtain the effect of the present invention, it is necessary in the present invention that the number of carbon atoms of the long-chain alkyl group of the compound selected from the group consisting of the above-mentioned (a-1) to (a-3) is in the range from 9 to 19. In a case where the number of carbon atoms of the long-chain alkyl group of the compound selected from the group consisting of the above-mentioned (a-1) to (a-3) is less than 9, the compound results in failing to enhance flexibility and light emission reliability, and in a chase where the number of carbon atoms is more than 19, the compound results in failing to form a pixel division layer having high pattern linearity. Higher pattern linearity, that is, a less distorted pattern edge makes it possible to stably obtain a pixel division layer whose openings have a more uniform area and which have higher resolution, to prevent defects and breaking of wiring from occurring in the electrode layer formed on the surface of the pixel division layer, and to suppress the occurrence of non-lighted portions in the light emitting pixel.

The number of carbon atoms of the $C_9$-$C_{19}$ long-chain alkyl group is preferably 11 or more, more preferably 13 or more, from the viewpoint of flexibility and light emission reliability. In addition, the number of carbon atoms is preferably 18 or less, more preferably 17 or less, in order to afford suitable solubility in an alkali developing solution in the below-mentioned development process and enhance pattern linearity.

The $C_9$-$C_{19}$ long-chain alkyl group preferably has a branched structure to afford excellent flexibility and light emission reliability, and, among others, is more preferably a branched alkyl group having a total of three or more tertiary carbon atom(s) and/or quaternary carbon atom(s), still more preferably a branched alkyl group having a total of four or more thereof. As used herein, the number of a tertiary carbon atom(s) and/or a quaternary carbon atom(s) refers to the number of branching points that a $C_9$-$C_{19}$ alkyl group has. Specific preferable examples of long-chain alkyl groups having a total of four or more of a tertiary carbon atom(s) and/or a quaternary carbon atom(s) include a branched alkyl group represented by the following general formula (50). Specific examples of compounds having such a long-chain alkyl group include a compound represented by any one of the structural formulae (11), (12), and (23). Among others, a compound having two or more epoxy groups in the molecule and represented by the structural formula (11) can particularly preferably be used for the photosensitive composition according to the present invention, in order to enhance the heat-cross-linking density in the below-mentioned curing process and obtain higher flexibility and light emission reliability. In addition, a mixture of a plurality of compounds having different numbers of carbon atoms and/or branches can be used, wherein the compounds are selected from the group of epoxy compounds having a long-chain alkyl group whose number of carbon atoms is in the range from 9 to 19.

The amount of (a-1) an epoxy compound having a $C_9$-$C_{19}$ long-chain alkyl group contained in the photosensitive composition according to the present invention is preferably 10.0% by weight or more, more preferably 15.0% by weight or more, of all solids in the photosensitive composition in order to enhance flexibility and light emission reliability sufficiently. The amount is preferably 25.0% by weight or less, more preferably 20.0% by weight or less, in order to afford suitable solubility in an alkali developing solution and obtain good patterning properties.

In addition, allowing the photosensitive composition according to the present invention to further contain an epoxy compound having no $C_9$-$C_{19}$ long-chain alkyl group makes it possible to adjust the rate of dissolution into an alkali developing solution, the cross-linking density in the curing process, and the like.

Examples of (a-2) a resin having a structure represented by the above-mentioned general formula (1) include a resin obtained by allowing a compound having a $C_9$-$C_{19}$ long-chain alkyl group and one epoxy group to undergo ring-opening addition reaction with a resin having a hydroxyl group. Examples of preferably usable resins having a hydroxyl group include alkali soluble resins having a hydroxyl group.

The addition is allowed to take place so that at least a part of the hydroxyl groups of the alkali soluble resin can remain, and in addition, the epoxy groups are ring-opened. The hydroxyl groups thus provided has an effect that affords good patterning properties and, at the same time, can enhance flexibility and light emission reliability. In addition, the hydroxyl group of the alkali soluble resin is preferably a phenolic hydroxyl group in that the phenolic hydroxyl group is highly reactive with an epoxy group.

On the other hand, examples of (a-3) a resin having a structure represented by the above-mentioned general formula (2) include a resin obtained by allowing an epoxy compound having a $C_9$-$C_{19}$ long-chain alkyl group and one epoxy group to undergo ring-opening addition reaction with a resin having a carboxyl group. Examples of preferably usable resins having a carboxyl group include alkali soluble resins having a carboxyl group.

The addition is allowed to take place so that at least a part of the carboxyl groups of the alkali soluble resin can remain, and in addition, the epoxy groups are ring-opened. The hydroxyl groups thus provided afford good patterning properties and, at the same time, can enhance and flexibility and light emission reliability.

A monofunctional epoxy compound is preferably used alone as the epoxy compound that has a $C_9$-$C_{19}$ long-chain alkyl group and that is used for ring-opening addition reaction to obtain an alkali soluble resin in which a $C_9$-$C_{19}$ long-chain alkyl group has been introduced, wherein the monofunctional epoxy compound is used to avoid an excessive increase in the weight-average molecular weight (Mw) or avoid generation of a gelated component. Specific examples of usable compounds include a compound having one epoxy group in the molecule, wherein the compound is selected from among the compounds represented by the structural formulae (3) to (23), and, among others, a compound represented by the above-mentioned structural formula (12) or a compound represented by the above-mentioned structural formula (23) is preferable, from the viewpoint of the flexibility and light emission reliability based on the number of carbon atoms and branched structure of the long-chain alkyl group, and a compound represented by structural formula (12) is more preferable, taking into consideration the high reactivity of an epoxy group.

Examples of alkali soluble resins used to obtain (a-2) a resin having a structure represented by the above-mentioned general formula (1) and (a-3) a resin having a structure represented by the above-mentioned general formula (2) include: alkali soluble cardo resins, alkali soluble acrylic resins, alkali soluble novolac resins, alkali soluble polyimide resins, alkali soluble polyimide precursors, alkali soluble polybenzoxazole resins, alkali soluble polybenzoxazole precursors, alkali soluble polyamide resins, and alkali soluble siloxane resins; preferably alkali soluble polyimide resins, alkali soluble polyimide precursors, alkali soluble cardo resins, and alkali soluble acrylic resins in the light of excellent heat resistance and pigment dispersibility; more preferably alkali soluble polyimide resins, alkali soluble polyimide precursors, alkali soluble polybenzoxazole resins, alkali soluble polybenzoxazole precursors, and alkali soluble cardo resins in the light of excellent heat resistance; still more preferably among others, alkali soluble polyimide resins easily soluble in the below-mentioned acetate organic solvent alone, in the light of the excellent heat resistance and pigment dispersibility.

Heat resistance required for a pixel division layer of an organic EL display device is preferably 230° C. or more, more preferably 250° C. or more. This heat resistance can suppress the amount of gas (outgas) generated from a pixel division layer under high temperature conditions and suppress deterioration of a light emitting element, and accordingly, enhance the light emission reliability of an organic EL display device. As used herein, an alkali soluble resin refers to a resin having a hydroxyl group and/or carboxyl group as an alkali soluble group in the structure, and having an acid value of 30 mgKOH/g or more and a weight-average molecular weight (Mw) of 2,000 or more and 150,000 or less. Preferable examples of alkali soluble polyimide resins include an alkali soluble polyimide resin having a structural unit represented by the general formula (24).

[Chem. 16]

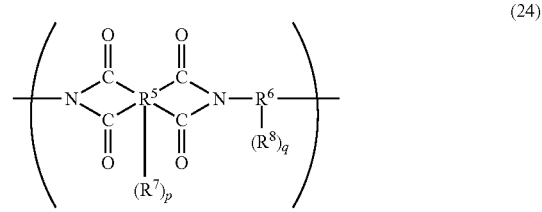

(24)

(In the general formula (24), $R^5$ represents a tetravalent to decavalent organic group; $R^6$ represents a bivalent to octavalent organic group; $R^7$ and $R^8$ each independently represent a phenolic hydroxyl group, sulfonic group, or thiol group, and at least one of $R^7$ and $R^8$ has a phenolic hydroxyl group; and p and q are each independently in the range from 0 to 6.)

In the general formula (24), $R^5$—$(R^7)_p$ represents a residue of an acid dianhydride. $R^5$ is preferably a $C_5$-$C_{40}$ organic group having an aromatic ring or a cyclic aliphatic group.

Examples of acid dianhydrides include: pyromellitic dianhydride; 3,3',4,4'-biphenyltetracarboxylic dianhydride; 3,3', 4,4'-benzophenonetetracarboxylic dianhydride; bis(3,4-dicarboxyphenyl)sulfone dianhydride; bis(3,4-dicarboxyphenyl)ether dianhydride; tetracarboxylic dianhydrides having an aromatic ring, such as 2,2-bis(3,4-dicarboxyphenyl)hexafluoropropane dianhydride; tetracarboxylic dianhydrides having an aliphatic group, such as butanetetracarboxylic dianhydride; 1,2,3,4-cyclopentanetetracarboxylic dianhydride; bicyclo[2.2.2]octo-7-ene-tetracarboxylic dianhydride; and tetracarboxylic dianhydrides having a cyclic aliphatic group, such as bicyclo[2.2.2]octanetetracarboxylic dianhydride.

In the general formula (24), $R^6$—$(R^8)_q$ represents a residue of a diamine. $R^6$ is preferably a $C_5$-$C_{40}$ organic group having an aromatic ring or a cyclic aliphatic group.

Examples of diamines include: diamines having an aromatic ring, such as m-phenylenediamine, p-phenylenediamine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(4-aminophenoxy)phenyl]propane, bis[4-(4-aminophenoxy)phenyl]hexafluoropropane, bis[4-(3-aminophenoxy)phenyl]sulfone, 9,9-bis(4-aminophenyl)fluorene, diaminodiphenylether, diaminodiphenylsulfone, diaminodiphenylmethane, diaminodiphenylpropane, diaminodiphenylhexafluoropropane, diaminodiphenylthioether, benzidine, 2,2'-bistrifluorobenzidine, 2,2'-bistrifluorobenzidine, and 2,2-bis(3-amino-4-hydroxyphenyl)hexafluoropropane; and diamines having a cyclic aliphatic group, such as 2,5-bis(aminomethyl)bicyclo[2.2.1]heptane and 2,6-bis(aminomethyl)bicyclo[2.2.1]heptane.

An alkali soluble polyimide resin having a structural unit represented by the general formula (24) preferably has, at a main-chain end, a carboxyl group, phenolic hydroxyl group, sulfonic group, and/or thiol group, more preferably a carboxyl group and/or phenolic hydroxyl group. Capping an end of the alkali soluble polyimide resin with an end-capping agent having a carboxyl group, phenolic hydroxyl group, sulfonic group, and/or thiol group makes it possible to introduce these groups into a main-chain end. Examples of end-capping agents include monoamines, acid anhydrides, monocarboxylic acids, mono acid chloride compounds, and mono active ester compounds.

The acid value of the alkali soluble polyimide resin is preferably 30 mgKOH/g or more, more preferably 50 mgKOH/g or more, from the viewpoint of solubility in an alkali developing solution. In addition, the acid value is preferably 300 mgKOH/g or less, more preferably 250 mgKOH/g or less, with a view to suppressing the peeling of the pattern edge of a pixel division layer.

The alkali soluble polyimide resin preferably has a weight-average molecular weight of 5,000 or more, more preferably 10,000 or more, from the viewpoint of the hardness of the pixel division layer. In addition, the weight-average molecular weight is preferably 100,000 or less, more preferably 70,000 or less, from the viewpoint of solubility in an alkali developing solution.

Specific preferable examples of (a-2) a resin having a structure represented by the general formula (1) include a polyimide resin having, in the molecule, a structural unit represented by the structural formula (25), wherein the polyimide resin can be obtained by allowing an epoxy compound represented by the above-mentioned structural formula (12) to undergo ring-opening addition reaction with the phenolic hydroxyl group of an alkali soluble polyimide resin synthesized using 2,2-bis(3-amino-4-hydroxyphenyl)hexafluoropropane, which is a diamine, and using an acid dianhydride.

[Chem. 17]

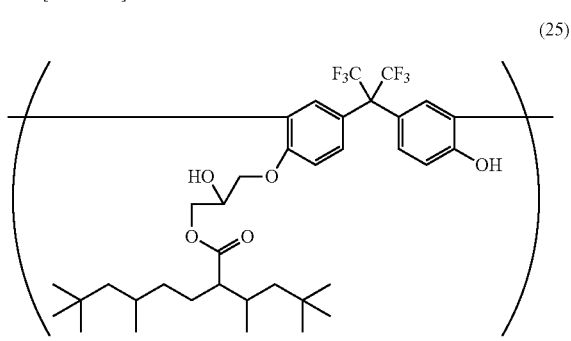

(25)

An alkali soluble cardo resin refers to an alkali soluble resin having a cardo backbone, and the cardo backbone refers to a backbone in which two aromatic groups are linked by single bonding to a quaternary carbon atom which is a cyclic carbon atom of a cyclic structure. Examples of cardo backbones include a backbone in which two phenyl groups are linked by the respective carbon-carbon single bonds to a quaternary carbon atom of a fluorene backbone, 1-phenyl-2,3-dihydro-1H-indene backbone, or N-phenylphenolphthalein backbone. Such an alkali soluble cardo resin can be synthesized from a compound having, in the molecule, a fluorene backbone, 1-phenyl-2,3-dihydro-1H-indene backbone, and/or N-phenylphenolphthalein backbone in addition to two aromatic groups having a hydroxyl group or epoxy group. In a case where the photosensitive composition according to the present invention is a negative photosensitive composition, an alkali soluble cardo resin further having a radical polymerizable group is preferably used.

Specific preferable examples of alkali soluble cardo resins include: cardo resins having a fluorene backbone and having a structural unit represented by the following general formula (25) and a radical polymerizable group; cardo resins having a 1-phenyl-2,3-dihydro-1H-indene backbone and having a structural unit represented by the following general formula (26) and a radical polymerizable group; cardo resins having an N-phenylphenolphthalein backbone and having a structural unit represented by the following general formula (27) and a radical polymerizable group.

[Chem. 18]

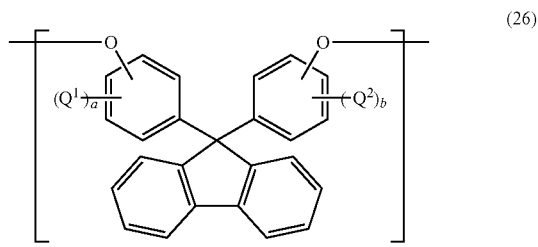

(26)

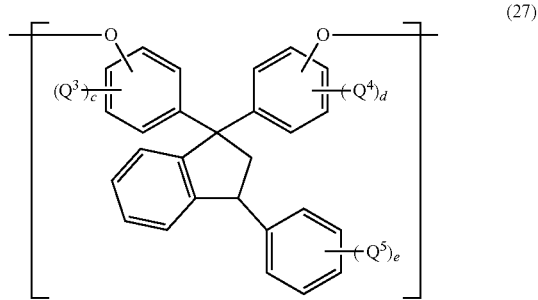

(27)

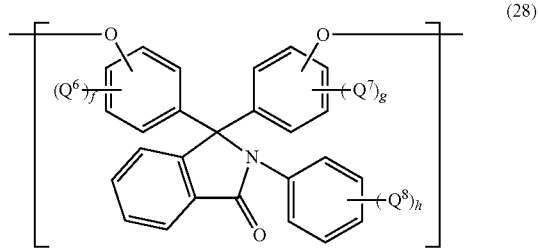

(28)

(In the general formulae (26), (27), and (28), $Q^1$ to $Q^8$, the same or different, independently represent an atom or substituent directly bound to a benzene ring and is a hydrogen atom, $C_1$-$C_6$ alkyl group, or $C_1$-$C_6$ alkoxy group; and a to h represent the number of substituents: $C_1$-$C_6$ alkyl group and/or $C_1$-$C_6$ alkoxy group, and is 1 or 2.)

The acid value of the alkali soluble cardo resin is preferably 30 mgKOH/g or more, more preferably 50 mgKOH/g or more, from the viewpoint of solubility in an alkali developing solution. In addition, the acid value is preferably 300 mgKOH/g or less, more preferably 250 mgKOH/g or less, with a view to suppressing the peeling of the pattern edge of a pixel division layer.

The alkali soluble cardo resin preferably has a weight-average molecular weight (Mw) of 2,000 or more, more preferably 3,000 or more, with a view to suppressing the peeling of the pattern edge. In addition, the alkali soluble cardo resin preferably has a weight-average molecular weight (Mw) of 40,000 or less, more preferably 20,000 or less, with a view to suppressing the gelation of the alkali soluble cardo resin during polymerization and suppressing the amount of the development residue in the development process.

A commercially available product may be used as the alkali soluble cardo resin, examples thereof including "ADEKA ARKLS" (registered trademark) WR-301 (manufactured by ADEKA Corporation) and "OGSOL" (registered trademark) CR-TR1, CR-TR2, CR-TR3, CR-TR4, CR-TR5, and CR-TR6 (which are all manufactured by Osaka Gas Chemicals Co., Ltd.).

Specific preferable examples of (a-3) a resin having a structure represented by the general formula (2) include a cardo resin having, in the molecule, a structural unit represented by the structural formula (29), which cardo resin is obtained by allowing an epoxy compound represented by the above-mentioned structural formula (12) to undergo ring-opening addition reaction with the aromatic carboxyl group of an alkali soluble cardo resin.

[Chem. 19]

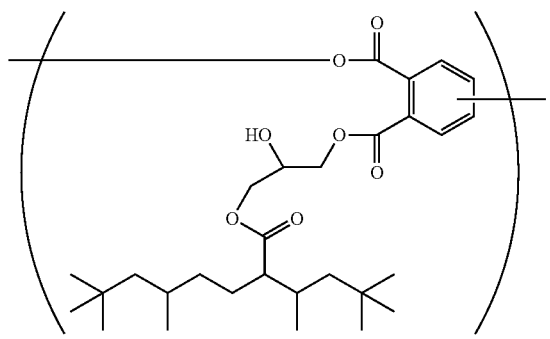

(29)

Examples of methods of obtaining (a-2) a resin having a structure represented by the above-mentioned general formula (1) and (a-3) a resin having a structure represented by the above-mentioned general formula (2) include a method in which a compound having a $C_9$-$C_{19}$ long-chain alkyl group and one epoxy group is mixed and stirred with an alkali soluble resin in an organic solvent under a dry nitrogen gas stream, followed by allowing the resulting mixture to react under heated conditions at 80 to 200° C. for 30 to 300 minutes. Examples of solvents to be use for the reaction include ethers, acetates, esters, ketones, aromatic hydrocarbons, and alcohols, and these can be used singly, or in combination of two or more kinds thereof. In addition, an addition catalyst may be used to sufficiently promote the ring-opening addition reaction at low heating temperature, and examples of addition catalysts to be used for the reaction include: amino catalysts such as dimethylaniline, 2,4,6-tris(dimethylaminomethyl)phenol, and dimethylbenzylamine; tin catalysts such as tin (II) 2-ethylhexanoate and dibutyltin laurate; titanium catalysts such as titanium (IV) 2-ethylhexanoate; phosphorus catalysts such as triphenylphosphine; lithium catalysts such as lithium naphthenate; zirconium catalysts such as zirconium naphthenate; chromium catalysts such as chromium naphthenate, chromium acetylacetonate, and chromium chloride. Phosphorus catalysts and amino catalysts are preferably used in order to suppress an increase in permittivity, wherein the increase is caused by a catalyst remaining in a finally obtained pixel division layer. The end point of the reaction can be suitably set in accordance with the rate of epoxy groups disappearing after the start of the reaction in the system. In addition, whether or not the photosensitive composition or pixel division layer has a long-chain alkyl group and an epoxy group contained in the (a-1) component, a structure contained in the (a-2) component and represented by the above-mentioned general formula (1), and/or a structure contained in the (a-3) component and represented by the above-mentioned general formula (2) can be analyzed and identified using a known technique such as NMR and IR.

The photosensitive composition according to the present invention is allowed to further contain an alkali soluble resin not belonging to the above-mentioned (a-1) to (a-3) compounds, in order that the below-mentioned rate of dissolution in an alkali developing solution may be adjusted appropriately and that the pixel division layer may be formed into a desired pattern shape. An alkali soluble resin not belonging to the above-mentioned (a-1) to (a-3) compounds can be selected for use from the group consisting of the above-mentioned various alkali soluble resins exemplified as raw materials for obtaining (a-2) a resin having a structure represented by the above-mentioned general formula (1) and (a-3) a resin having a structure represented by the above-mentioned general formula (2).

The photosensitive composition according to the present invention has negative photosensitivity or positive photosensitivity. The photosensitive composition may have negative photosensitivity, wherein the exposed portions of the film are photo-cured by pattern exposure via an exposure mask to have lower alkali solubility, and the unexposed portions of the film are removed using an alkali developing solution to form a pattern. Alternatively, the photosensitive composition may have positive photosensitivity, wherein the alkali solubility of the exposed portions of the film are made relatively higher by pattern exposure via an exposure mask than that of the unexposed portions of the film, and the exposed portions of the film are thus removed using an alkali developing solution to form a pattern. In a case where the light-shielding property imparted to the pixel division layer is set to a higher level, that is, in a case where the photosensitive composition according to the present invention is allowed to contain a large amount of colorant, the composition preferably has negative photosensitivity in that the negative photosensitivity makes it possible to decrease the necessary minimum exposure amount for obtaining the same pattern, that is, to enhance sensitivity to exposure and thus enhance productivity.

The photosensitive composition according to the present invention contains (b) a photosensitizer. In a case where the photosensitive composition according to the present invention has negative photosensitivity, (b) a photosensitizer contains a compound having two or more radical polymerizable groups and contains a photopolymerization initiator. Using the compound having two or more radical polymerizable groups together with the below-mentioned photopolymerization initiator makes it possible that exposure induces radical polymerization reaction resulting in photo-curing, and then that removal of the unexposed portions with an alkali developing solution results in patterning.

Preferable examples of radical polymerizable groups include (meth)acryl groups with a view to enhancing sensitivity during exposure and enhancing the hardness of the cured film. As used herein, a (meth)acryl group refers to a methacryl group or acryl group. Examples of compounds having two or more (meth)acryl groups include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4- butanediol di(meth)acrylate, 1,6-hexanediol di(meth)acrylate, 1,9-nonanediol di(meth)acrylate, 1,10-decanediol di(meth)acrylate, dimethylol-tricyclodecane di(meth)acrylate, ethoxylated glycerol tri(meth)acrylate, pentaerythritol tri(meth)acrylate, pentaerythritol tetra(meth)acrylate, ethoxylated pentaerythritol tri(meth)acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, ε-caprolactone-added (meth)acrylate of dipentaerythritol, ethoxylated bisphenol A di(meth)acrylate, 2,2-bis[4-(3-(meth)acryloxy-2-hydroxypropoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxy propoxy)phenyl]fluorene, 9,9-bis(4-(meth)acryloxy phenyl)fluorene, acid-modified products thereof, ethylene oxide-modified products thereof, and propylene oxide-modified products thereof. These may be used singly, or in combination of two or more kinds thereof. With a view to promoting photo-curing and enhancing patterning properties, the photosensitizer preferably contains at least a compound having three or more radical polymerizable groups, and among others, a compound having a caprolactone-derived flexible chain and an acryl group in the molecule is more preferable in that such a compound has a high reaction rate in the exposure process and affords excellent flexibility. Specific examples of such a compound include ε-caprolactone-added acrylate of dipentaerythritol represented by the following structural formula (41).

The amount of the compound having two or more radical polymerizable groups is preferably 10% by weight or more, more preferably 15% by weight or more, of all solids in the photosensitive composition, with a view to enhancing sensitivity to exposure. In addition, the amount is preferably 30% by weight or less, more preferably 25% by weight or less, with a view to allowing the pattern edge to have a gently tapered shape and avoiding breaking of wiring in the electrodes formed on the surface of a pixel division layer.

The photopolymerization initiator refers to a compound that, when exposed, undergoes bond cleavage and/or reaction to generate radicals. Allowing the photosensitizer to contain a photopolymerization initiator enables the compound having two or more radical polymerizable groups to be photo-cured via exposure, enables the solubility of the exposed portions in an alkali developing solution to be relatively lower compared with the unexposed portions, and thus enables patterning to be performed by removing the unexposed portions with the alkali developing solution.

Examples of photopolymerization initiators include: carbazole photopolymerization initiators such as "ADEKA OPTOMER" (registered trademark) N-1818, N-1919, and "ADEKA ARKLS" (registered trademark) NCI-831 (which are manufactured by ADEKA Corporation); acylphosphineoxide photopolymerization initiators such as 2,4,6-trimethylbenzoyl-diphenyl-phosphineoxide ("IRGACURE" (registered trademark) TPO manufactured by BASF SE); oxime ester photopolymerization initiators such as 1,2-octanedione, 1-[4-(phenylthio)-,2-(O-benzyloxime)] ("IRGACURE" (registered trademark) OXE01 manufactured by BASF SE) and ethanone, 1-[9-ethyl-6-(2-methylbenzoyl)-9H-carbazol-3-yl]-,1-(O-acetyloxime) ("IRGACURE" (registered trademark) OXE02 manufactured by BASF SE); and α-aminoalkylphenon photopolymerization initiators such as 2-methyl-1-(4-methylthiophenylphenyl)-2-morpholinopropane-1-one ("IRGACURE" (registered trademark) 907 manufactured by BASF SE), 2-benzyl-2-dimethylamino-1-(4-morpholinophenyl)-butanone-1 ("IRGACURE" (registered trademark) 369 manufactured by BASF SE), and 2-(dimethylamino)-2-[(4-methylphenyl)methyl]-1-[4-(4-morpholinyl)phenyl]-1-butanone ("IRGACURE" (registered trademark) 379EG manufactured by BASF SE). These may be used singly, or in combination of two or more kinds thereof. Among others, carbazol photopolymerization initiators and oxime ester photopolymerization initiators are preferable in that they have high sensitivity to a ray mixture containing j-rays (313 nm), i-rays (365 nm), h-rays (405 nm), and g-rays (436 nm) in the below-mentioned exposure process. Among others, photopolymerization initiators having both a carbazole structure and an oxime ester structure are more preferable, from the viewpoint of sensitivity and deep curability during exposure. Specific examples of photopolymerization initiators falling within such photopolymerization initiators include N-1919, NCI-831, and OXE02 among the above-mentioned ones.

The amount of photopolymerization initiator is preferably 5 parts by weight or more, more preferably 10 parts by weight or more, with respect to 100 parts by weight of the compound having two or more radical polymerizable groups, with a view to enhancing sensitivity to exposure. On the other hand, the amount of photopolymerization initiator is preferably 60 parts by weight or less, more preferably 40 parts by weight or less, with respect to 100 parts by weight of the compound having two or more radical polymerizable groups, taking into consideration deep curability to exposure.

On the other hand, (b) a photosensitizer contains a photoacid generator in a case where the photosensitive composition according to the present invention has positive photosensitivity. Allowing the photosensitizer to contain a photoacid generator enables the solubility of the exposed portions in an alkali developing solution to be relatively higher via exposure compared with the unexposed portions in the below-mentioned exposure process, and thus enables patterning to be performed by removing only the exposed portions with an alkali developing solution.

A preferable photo-acid generator is a quinonediazide compound. A more preferable quinonediazide compound is a reactant resulting from allowing the compound having a phenolic hydroxyl group to be esterified with quinonediazidesulfonic acid chloride.

Examples of compounds having a phenolic hydroxyl group include Bis-Z, BisP-EZ, TekP-4HBPA, TrisP-HAP, TrisP-PA, TrisP-PHBA, BisOCHP-Z, BisP-MZ, BisP-PZ, BisP-IPZ, BisOCP-IPZ, BisP-CP, BisRS-2P, BisRS-3P, BisP-OCHP, methylenetris-p-CR, methylenetetra-p-CR, BisRS-26X, Bis-PFP-PC (which are all manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, and TEP-BIP-A (which are all manufactured by Asahi Yukizai Corporation).

Examples of quinonediazidesulfonic acid chlorides include 4-naphthoquinonediazidesulfonic acid chloride and 5-naphthoquinonediazidesulfonic acid chloride. Such quinonediazide compounds are preferable because they have high sensitivity to a ray mixture containing j-rays (313 nm), i-rays (365 nm), h-rays (405 nm), and g-rays (436 nm) in the below-mentioned exposure process.

The amount of the photo-acid generator is preferably 5 to 30% by weight of all solids in the photosensitive composition, from the viewpoint of the patterning properties and heat resistance of a finally obtained pixel division layer. In a case where it is necessary to enhance the alkali solubility of the photosensitive composition according to the present invention in an alkali developing solution, part of the phenolic hydroxyl groups of the above-mentioned compounds having a phenolic hydroxyl group are enabled on purpose to remain without being esterified.

The photosensitive composition according to the present invention can contain a thermosetting accelerator. As used herein, a thermosetting accelerator refers to a compound that achieves an effect promoting cross-linking between epoxy compounds and/or heat-cross-linking between an epoxy compound and an alkali soluble resin.

In a case where the photosensitive composition according to the present invention contains (a-1) an epoxy compound having a $C_9$-$C_{19}$ long-chain alkyl group, using a thermosetting accelerator together may enhance the mechanical strength of the pixel division layer and enhance the flexibility. In addition, the use of a thermosetting accelerator can further decrease the residual ratio of an epoxy group and a polar group such as a hydroxyl group or carboxyl group of the alkali soluble resin, resulting in making it possible to decrease the below-mentioned permittivity of the pixel division layer. Examples of the thermosetting accelerators include imidazole accelerators, acid anhydride accelerators, and thiol accelerators. These can be used individually, or in combination of two or more kinds thereof.

It is preferable that the photosensitive composition according to the present invention further contains a colorant, with a view to allowing a finally obtained pixel division layer to be blackened and further have a function that suppresses outside light reflection. Examples of colorants include pigments and dyes, and pigments are preferable in that they have high coloring power and excellent heat resistance.

As used herein, a pigment refers to particles that have light absorptive power at least in the visible light range and are insoluble in the photosensitive composition according to the present invention, and coloring power refers to light-shielding property per unit volume occupied by a colorant in the film. The photosensitive composition according to the present invention more preferably contains at least an inorganic pigment in that containing an inorganic pigment can decrease the total amount of colorant needed to impart desired light-shielding property and enhance the flexibility of a pixel division layer. In allowing the pixel division layer to have light-shielding properties in all ranges from the visible light range to the near infrared range, both an inorganic pigment and an organic pigment are preferably used together to avoid an excessive increase in permittivity.

The photosensitive composition according to the present invention preferably contains (c) an inorganic pigment having near infrared light-shielding property.

Containing (c) an inorganic pigment having near infrared light-shielding property enables the pixel division layer to have a function that suppresses reflection of not only light in the visible light range but also near infrared light. A proximity sensor and a near infrared sensor that is used for iris recognition, facial recognition, and the like are conventionally disposed in the frame part, but incorporating these sensors in the internal portion of a display makes it possible to suppress internal scattering of near infrared light included in outside light such as sunlight and to enhance the detection sensitivity of these sensors. As a result, it is possible to produce an organic EL display device which has a high sensitivity near infrared sensor and nevertheless has a narrow frame portion or no frame portion (bezel-less), and in which the display portion occupies a wide area in the panel area. A polarizing plate mounted in the panel of an organic EL display device usually has a high light transmittance, 80 to 95% as the maximum value and 50 to 70% as the minimum value, in the near infrared range, and has low near infrared light-shielding property. Accordingly, the above-mentioned effect achieved by allowing the photosensitive composition according to the present invention to contain (c) an inorganic pigment having near infrared light-shielding property is useful in both cases of an organic EL display device including a polarizing plate and an organic EL display device including no polarizing plate.

As used herein, (c) an inorganic pigment having near infrared light-shielding property encompasses an inorganic black pigment having a titanium atom(s), an inorganic black pigment having a zirconium atom(s), amorphous carbon black, and carbon black, and in addition, encompasses a group of inorganic pigments that satisfy the maximum light transmittance of 70.0% or less in the near infrared range (in wavelengths from 780 to 1,000 nm) in the thickness direction of a cured film, wherein the cured film is obtained by applying the photosensitive composition followed by heat-treatment (carried out at atmospheric pressure under a nitrogen atmosphere at 250° C. for one hour), and has a film thickness of 2.0 µm, and wherein the amount of the inorganic pigment contained in the cured film is 35.0% by weight. The amount of the inorganic pigment contained in the cured film can be calculated from the amount of the fired ash from which all organic components have been volatilized using a small electric oven.

Analysis and identification of (c) an inorganic pigment having near infrared light-shielding property contained in the photosensitive composition according to the present invention or in a cured film formed using the photosensitive composition can be carried out using a combination of known techniques such as X-ray diffraction pattern, STEM-EDX, and the like.

Preferable examples of (c) an inorganic pigment having near infrared light-shielding property include inorganic black pigments having a titanium atom(s), inorganic black pigments having a zirconium atom(s), and amorphous carbon black from the viewpoint that these have high electrical insulation properties and low permittivity and can enhance the driving stability of an organic EL display device. As used herein, amorphous carbon black refers to non-crystalline carbon black particles. On the other hand, what is simply called carbon black refers to carbon black particles that have crystallinity and are commonly known in applications for colorants. Amorphous carbon black and carbon black are completely distinguished by whether they each have crystallinity or not, and thus defined.

An inorganic black pigment having a titanium atom(s) means any one of titanium nitride represented by TiN, titanium oxynitride represented by $TiN_xO_y$ ($0<x<2.0$, $0.1<y<2.0$), titanium carbide represented by TiC, a solid solution of titanium nitride and titanium carbide, and a composite oxide or composite nitride of titanium and a metal other than titanium. Among others, one of titanium nitride and titanium oxynitride is preferable from the viewpoint that it has high light-shielding property in the visible light range, and in addition, a high exposure light transmittance in the exposure process. Titanium nitride is more preferable from the viewpoint that it has a low permittivity. Examples of methods of producing titanium nitride include a gas phase reaction method, and among others, titanium nitride synthesized by a thermal plasma method is preferable in that it can more easily afford particles that have a small primary particle size and a sharp particle size distribution. In addition, an inorganic black pigment having a titanium atom(s) preferably contains a smaller amount of, more preferably no amount of, titanium dioxide to avoid an increase in permittivity, wherein the titanium dioxide is an inorganic white pigment contained as an impurity and is represented by $TiO_2$.

An inorganic black pigment having a zirconium atom(s) means any one of zirconium nitride represented by $Zr_3N_4$, zirconium nitride represented by ZrN, zirconium oxynitride represented by ZrOxNy (0<x<2.0, 0.1<y<2.0), and a composite oxide or composite nitride of zirconium and a metal other than zirconium. Among others, zirconium nitride represented by ZrN is preferable in that it has high exposure light transmittance in the exposure process and low permittivity. Examples of methods of producing zirconium nitride include a gas phase reaction method, and among others, zirconium nitride synthesized by a thermal plasma method is preferable in that it can more easily afford particles that have a small primary particle size and a sharp particle size distribution. In addition, an inorganic black pigment having a zirconium atom(s) preferably contains a smaller amount of, more preferably no amount of, zirconium dioxide to avoid an increase in permittivity, wherein the zirconium dioxide is an inorganic white pigment contained as an impurity and is represented by $ZrO_2$.

The inorganic black pigment having a titanium atom(s) and inorganic black pigment having a zirconium atom(s) may be allowed to undergo surface treatment to modify the surface of the pigment, if necessary. Examples of methods of surface treatment include: a method in which an organic group containing a silicon atom is introduced as a surface modifying group by treatment with a silane coupling agent; a method in which part or all of the pigment surface is covered by a covering material such as silica, metal oxide, and/or an organic resin; and the like. Two or more of surface treatment methods may be combined. In some cases, carrying out such a surface treatment can enhance the long-term storage stability of the photosensitive composition. In this regard, the inorganic black pigment having a zirconium atom(s) and inorganic black pigment having a titanium atom(s) may form one primary particle as a solid solution containing both of them.

Amorphous carbon black means non-crystalline carbon black composed of a diamond structure ($SP^3$ structure) and a graphite structure ($SP^2$ structure). Amorphous carbon black corresponds to carbon classified as diamondlike carbon (DLC). Amorphous carbon black has higher insulation properties compared with the below-mentioned carbon black having crystallinity, and can be suitably used as a colorant without undergoing surface treatment. In a preferable production method, a carbon source is gasified, the gasified carbon vapor is cooled to be resolidified, followed by being once made flaky, and atomized by a dry type of pulverization treatment. In a case where a large part of the amorphous carbon black structure is an $SP^3$ structure, the amorphous carbon black has low light-shielding properties against visible light and near infrared light but can achieve enhanced insulation properties. On the other hand, in a case where a large part of the amorphous carbon black structure is an $SP^2$ structure, the amorphous carbon black has low insulation properties but can achieve enhanced light-shielding properties against visible light and near infrared light. That is, these properties inherent in a pigment can be controlled in accordance with synthesis conditions. Among others, amorphous carbon black having an $SP^3$ structure at 30 to 70 atom % with respect to the total of the $SP^3$ structure and $SP^2$ structure can preferably be used for the photosensitive composition according to the present invention. In addition, the ratios of the $SP^3$ structure and $SP^2$ structure can be analyzed by X-ray photoelectron spectroscopy.

The total amount of the above-mentioned inorganic black pigment having a titanium atom(s), inorganic black pigment having a zirconia atom, and amorphous carbon is preferably 5.0% by weight or more of all solids in the photosensitive composition according to the present invention with a view to enhancing near infrared light-shielding property. In addition, the total amount is preferably 35.0% by weight or less of all solids in the photosensitive composition with a view to avoiding an excessive increase in permittivity. As used herein, all solids mean the components resulting from excluding the solvent components from the photosensitive composition.

Examples of carbon black include furnace black, thermal black, channel black, acetylene black, Ketjen black, and lamp black, which are classified by the production method, and among others, furnace black produced by a furnace method is preferable in that furnace black has excellent dispersibility and makes it industrially easy to control the acidity of the surface of the pigment and the miniaturization of the particle size. Among others, the shorter the length of the structure in which particles are rigidly linked in the form of a string of beads and which is unique to carbon black, the more preferable, with a view to enhancing insulation properties. Furthermore, carbon black in which an organic group is surface-modified or which is covered with a covering material having high insulation properties is more preferable. A commercially available product may be used as such a surface-modified type of carbon black, and examples thereof include "TPK-1227" that is carbon black wherein an acidic functional group containing a sulfur atom is surface-modified and "TPX-1409" that is carbon black wherein the surface of the pigment is covered with silica (which are both manufactured by Cabot Corporation).

The total amount of carbon black is preferably 5.0% by weight or more of all solids in the photosensitive composition according to the present invention with a view to enhancing near infrared light-shielding property. In addition, the total amount is preferably 10.0% by weight or less of all solids in the photosensitive composition with a view to avoiding an excessive increase in permittivity.

The above-mentioned (c) inorganic pigments having near infrared light-shielding property may be used in mixture of two or more kinds thereof so that the pixel division layer can have desired optical properties. For example, mixing zirconium nitride assuming a more purplish black color and amorphous carbon assuming a more yellowish black color can tone the reflected color of the pixel division layer to neutral black whose saturation is well suppressed.

The average primary particle size of (c) an inorganic pigment having near infrared light-shielding property is preferably 5 nm or more, more preferably 10 nm or more, with a view to enhancing dispersibility and storage stability after dispersion. On the other hand, the average primary particle size is preferably 150 nm or less, more preferably 100 nm or less, with a view to affording high flexibility. As used herein, the average primary particle size means the number average value of primary particle sizes, which is calculated by a particle size measurement method using a particle size distribution measurement device of an image analysis type. Such an image can be photographed using a transmission electron microscope (TEM), and the average primary particle size can be calculated from an image of 100 or more primary particles of (c) an inorganic pigment having near infrared light-shielding property, wherein the image is photographed under the condition: a magnification ratio of 50,000×. In a case where (c) an inorganic pigment having near infrared light-shielding property is not spherical, the average value of the major axis and minor axis is regarded as the primary particle size. For image analysis, an image analysis type of particle size distribution software, Mac-View, produced by Mountech Co., Ltd. is used. In a case where it is necessary to make the average primary particle size smaller or grind coarse particles to make the particle size distribution sharp, a dry type of pulverization treatment may be carried out. For example, a hammer mill, ball mill, or the like can be used for the dry type of pulverization treatment. In addition, in a case where a dry type of pulverization treatment has its limitations for a reason such as the excessively high hardness of the pigment, it is desirable that coarse particles are not disintegrated but removed by classification.

As organic pigments, various organic pigments can be used, and among others, (d) an organic black pigment is preferable in that (d) an organic black pigment has excellent coloring power and can enhance flexibility. In this regard, organic pigments generally have extremely low light-shielding property in the near infrared range, but at the same time, advantageously have low permittivity, and accordingly, can be effectively used in the photosensitive composition according to the present invention as components for affording light-shielding property only in the visible light range and still avoiding an increase in permittivity.

As used herein, (d) an organic black pigment refers to a benzodifuranone black pigment, a perylene black pigment, an azo black pigment, and an isomer thereof. As used herein, an isomer encompasses a tautomer. An isomer may be contained as a mixture of a plurality of pigment powders and may be contained as a mixed crystal to form one primary particle.

A benzodifuranone black pigment means a pigment represented by the following general formula (30) or (31). A pigment represented by the following general formula (30) corresponds to what is called a pigment classified as lactam black.

[Chem. 20]

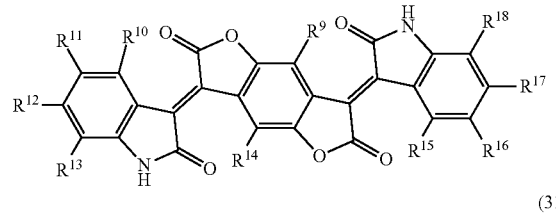

(30)

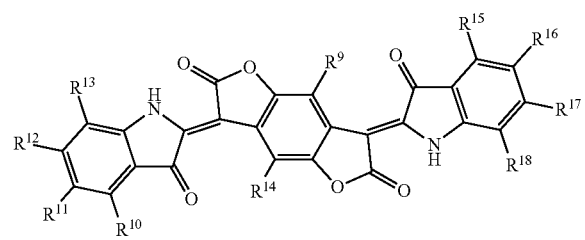

(31)

(In the general formulae (30) and (31), $R^9$ and $R^{14}$ independently represent a hydrogen atom, $CH_3$, $CF_3$, a fluorine atom, or a chlorine atom; $R^{10}$, $R^{11}$, $R^{12}$, $R^{13}$, $R^{15}$, $R^{16}$, $R^{17}$, and $R^{18}$ independently represent a hydrogen atom, halogen atom, $C_1$-$C_{12}$ alkyl group, $C_1$-$C_{12}$ cycloalkyl group, $C_1$-$C_{12}$ alkenyl group, $C_1$-$C_{12}$ cycloalkenyl group, $C_1$-$C_{12}$ alkynyl group, COOH, $COOR^{19}$, $COO^-$, $CONH_2$, $CONHR^{19}$, $CONR^{19}R^{20}$, CN, OH, $OR^{19}$, $OCOR^{19}$, $OCONH_2$, $OCONHR^{19}$, $OCONR^{19}R^{20}$, $NO_2$, $NH_2$, $NHR^{19}$, $NR^{19}R^{20}$, $NHCOR^{19}$, $NR^{19}COR^{20}$, $N{=}CH_2$, $N{=}CHR^{19}$, $N{=}CR^{19}R^{20}$, SH, $SR^{19}$, $SOR^{19}$, $SO_2R^{19}$, $SO_3R^{19}$, $SO_3H$, $SO_3^-$, $SO_2NH_2$, $SO_2NHR^{19}$, or $SO_2NR^{19}R^{20}$; $R^{10}$ and $R^{11}$, $R^{11}$ and $R^{12}$, $R^{12}$ and $R^{13}$, $R^{15}$ and $R^{16}$, $R^{16}$ and $R^{17}$, and $R^{17}$ and $R^{18}$ may be bound directly or via O, S, NH, or $NR^{19}$, respectively; and $R^{19}$ and $R^{20}$ independently represent a $C_1$-$C_{12}$ alkyl group, $C_1$-$C_{12}$ cycloalkyl group, $C_1$-$C_{12}$ alkenyl group, $C_1$-$C_{12}$ cycloalkenyl group, or $C_1$-$C_{12}$ alkynyl group.) Among others, a benzodifuranone black pigment wherein $R^9$ to $R^{18}$ are each a hydrogen atom is preferable, from the viewpoint of light-shielding property and light emission reliability, in other words, a benzodifuranone black pigment represented by the following structural formula (32) can preferably be used. As a benzodifuranone black pigment represented by the following structural formula (32), a commercially available product may be used, and examples thereof include "Irgaphor" (registered trademark) Black S0100 manufactured by BASF SE. In addition to this, a benzodifuranone black pigment wherein $R^{11}$ and $R^{16}$ are each $SO_3H$, $SO_3^-$, $SO_2NR^{19}R^{20}$, or COOH can be partially mixed as a dispersing assistant and allowed to undergo the below-mentioned wet type of dispersion treatment to afford higher dispersibility.

[Chem. 21]

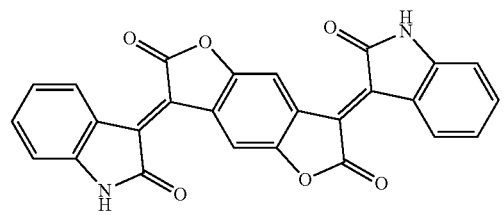

(32)

A perylene black pigment means a pigment represented by the following general formula (33) or (34), and C.I. Pigment Black 31 and 32. This corresponds to what is called a pigment classified as perylene black. Among others, a pigment represented by the following general formula (33) or (34) is preferable in that it has high light-shielding property.

[Chem. 22]

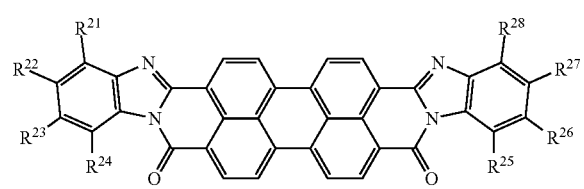

(33)

-continued

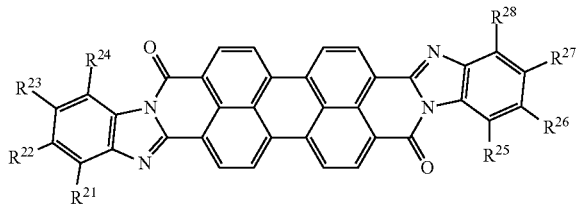
(34)

(In the general formulae (33) and (34), $R^{21}$ to $R^{28}$ independently represent a hydrogen atom, $C_1$-$C_{12}$ alkyl group, $C_1$-$C_6$ alkoxy group, or hydroxyl group.) Among others, a perylene black pigment wherein $R^{21}$ to $R^{28}$ are each a hydrogen atom is preferable, taking into consideration light-shielding property and light emission reliability, that is, a perylene black pigment(s) represented by the following structural formula(e) (35) and/or (36) can preferably be used. As perylene black pigments represented by the following structural formulae (35) and (36) (a cis-trans isomer mixture), a commercially available product may be used, and examples thereof include FK4280 manufactured by BASF SE.

[Chem. 23]

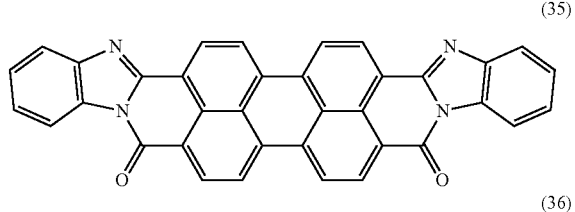
(35)

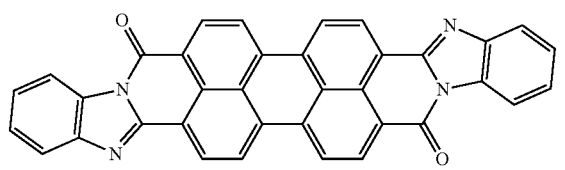
(36)

An azo black pigment means a pigment represented by the following general formula (37). This corresponds to what is called a pigment classified as azomethine black.

[Chem. 24]

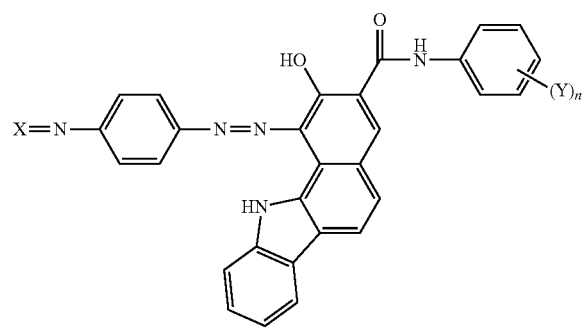
(37)

(In the general formula (37), X represents an organic group having an isoindolinone structure or an organic group having an isoindoline structure; Y represents at least one organic group selected from the group consisting of a $C_1$-$C_3$ alkyl group and $C_1$-$C_3$ alkoxy group; and n represents an integer of 1 to 5.)

From the viewpoint of light-shielding property and light emission reliability, preferable specific examples include an azo black pigment represented by the following structural formula (38) and an azo black pigment represented by the following structural formula (39).

[Chem. 25]

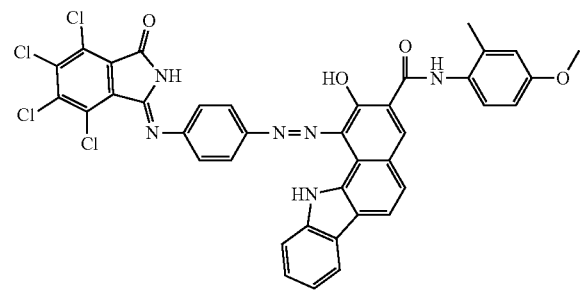
(38)

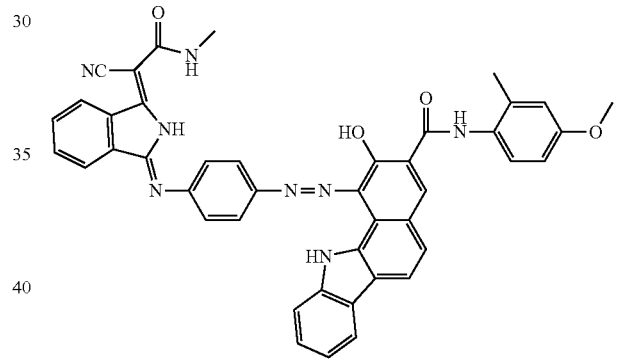
(39)

Organic pigments that may be used other than organic black pigments include various organic pigments such as yellow, orange, blue, red, green, purple, and brown ones. Allowing the photosensitive composition according to the present invention to contain two or more different organic pigments of different colors makes it possible to make the colors into a pseudo black color which imparts a black color to the pixel division layer, and adjusting the quantitative ratios of the pigments makes it possible to control the optical properties. Among others, a combination of yellow, blue, and red is preferable, from the viewpoint of light-shielding property and light emission reliability.

Examples of organic yellow pigments include C.I. Pigment Yellow 12, 13, 17, 20, 24, 74, 83, 86, 93, 95, 109, 110, 117, 120, 125, 129, 138, 139, 150, 151, 175, 180, 181, 185, 192, 194, and 199. Among others, benzimidazolon yellow pigments: C.I. Pigment Yellow 120, 151, 175, 180, 181, 192, and 194 are preferable, from the viewpoint of light emission reliability.

Examples of organic blue pigments include C.I. Pigment Blue 15, 15:1, 15:2, 15:3, 15:4, 15:6, 16, 17, 60, 64, 65, 75, 79, and 80. Among others, stable type copper phthalocyanines: C.I. Pigment Blue 15:3, 15:4, and 15:6, and indanthrone blue: C.I. Pigment Blue 60 are preferable, from the viewpoint of light emission reliability.

Examples of organic red pigments include C.I. Pigment Red 9, 48, 97, 122, 123, 144, 149, 166, 168, 177, 179, 180, 190, 192, 196, 202, 209, 215, 216, 217, 220, 223, 224, 226, 227, 228, 240, and 254. Among others, perylene red pigments: C.I. Pigment Red 123, 149, 179, and 190, or anthraquinone red pigments: C.I. Pigment Red 177 are preferable, taking into consideration light emission reliability.

The photosensitive composition according to the present invention can contain a dispersing agent. The dispersing agent means a dispersing agent that has both a pigment-philic group having a chemical bonding action or adsorbent action on the surface of pigment and a polymer chain or group having solvent-philicity. The mechanism of action of a dispersing agent involves not only acid-base interaction but also hydrogen bonding, van-der-Waals force, and the like in a compositive manner, and in the below-mentioned wet media dispersion treatment carried out in producing a pigment dispersion liquid, the mechanism produces an effect that enhances the wettability to the dispersion medium in the surface of the organic pigment and enhances a steric repulsion effect and/or electrostatic repulsion effect between organic pigments due to a polymer chain to thereby promote the miniaturization of the pigment and enhance dispersion stability. The promotion of miniaturization and the enhancement of dispersion stability make it possible to further enhance flexibility.

Examples of preferably usable dispersing agents include dispersing agents having a basic adsorption group, dispersing agents having an acidic group, and nonionic dispersing agents. Examples of dispersing agents having a basic adsorption group include: DisperBYK-142, 145, 164, 167, 182, 187, 2001, 2008, 2009, 2010, 2013, 2020, 2025, 9076, 9077, BYK-LP N6919, BYK-LP N21116, and BYK-JET9152 (which are all manufactured by BYK-Chemie GmbH); "Solsperse" (registered trademark) 9000, 11200, 13650, 20000, 24000, 24000SC, 24000GR, 32000, 32500, 32550, 326000, 33000, 34750, 35100, 35200, 37500, 39000, 56000, and 76500 (which are all manufactured by Lubrizol Corporation); and Efka-PX4310, 4320 and 4710 (which are all manufactured by BASF SE). Examples of dispersing agents having an acidic group include: "Tego dispers" (registered trademark) 655 (manufactured by Evonik Industries AG); and disperBYK-102, 118, 174, and 2096 (which are all manufactured by BYK-Chemie GmbH). Examples of nonionic dispersing agents include: "SOLSPERSE" (registered trademark) 54000 (manufactured by Lubrizol Corporation); and "Tego dispers" (registered trademark) 650, 652, and 740W (which are all manufactured by Evonik Industries AG). Taking into consideration the surface properties inherent to a pigment and the average primary particle size, these dispersing agents may be suitably used singly or in mixture of two or more kinds thereof so that the below-mentioned average dispersed particle size can be obtained.

The dispersing agent content is preferably 10 parts by weight or more, more preferably 20 parts by weight or more, with respect to the total pigment amount as 100 parts by weight, from the viewpoint of suppressing sufficient deagglomeration properties and reaggregation after dispersion treatment in the below-mentioned wet media dispersion treatment. In addition, the dispersing agent content is preferably 100 parts by weight or less, more preferably 60 parts by weight or less, with a view to sufficiently ensuring the amount of constituent components other than the dispersing agent.

The photosensitive composition according to the present invention can contain a solvent. Allowing the photosensitive composition to contain a solvent makes it possible to adjust viscosity, coatability, and storage stability, and selecting a suitable solvent makes it possible to enhance the film thickness uniformity of a finally obtained pixel division layer.

Examples of solvents include ethers, acetates, esters, ketones, aromatic hydrocarbons, and alcohols. The photosensitive composition may contain two or more of these. Examples of ethers include ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, dipropylene glycol dimethyl ether, dipropylene glycol methyl-n-butyl ether, tripropylene glycol monomethyl ether, tripropylene glycol monoethyl ether, diethylene glycol dimethyl ether, diethylene glycol methylethyl ether, diethylene glycol diethyl ether, and tetrahydrofuran. Examples of acetates include butyl acetate, ethylene glycol monomethyl ether acetate, ethylene glycol monoethyl ether acetate, propylene glycol monomethyl ether acetate (hereinafter referred to as "PGMEA"), 3-methoxybutyl acetate, ethylene glycol monobutyl ether acetate, diethylene glycol monomethyl ether acetate, diethylene glycol monoethyl ether acetate, diethylene glycol monobutyl ether acetate, cyclohexanol acetate, propylene glycol diacetate, dipropylene glycol methyl ether acetate, 3-methoxy-3-methyl-1-butyl acetate, 1,4-butanediol diacetate, 1,3-butylene glycol diacetate, and 1,6-hexanediol diacetate. Examples of esters include: alkyl lactate esters such as methyl 2-hydroxypropionate, ethyl 2-hydroxypropionate; ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate. Examples of ketones include methylethylketone, cyclohexanone, 2-heptanone, 3-heptanone, and the like. Examples of aromatic hydrocarbons include toluene, xylene, and the like. Examples of alcohols include isopropyl alcohol, butyl alcohol, isobutyl alcohol, pentanol, 4-methyl-2-pentanol, 3-methyl-2-butanol, 3-methyl-3-methoxybutanol, diacetone alcohol, and the like. Among others, the acetates content of all solvents contained in the photosensitive composition is preferably 50% by weight or more, more preferably 70% by weight or more, in that the content makes it possible to enhance the dispersion stability of a pigment and enhance flexibility.

The photosensitive composition according to the present invention can further contain an organic near infrared absorbing dye. In general, organic near infrared absorbing dyes have much lower light-shielding property per unit volume but excellently have lower permittivity, compared with (c) an inorganic pigment having near infrared light-shielding property, and accordingly, can be used in an amount permitting the solubility of a dye, and most advantageously used together with (c) an inorganic pigment having near infrared light-shielding property. Examples of organic near infrared absorbing dyes include cyanine dyes, phthalocyanine dyes, naphthalocyanine dyes, polymethine dyes, squarylium dyes, porphyrin dyes, diimmonium dyes, indigo dyes, quaterrylene dyes, perylene dyes, and nickel dithiolene complex dyes. Among others, phthalocyanine dyes, quaterrylene dyes, and perylene dyes are preferable in that they have excellent solubility in an organic solvent and excellent light emission reliability.

Examples of phthalocyanine dyes include phthalocyanine dyes having oxovanadium, copper, aluminum, cobalt, or zinc as the central metal. Among others, vanadyl phthalocyanine dyes having oxovanadium as the central metal and/or copper phthalocyanine dyes having copper as the central metal are more preferable, and (e) vanadyl phthalocyanine near infrared absorbing dyes are still more preferable in that the (e) dyes have excellent light emission reliability. In addition, at least all black pigments exemplified as (c) an inorganic pigment having near infrared light-shielding property generally have lower light-shielding property in longer wavelengths. Because of this, it is more preferable that a chloroform solution of the organic dye has the maximum absorption wavelength in the wavelength range from 900 to 1,000 nm in the near infrared range, and that the organic dye has a solubility of 2.0% by weight or more in a single one of the acetate solvents exemplified above, with a view to not affecting the dispersion stability of the pigment component. Examples of organic dyes satisfying both of these properties include: (e) a vanadyl phthalocyanine near infrared absorbing dye, FDN-07 and FDN-08, (which are both manufactured by Yamada Chemical Co., Ltd.): and a copper phthalocyanine near infrared absorbing dye, FDN-06, (manufactured by Yamada Chemical Co., Ltd.).

These near infrared absorbing dyes are preferably not used as dispersion dyes but substantially used as soluble dyes in that they can suppress the generation of concavo-convex defects on the surface of a pixel division layer. As used herein, a soluble dye means a dye to be used in the state of being dissolved completely in the photosensitive composition. The amount of an organic near infrared absorbing dye is preferably less than 2.0% by weight of the photosensitive composition according to the present invention, from the viewpoint of solubility in the solvent component and resin component.

In a case where a cured film obtained by curing the photosensitive composition according to the present invention is used for the pixel division layer of an organic EL display device, the higher the light-shielding property that the cured film has on near infrared light, the better, with a view to enhancing the sensitivity of a sensor for which near infrared light is used. Specifically, a cured film, 2.0 µm thick, obtained by curing the photosensitive composition according to the present invention preferably has the maximum light transmittance of 15.0% or less, more preferably 10.0% or less, still more preferably 5.0% or less, in wavelengths from 780 to 1,000 nm.

In addition, the higher the light-shielding property that the cured film has on visible light, the more preferable, with a view to decreasing outside light reflection and enhancing the visibility of the display portion of an organic EL display device. Specifically, a cured film, 2.0 µm thick, obtained by curing the photosensitive composition according to the present invention preferably has a light transmittance of 10.0% or less, more preferably 5.0% or less, still more preferably 1.0% or less, at a wavelength of 550 nm at which the relative luminous efficiency is the highest in the visible light range.

Transmittance mentioned here can be measured through a cured film using a spectrophotometer "U-4100 (manufactured by Hitachi High-Technologies Corporation)" with measurement made at wavelength intervals of 1.0 nm, wherein the cured film is formed on a translucent substrate to have a film thickness of 2.0 µm, and the light transmittance (%) of the cured film can be determined from the ratio of the transmitted light intensity of the translucent substrate to the transmitted light intensity of a laminated substrate obtained by forming the cured film on the translucent substrate. Examples of preferably usable translucent substrates include a translucent glass substrate "TEMPAX (manufactured by AGC Techno Glass Co., Ltd.)". In this regard, light transmittance means light transmittance in the thickness direction of a cured film, and during measurement, light is incident on the film side and transmitted out of the translucent substrate side.

On the other hand, the lower the permittivity of a cured film, the better, in that the unevenness of luminance can thus be suppressed to enhance display properties. A cured film, 2.0 µm thick, obtained by curing the photosensitive composition according to the present invention preferably has a permittivity of less than 5.0, more preferably less than 4.5, still more preferably less than 4.0, at a frequency of 1 kHz. On the other hand, it is theoretically difficult to make the permittivity excessively low unless many voids are provided inside the film on purpose, and accordingly, the permittivity is preferably 2.0 or more, from the viewpoint of flexibility.

As a permittivity mentioned here, permittivity K can be calculated, using the following equation, from the value of capacitance C measured on a laminated substrate using a permittivity measurement device "LCR meter 4294A (manufactured by Agilent Technologies, Inc.)", wherein the laminated substrate is obtained by forming a cured film having a film thickness of 2.0 µm on an aluminum substrate film followed by forming an aluminum thin film having a film thickness of 70 nm on the surface of the cured film by pattern vapor-deposition. In addition, the thickness of a cured film the light transmittance and permittivity of which are calculated can be measured using a stylus type of film thickness measurement device "Surfcom (manufactured by Tokyo Seimitsu Co., Ltd.)".

$$K = C \times d / (\varepsilon \times S)$$

wherein
C: capacitance (F),
d: film thickness (m),
$\varepsilon$: vacuum permittivity $8.854 \times 10^{-12}$ (F/m), and
S: electrode area (m$^2$).

A method of producing the photosensitive composition according to the present invention will be described. For example, a pigment dispersion liquid is prepared in the first step. A pigment dispersion liquid can be obtained by mixing a pigment component, a solvent, and, if necessary, another component such as a dispersing agent, followed by allowing the resulting mixture to undergo wet media dispersion treatment.

Examples of dispersers for wet media dispersion treatment include beads mills of a horizontal or vertical type and roll mills, for example, "DYNO-MILL" (registered trademark) (manufactured by Willy A. Bachofen AG), "Spike Mill" (registered trademark) (manufactured by Inoue Mfg., Inc.), and "Sand Grinder" (registered trademark) (manufactured by DuPont Co., Ltd.). Examples of media for dispersers include zirconia beads, zircon beads (ZrSiO4), alumina beads, and non-alkali glass beads, and to avoid contamination caused by chipping and grinding, it is preferable to use beads containing no components that will turn into metal or metal ion impurity sources. Specific examples of preferable commercially available products include "TORAYCERAM" (registered trademark) (manufactured by Toray Industries, Inc.). In addition, the diameter of a bead is preferably 0.03 to 5 mm. The higher the sphericity, the more preferable. The operation conditions for a disperser may be suitably set, taking into consideration bead hardness, handling properties, productivity, and the like, in such a manner that the average particle size of pigment obtained after dispersion and the viscosity of the pigment will be in a desired range.

The average dispersed particle size of (c) an inorganic pigment having near infrared light-shielding property is preferably 30 nm or more, more preferably 50 nm or more, with a view to suppressing reaggregation of the pigment. On the other hand, the average dispersed particle size is preferably 200 nm or less, more preferably 150 nm or less, with a view to avoiding a local increase in the permittivity of a pixel division layer and obtaining good display properties. The average dispersed particle size of an organic pigment is preferably 50 nm or more, more preferably 80 nm or more, with a view to suppressing reaggregation of the pigment. In addition, the average dispersed particle size is preferably 300 nm or less, more preferably 200 nm or less, with a view to enhancing pattern linearity.

As used herein, the average dispersed particle size of pigment means the number average value of all particle sizes of pigment contained in a pigment dispersion liquid obtained by the above-mentioned wet media dispersion treatment. The average dispersed particle size can be measured using a dynamic light scattering particle size distribution measurement device "SZ-100 (manufactured by HORIBA, Ltd.)" or a laser diffraction/scattering particle size distribution measurement device "MT-3000 (manufactured by Microtrac-BEL Corp.)".

In the second step, the photosensitive composition according to the present invention can be obtained by mixing and stirring the pigment dispersion liquid, a compound selected from the group consisting of the above-mentioned (a-1) to (a-3), (b) a photosensitizer, and, if necessary, another component.

Next, the cured film according to the present invention will be described. The cured film according to the present invention is a cured product of the photosensitive composition according to the present invention, and can be suitably used as the pixel division layer of an organic EL display device.

In a case where the cured film that is a cured product of the present invention is used as the pixel division layer of an organic EL display device, the opening rate of the pixel division layer in the display area is preferably 20% or less in that this opening rate makes it possible to impart high-definition to the display portion, enhance the display quality of images or videos, and enhance the value of the display device. As used herein, an opening rate means an area ratio of the openings of the pixel division layer to the area of the pixel division layer. A lower opening rate allows the formed area of the pixel division layer in the display portion to be larger, and accordingly, significantly affects the performance concerning the light emission reliability of the pixel division layer. That is, an organic EL display device having a lower opening rate and a higher-definition display portion contributes more to the effect of the present invention. For the same reasons, allowing the pixel division layer to have a larger film thickness results in contributing more to the effect of the present invention.

In a case where a cured film which is a cured product of the photosensitive composition according to the present invention is used as a pixel division layer additionally having a spacer function in the structure of the panel members, the cured film may have sites having different film thicknesses, that is, a step in the plane. Examples of methods of obtaining a pixel division layer having a step formed by different film thicknesses in the cured film include a method in which pattern exposure is carried out, in the below-mentioned exposure process, via a negative or positive half-tone mask in which a plurality of openings having different light transmittances in the exposure light range are formed. In a case where the photosensitive composition according to the present invention has negative photosensitivity, those sites of the exposed portions which have a locally high light transmittance in the exposure light range further decrease in solubility in an alkali developing solution and are formed as convex portions in the plane of a finally obtained pixel division layer. On the other hand, in a case where the photosensitive composition according to the present invention has positive photosensitivity, those sites of the exposed portions which have a locally low light transmittance in the exposure light range further decrease in solubility in an alkali developing solution and are formed as convex portions in the plane of a final obtained pixel division layer.

A cured film that is a cured product of the photosensitive composition according to the present invention can be obtained by, for example, a photolithography process including a coating step, a prebaking step, an exposure step, a development step, and a curing step in this order.

In the coating step, a coated film is obtained by coating a substrate with the photosensitive composition according to the present invention. In the case of a top emission type of organic EL display device, examples of substrates include one in which a patterned reflection layer that is made of a silver/copper alloy or the like and an identically patterned ITO electrode are laminated in order on the surface a glass substrate or flexible substrate. Examples of preferably usable flexible substrates include a laminated substrate in which a flexible substrate made of a polyimide resin is fixed on the surface of a plate-like glass substrate that is a tentative support. A plate-like glass substrate mentioned here is peeled off in the step to thereby make it possible that a finally obtained organic EL display device is flexible.

In the coating step, a coated film is obtained by applying the photosensitive composition according to the present invention. Examples of coating devices used in the coating step include slit coaters, spin coaters, gravure coaters, dip coaters, curtain flow coaters, roll coaters, spray coaters, screen printing machines, and ink jet printers. A pixel division layer is formed as a constituent member so as to usually have a film thickness of approximately 0.5 to 3.0 µm, preferably approximately 1.0 to 2.0 µm, and accordingly, slit coaters or spin coaters are preferable in that these are suitable for thin film coating, are less likely to generate coating defects, and have excellent film thickness uniformity and productivity. Slit coaters are more preferable, from the viewpoint of liquid saving and production efficiency.

In the prebaking step, a prebaked film is obtained by heating the coated film to volatilize a solvent therefrom.

Examples of heating devices include hot-air ovens, hot plates, far-infrared ovens (IR ovens), and the like. Pin gap prebaking or contact prebaking may be carried out. The prebaking temperature is preferably 50 to 150° C., and the prebaking time is preferably 30 seconds to several hours. To further enhance film thickness uniformity, the prebaking step may be carried out by heating after at least part of the solvent contained in the coated film is volatilized using a vacuum/vacuum dryer after the coating step.

In the exposure step, an exposed film is obtained by irradiating the film side of the prebaked film with chemical active rays via a photomask. Examples of exposure devices used in the exposure step include steppers, mirror projection mask aligners (MPA), parallel light mask aligners (PLA), and the like. Examples of chemical active rays that are applied during exposure include ultraviolet rays, visible light rays, electron rays, X rays, KrF (248 nm wavelength) laser, ArF (193 nm wavelength) laser, and the like. Among others, the j-rays (313 nm wavelength), i-rays (365 nm wavelength), h-rays (405 nm wavelength), or g-rays (436 nm wavelength) of a mercury lamp is preferable, and a ray mixture including them are more preferable. The exposure amount is usually approximately 10 to 4,000 mJ/cm$^2$ (in terms of i-rays). Examples of photomasks include a mask in which a thin film made of metal such as chromium or of a black organic resin and having exposure light masking properties is formed as a pattern on one side of the surface of a substrate, such as glass, quartz, or film, having translucency in exposure wavelengths. A negative or positive photomask can be used in forming a pixel division layer of the photosensitive composition according to the present invention, and pattern exposure is carried out to obtain an exposed film by allowing only the openings to transmit chemical active rays.

In the development step for the photosensitive composition according to the present invention that has negative photosensitivity, the unexposed portions are removed by development to obtain a patterned developed film. On the other hand, in a case where the photosensitive composition according to the present invention has positive photosensitivity, the exposed portions are removed by development to obtain a patterned developed film. Examples of development methods include a method in which the exposed film is dipped in an organic alkali aqueous solution or inorganic alkali aqueous solution as an alkali developing solution for 10 seconds to ten minutes using a method such as showering, dipping, paddling, and the like.

A patterned developed film can be obtained by utilizing the difference in solubility in an alkali developing solution between the exposed portions and the unexposed portions in the exposed film. Here, the exposed portions mean sites that are irradiated with exposure light via mask openings, and the unexposed portions mean sites that are not irradiated with exposure light.

In a case where the photosensitive composition according to the present invention has negative photosensitivity, the unexposed portions are pattern openings, and in a case where the photosensitive composition has positive photosensitivity, the exposed portions are pattern openings. The openings finally become the light emitting pixel portions of an organic EL display device.

Examples of alkali developing solutions include a 2.38% by weight tetramethylammonium hydroxide (hereinafter referred to as "TMAH") aqueous solution, a 0.4% by weight TMAH aqueous solution, and a 0.2% by weight TMAH aqueous solution, and the solution is usually used at atmospheric pressure at a constant solution temperature in the range from 15 to 35° C. After development, hydro-extraction treatment can be additionally carried out by rinsing with deionized water shower and/or by air spraying.

In the curing step, a cured film is obtained by heating the developed film to thermally cure it and at the same time volatilize water and components such as a residual developing solution. Examples of heating devices include hot-air ovens, IR ovens, and the like. The heating temperature is preferably 200 to 300° C. with a view to sufficiently thermally curing (a-1) an epoxy compound having a $C_9$-$C_{19}$ long-chain alkyl group and other thermosetting components to enhance flexibility and light emission reliability. For the photosensitive composition according to the present invention containing an organic pigment, the heating temperature is preferably 230 to 260° C. with a view to suppressing the generation of decomposition products to enhance light emission reliability. The heating atmosphere is preferably a nitrogen atmosphere, and the pressure during heating is preferably atmospheric pressure.

FIG. 1 shows an embodiment of an organic EL display device including the cured film according to the present invention obtained through the above-mentioned steps. The cured film according to the present invention can be suitably used as a pixel division layer (8) in FIG. 1. The cured film according to the present invention can also be suitably used as a planarization layer (4) that requires high flexibility and high light emission reliability as the pixel division layer (8) does. In this regard, the present invention encompasses an organic EL display device including the cured film according to the present invention.

A bottom-gate type or top-gate type of TFT (1) (thin film transistor) is provided in matrix form on the surface of a substrate (6), and a TFT insulating layer (3) is formed, covering the TFT (1) and a wiring line (2) connected to the TFT (1). Furthermore, a planarization layer (4) is formed on the surface of the TFT insulating layer (3), and a contact hole (7) open to the wiring line (2) is provided on the planarization layer (4). A second electrode (5) is patterned on the surface of the planarization layer (4) and connected to the wiring line (2). A pixel division layer (8) is formed to surround the peripheral border of the pattern of the second electrode (5). The pixel division layer (8) has openings, a light emitting pixel (9) containing an organic EL light emitting material is formed in the openings, and a first electrode (10) is formed as a film, covering the pixel division layer (8) and the light emitting pixel (9). The TFT substrate having the above-mentioned laminate structure is sealed in vacuum, and voltage is directly applied to the light emitting pixel portion, enabling the TFT substrate to emit light as an organic EL display device.

The light emitting pixel (9) may be a series of different kinds of pixels having the respective light emitting peak wavelengths in the respective ranges of red, blue, and green, which are the three primary colors of light, or may be a portion in which a color filter combination of red, blue, and green is laminated as a separate member on a light emitting pixel that emits white light, wherein the light emitting pixel is formed on the whole plane. The red range usually displayed has a peak wavelength of 560 to 700 nm, the blue range has a peak wavelength of 420 to 500 nm, and the green range has a peak wavelength of 500 to 550 nm, but for the organic EL display device according to the present invention, the kind of the light emitting pixel is not limited to a particular one, and emitted light may have any peak wavelength. As the second electrode (5), for example, a transparent film composed of ITO (indium tin oxide) can be suitably used, and as the first electrode (10), for example, an alloy film such as one made of silver and magnesium can be suitably used. The electrodes may be composed of any substance as long as they are the layers capable of functioning as electrodes. As an organic EL light emitting material of which a light emitting pixel is composed, a material obtained by further combining an electron hole transport layer and/or electron transport layer with a light emitting layer can be suitably used.

The light extraction direction may be that of a bottom emission type of organic EL display device in which light emitted from a light emitting pixel is extracted on the substrate side via the substrate (6), or may be that of a top emission type of organic EL display device in which light emitted is extracted on the opposite side of the substrate (6) via the first electrode, and is not limited to a particular type. Between the planarization layer (4) and the second electrode (5), for example, a metal reflection layer may further be provided to enhance light extraction efficiency in one direction. Using, as the substrate (6), a hard type of plate-like substrate typified by glass and the like affords a rigid type of organic EL display device. Using a flexible substrate affords a flexible organic EL display device. Examples of resin solutions for obtaining a flexible substrate composed of a polyimide resin having excellent mechanical strength include a solution containing polyamic acid. A flexible substrate can be obtained by coating the surface of a support with a solution containing polyamic acid and then heating the polyamic acid so that the polyamic acid can be imidized into a polyimide resin. Polyamic acid can be synthesized by allowing tetracarboxylic dianhydride and a diamine compound to react in an amide solvent such as N-methyl-2-pyrrolidone. Among others, a polyamic acid having a residue of aromatic tetracarboxylic dianhydride and a residue of an aromatic diamine compound is preferable in that the polyamic acid has a small coefficient of linear thermal expansion and excellent dimensional stability. Specific examples include a polyamic acid having a residue of 3,3',4,4'-biphenyltetracarboxylic dianhydride and a residue of p-phenylenediamine.

EXAMPLES

Below, the present invention will be described in detail with reference to Examples and Comparative Examples, but the aspects of the present invention are not to be limited to these.

First, evaluation methods in Examples and Comparative Examples will be described.

<Calculation Method of Necessary Minimum Exposure Amount>

A silver/copper alloy thin film (at a volume ratio of 10:1) having a thickness of 10 nm is formed on the whole surface of a 100 mm×100 mm non-alkali glass substrate by a sputtering method, the thin film is formed into a patterned metal reflection layer by etching, and then, an ITO transparent conductive film having a thickness of 10 nm is formed on the whole surface of the layer by a sputtering method to obtain a substrate for evaluating the necessary minimum exposure amount.

The surface of the obtained substrate for evaluating the necessary minimum exposure amount is coated with the photosensitive composition using a spin coater with the number of revolutions regulated so that a finally obtained cured film can have a thickness of 2.0 µm, a coated film is thus obtained, and the resulting coated film is prebaked using a hot plate (SCW-636, manufactured by Dainippon Screen Mfg. Co., Ltd.) at atmospheric pressure at 100° C. for 120 seconds to obtain a prebaked film. A both-surface alignment one-side surface exposure apparatus (Mask Aligner PEM-6M, manufactured by Union Optical Co., Ltd.) was used to perform patterning exposure to a ray mixture of the j-rays (313 nm), i-rays (365 nm wavelength), h-rays (405 nm wavelength), and g-rays (436 nm wavelength) of an ultrahigh pressure mercury lamp, via a gray scale mask for sensitivity measurement (MDRM MODEL 4000-5-FS, manufactured by Opto-Line International) having a line-and-space pattern with the opening width and the light-shielding layer width at a ratio of 1:1. Then, the exposed film was developed with a 2.38% by weight TMAH aqueous solution using a small-size development apparatus for photolithography (AD-2000, manufactured by Takizawa Sangyo K.K.) for 60 seconds, and rinsed with deionized water for 30 seconds, to obtain a developed film. Next, using an FPD inspection microscope (MX-61L, manufactured by Olympus Corporation), the resolution pattern of the developed film was observed at a magnification ratio of 50×. An exposure amount (mJ/cm$^2$: a value on an i-rays illumination meter) at which the developed film is formed to have the pattern line width (20.0 µm) and the pitch width (20.0 µm) at 1:1 in the line-and-space pattern, in other words, to have a pattern having the same dimensions as the photomask is regarded as the necessary minimum exposure amount (sensitivity to exposure) of the photosensitive composition. In this regard, the developed films that required the necessary minimum exposure amount of more than 150 mJ (mJ/cm$^2$) and those which failed to become patterned developed films because the developed film peeled off or for other reasons were excluded from the films to be evaluated.

(1) Evaluation of Cured Film (i) Evaluation of Light-Shielding Property in Near Infrared Range and (ii) Evaluation of Light-Shielding Property in Visible Light Range Substrates for evaluating optical properties were obtained in Examples 1 to 29 and Comparative Examples 1 to 20, wherein the substrates each included a TEMPAX with a cured film on the surface thereof. Using a spectrophotometer "U-4100 (manufactured by Hitachi High-Technologies Corporation)", the substrates were measured for light transmittance in wavelengths from 380 nm to 1,000 nm at measurement wavelength intervals of 1.0 nm. The light transmittance determined from a ratio of the transmitted light intensity of the translucent substrate to the transmitted light intensity of the substrate for evaluating optical properties was rounded to one decimal place to afford a value rounded to one decimal place, and the value was regarded as the light transmittance of the cured film. A cured film having a lower maximum light transmittance in wavelengths from 780 to 1,000 nm was rated as having better light-shielding property in the near infrared range, and a cured film having a lower light transmittance at a wavelength of 550 nm was rated as having better light-shielding property in the visible light range. In this regard, the thickness of the cured film was measured at three points in the plane using a stylus type of film thickness measurement device (Surfcom from Tokyo Seimitsu Co., Ltd.), and the average value was rounded to one decimal place to afford a value rounded to one decimal place.

(iii) Evaluation of Permittivity

Substrates for evaluating permittivity were obtained in Examples 1 to 29 and Comparative Examples 1 to 20, wherein the substrates included an aluminum substrate, a cured film, and an aluminum thin film in this order. The substrates were measured for permittivity at a frequency of 1 kHz using a permittivity measurement device "LCR Meter 4294A (manufactured by Agilent Technologies, Inc.)". In this regard, the thickness of the cured film was measured at four points in the plane using the stylus type of film thickness measurement device (Surfcom from Tokyo Seimitsu Co., Ltd.), and the average value was rounded to one decimal place to afford a value rounded to one decimal place.

(iv) Evaluation of Pattern Linearity

Substrates with a patterned cured film formed thereon were obtained in Examples 1 to 29 and Comparative Examples 1 to 20. Ten openings positioned in the center portion of the substrate were observed at a magnification ratio of 50× using an optical microscope. The maximum width W (μm) of the waviness in the pattern edge of the cured film was calculated by the following method. The patterned cured film was measured to obtain the minimum line width a and maximum line width b in the cross direction and the minimum line width c and maximum line width d in the longitudinal direction. $W^1$ (μm) and $W^2$ (μm) were calculated by the following equation, and the larger value of $W^1$ (μm) and $W^2$ (μm) were regarded as the maximum width W (μm) of the waviness. In this regard, the line widths a to d were measured at a measurement angle parallel to the edge of the substrate with a patterned cured film formed thereon.

$$(b-a)/2=W^1$$

$$(d-c)/2=W^2$$

FIG. 2 shows a schematic view depicting the waviness of the pattern edge of a cured film. The portion shown by a white color represents the opening (11), and the portion shown by a black color represents the patterned cured film (12). In FIG. 2, the arrows a and b are straight lines parallel to a cross-directional edge of the substrate having a patterned cured film formed thereon, and the arrows c and d are straight lines parallel to a longitudinal edge of the substrate having a patterned cured film formed thereon. In this regard, the cross-directional or longitudinal edge of the substrate having a patterned cured film formed thereon, the edge being used as a criterion here, corresponds to the cross-directional or longitudinal edge of the non-alkali glass substrate (15) in FIG. 3 showing the below-mentioned method of producing an organic EL display device including a pixel division layer.

The smaller the maximum width W, the higher the pattern linearity, and thus, the visibility of the organic EL display device is excellent. Using the maximum width W, the pattern linearity is evaluated on the basis of the following acceptance criterion. A to C mean acceptable results, and D to E mean unacceptable results. However, not only the pattern shape of the pattern edge itself but also the waviness due to the development residue was incorporated in the calculation of the maximum width W that was measured.

A: maximum width of less than 1.0 μm
B: maximum width of 1.0 μm or more and less than 1.5 μm
C: maximum width of 1.5 μm or more and less than 2.0 μm
D: maximum width of 2.0 μm or more and less than 3.0 μm
E: maximum width of 3.0 μm or more (v) Evaluation of Flexibility Substrates for evaluating flexibility were obtained by forming a cured film on the surface of a flexible substrate in Examples 1 to 29 and Comparative Examples 1 to 20, and evaluated for flexibility by the following method.

Iron wires, only the respective diameters of which are stepwise different, (a total of six steps: 0.10 mm, 0.30 mm, 0.50 mm, 0.80 mm, 1.00 mm, and 2.00 mm) were prepared. As shown by the test piece setup in FIG. 3, a substrate for evaluating flexibility was curved around the surface of the wire to have a given radius of curvature in such a manner that the flexible substrate (13) is inward, and the cured film (14) is outward. Then, the substrate for evaluating flexibility was flattened back, the surface of the cured film (14) was observed using an FPD test microscope at a magnification ratio of 20×, and the substrate was checked for cracks and chips. Furthermore, a separate substrate for evaluating flexibility was singly and completely bent (with a diameter of 0.00 mm) without being curved around the above-mentioned wire, and the substrate was flattened back, and observed in the same manner. The above-mentioned operation was repeated a total of five times at which the different places of the cured film were curved or bent, the minimum groove depth in which no cracks nor chips were observed was divided by 2, and the resulting value was regarded as the minimum radius of curvature (mm) for possible curvature. Among seven steps of the minimum radius of curvature: 0.00 mm, 0.05 mm, 0.15 mm, 0.25 mm, 0.40 mm, 0.50 mm, and 1.00 mm, the smaller the value is, the better the evaluation of flexibility is regarded as. The cured films of 0.40 mm or less were rated as acceptable, and the cured films of 0.50 mm and 1.00 mm were unacceptable. In addition, the minimum radius of curvature of more than 1.00 mm was rated as "out of measurement range", and regarded as unacceptable. In this regard, a separate flexible substrate having a thickness of 7 μm was singly evaluated for flexibility, the result was 0.00 mm, and thus, the substrate was separately found to have excellent flexibility and be bendable. In this regard, the cured film was found to have no chips in Examples 1 to 29 and Comparative Examples 1 to 20, and evaluated for cracks only.

(2) Evaluation of Unevenness of Luminance of Organic EL Display Device

The organic EL display devices obtained in Examples 1 to 29 and Comparative Examples 1 to 20 were allowed to repeatedly emit light ten times at intervals of 30 seconds through on-off switchover operation by 10 mA/cm² direct current driving. Ten light emitting pixel points positioned in the center of a pixel portion formed in a 16 mm long×16 mm wide area were displayed in an enlarged manner on a monitor at a magnification ratio of 50× and observed. The degree of unevenness of luminance during lighting was evaluated on the basis of the following acceptance criterion, A to C mean acceptable results, and D to E mean unacceptable results.

A: no unevenness of luminance observed
B: slight unevenness of luminance observed
C: some unevenness of luminance observed
D: outstanding unevenness of luminance observed
E: one or more unlighted pixel portions, and evaluation impossible (3) Evaluation of Light Emission Reliability of Flexible Organic EL Display Device The flexible organic EL display devices obtained in Examples 1 to 29 and Comparative Examples 1 to 20 were each placed on the hot plate heated to 80° C. with the display portion (light emitting surface) upward, and allowed to emit light by 10 mA/cm² direct current driving. After one hour, the area percentage of light emitting part (area ratio of the light emitting portion to the light emitting pixel area) was evaluated, and the power was once turned off to turn off the device. Then, the display portion was continuously irradiated with light having an illuminance of 3.0 W/cm² at a wavelength of 420 nm as pseudo-sunlight, wherein the source of the light was a xenon lamp. The flexible organic EL display devices were each allowed again to emit light 50 hours, 100 hours, and 500 hours after the irradiation started, ten light emitting pixel points positioned in the center were measured for area percentage of light emitting part, and the average value was calculated. On the basis of the area percentage of light emitting part obtained after one hour, the device that was capable of retaining a higher area percentage of light emitting part was regarded as having better light emission reliability. In the evaluation based on the following acceptance criterion, A to C mean acceptable results, and D to F mean unacceptable results.

A: 95% or more
B: 90% or more and less than 95%
C: 85% or more and less than 90%
D: 60% or more and less than 85%
E: less than 60%
F: one or more light emitting pixel points found unlighted immediately after driving started Synthesis Example: Synthesis of Polyimide Resin Solution A Under a dry nitrogen gas stream, 150.15 g of 2,2-bis(3-amino-4-hydroxyphenyl)hexafluoropropane (0.41 mol), 6.20 g of 1,3-bis(3-aminopropyl)tetramethyldisiloxane (0.02 mol), and 13.65 g of 3-aminophenol (0.13 mol) as an end-capping agent were dissolved in 500.00 g of N-methyl-2-pyrrolidone (hereinafter referred to as "NMP") as a solvent, and to the resulting mixture, 155.10 g of bis(3,4-dicarboxyphenyl)etherdianhydride (0.50 mol) and 150.00 g of NMP were added. The resulting mixture was stirred at 20° C. for one hour and further stirred at 180° C. for four hours with water being removed. After termination of the reaction, the reaction solution was poured into 10 L of water, and the generated precipitate was collected by filtration, washed with water five times, and dried using a vacuum dryer at 80° C. for 20 hours to synthesize an alkali soluble polyimide resin having a structural unit represented by the above-mentioned general formula (24) and having a weight-average molecular weight (Mw) of 25,000 and an acid value of 160 (mgKOH/g). The alkali soluble polyimide resin was dissolved in PGMEA to obtain a polyimide resin solution A having a solid content of 30% by weight.

Synthesis Example: Synthesis of Polyimide Resin Solution B

Under a dry nitrogen gas stream, 180.00 g of PGMEA, 107.14 g of polyimide resin solution A, and 12.86 g of the compound represented by the above-mentioned structural formula (12) were allowed to react under the 130° C. heating condition for 30 minutes to obtain a PGMEA solution containing a polyimide resin that has a structure wherein $R^1$ in the above-mentioned general formula (1) is a $C_{17}$ branched alkyl group derived from the compound represented by the structural formula (12), and $R^2$ is $COOCH_2$, and that has a structural unit represented by the above-mentioned structural formula (25). The resulting PGMEA solution was further diluted with PGMEA so as to have a solid content of 15% by weight, whereby a polyimide resin solution B was obtained.

Synthesis Example: Synthesis of Polyamic Acid Solution A

A thermometer and a stirring rod with impeller were set in a four-neck flask having a volume of 300 mL. Under a dry nitrogen gas stream, 90.00 g of N-methyl-2-pyrrolidone (hereinafter referred to as "NMP") as an amide solvent was added into the flask, and the solvent started to be heated. The solution temperature was retained at 40° C. Into the NMP, 10.81 g (100 mmol) of p-phenylenediamine as a diamine compound was added and dissolved by stirring. Then, 26.48 g (90 mmol) of 3,3',4,4'-biphenyltetracarboxylic dianhydride as an acid dianhydride was added and dissolved by stirring. After the resulting mixture continued to be stirred for four hours, 3.27 g (15 mmol) of di-tert-butyl dicarbonate as an end-capping agent was added, the resulting mixture was stirred for one hour, 2.94 g (10 mmol) of 3,3',4,4'-biphenyltetracarboxylic dianhydride and 10.00 g of NMP were added, the resulting mixture continued to be stirred for further two hours, the heating was terminated, and the mixture was left to cool. After the solution temperature was found to be 20° C., the solution was further diluted with NMP so as to have a solid content of 40.0% by weight, whereby a polyamic acid solution A was obtained.

Synthesis Example: Synthesis of Cardo Resin Solution A

Under a dry nitrogen gas stream, 214.09 g of PGMEA, 73.05 g of "ADEKA ARKLS" (registered trademark) WR-301 (manufactured by ADEKA Corporation; a resin solution containing an alkali soluble cardo resin and PGMEA at the ratios of 44% by weight and 56% by weight respectively wherein the alkali soluble cardo resin was obtained by allowing a carboxylic anhydride to react with a resin obtained by ring-opening addition reaction between an aromatic compound having an epoxy group and an unsaturated carboxylic acid; having a weight-average molecular weight (Mw) of 5,700 and an acid value of 98 (mgKOH/g)), and 12.86 g of the compound represented by the above-mentioned structural formula (12) were allowed to react under the 130° C. heating condition for 30 minutes to obtain a PGMEA solution containing a cardo resin wherein $R^3$ in the above-mentioned general formula (2) is a $C_{17}$ branched alkyl group derived from the compound represented by the structural formula (12), and $R^4$ is $COOCH_2$, and wherein the cardo resin has a structural unit represented by the above-mentioned structural formula (29). The resulting PGMEA solution was diluted with PGMEA so as to have a solid content of 15% by weight, whereby a cardo resin solution A was obtained.

Synthesis Example: Synthesis of Quinonediazide Compound a

Under a dry nitrogen gas stream, 21.23 g (0.05 mol) of TrisP-PA (manufactured by Honshu Chemical Industry Co., Ltd.) as a compound having a phenolic hydroxyl group and 33.58 g (0.125 mol) of 5-naphthoquinone diazide sulfonyl acid chloride were dissolved in 450.00 g of 1,4-dioxane and maintained at room temperature. To this resulting mixture, 12.65 g (0.125 mol) of triethylamine mixed with 50.00 g of 1,4-dioxane was added dropwise with the inside of the system maintained at 25 to 35° C. After the dropwise addition, the resulting mixture was stirred at 30° C. for two hours. Then, the triethylamine salt was filtered, the filtrate was poured into water, and the deposited precipitate was collected by filtration. This precipitate was dried using a vacuum dryer to obtain a quinonediazide compound represented by the structural formula (40) as a photosensitizer.

[Chem. 26]

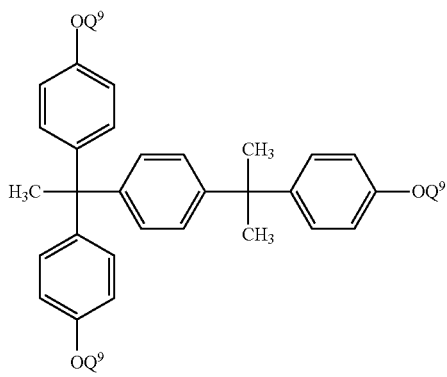

$Q^9 = $ 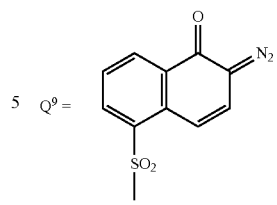

(40)

Preparation Example 1: Preparation of Pigment Dispersion Liquid 1

A mixture of 57.69 g of "Solsperse" (registered trademark) 20000 (a polyether polymer resin dispersing agent having a tertiary amino group at a molecular end) and 750.00 g of PGMEA as a solvent was stirred for ten minutes, 192.31 g of titanium nitride (having an average primary particle size of 25 nm; "TiN" in Tables) was added, and the resulting mixture was stirred for 30 minutes and subjected to wet media dispersion treatment and filtration (through a PP filter having a pore size of 0.8 μm) using a horizontal type beads mill to prepare a pigment dispersion liquid 1. The blended amounts (g) of the raw materials are shown in Table 1. In this regard, the average dispersed particle size of the titanium nitride contained in the pigment dispersion liquid 1 was 85 nm.

TABLE 1

| | | Pigment | | | |
|---|---|---|---|---|---|
| | | (c)Inorganic pigment having near infrared shielding property | | Organic pigment | |
| | Pigment dispersion liquid type | Type | weight (g) | Type | weight (g) |
| Preparation Example 1 | Pigment dispersion liquid 1 | Titanium nitride (TiN) | 192.31 | — | — |
| Preparation Example 2 | Pigment dispersion liquid 2 | Titanium oxynitride (TiON) | 192.31 | — | — |
| Preparation Example 3 | Pigment dispersion liquid 3 | Carbon black (TPK-1227) | 153.85 | — | — |
| Preparation Example 4 | Pigment dispersion liquid 4 | — | — | Benzodifuranon type organic black pigment expressed by chemical structure (32) | 120.00 |
| Preparation Example 5 | Pigment dispersion liquid 5 | — | — | C.I. pigment blue 60 | 120.00 |
| Preparation Example 6 | Pigment dispersion liquid 6 | — | — | C.I. pigment red 190 | 120.00 |
| Preparation Example 7 | Pigment dispersion liquid 7 | — | — | C.I. pigment yellow 192 | 120.00 |
| Preparation Example 8 | Pigment dispersion liquid 8 | Titanium nitride (TiN) | 192.31 | — | — |
| Preparation Example 9 | Pigment dispersion liquid 9 | — | — | C.I. pigment blue 60 | 120.00 |
| Preparation Example 10 | Pigment dispersion liquid 10 | — | — | C.I. pigment red 190 | 120.00 |
| Preparation Example 11 | Pigment dispersion liquid 11 | — | — | C.I. pigment yellow 192 | 120.00 |

| | Dispersant (Solsperse 20000) weight (g) | Dispersant (Tegodispers 655) weight (g) | Solvent (PGMEA) weight (g) | Solid content of pigment dispersion (wt %) | Average dispersed particle size (nm) |
|---|---|---|---|---|---|
| Preparation Example 1 | 57.69 | — | 750.00 | 25.0 | 85 |
| Preparation Example 2 | 57.69 | — | 750.00 | 25.0 | 95 |
| Preparation Example 3 | 46.15 | — | 800.00 | 20.0 | 120 |
| Preparation Example 4 | 30.00 | — | 850.00 | 15.0 | 140 |

TABLE 1-continued

|  |  |  |  |  |  |
|---|---|---|---|---|---|
| Preparation Example 5 | 30.00 | — | 850.00 | 15.0 | 162 |
| Preparation Example 6 | 30.00 | — | 850.00 | 15.0 | 110 |
| Preparation Example 7 | 30.00 | — | 850.00 | 15.0 | 90 |
| Preparation Example 8 | — | 57.69 | 750.00 | 25.0 | 137 |
| Preparation Example 9 | — | 30.00 | 850.00 | 15.0 | 170 |
| Preparation Example 10 | — | 30.00 | 850.00 | 15.0 | 134 |
| Preparation Example 11 | — | 30.00 | 850.00 | 15.0 | 105 |

Preparation Example 2: Preparation of Pigment Dispersion Liquid 2

A pigment dispersion liquid 2 was prepared in the same manner as in Preparation Example 1 except that titanium oxynitride (having an average primary particle size of 35 nm; "TiON" in Tables) was used in place of titanium nitride. The blended amounts (g) of the raw materials are shown in Table 1. In this regard, the average dispersed particle size of the titanium oxynitride contained in the pigment dispersion liquid 2 was 95 nm.

Preparation Example 3: Preparation of Pigment Dispersion Liquid 3

A pigment dispersion liquid 3 was prepared using a horizontal type beads mill in the same manner as in Preparation Example 1 except that a mixture of 46.15 g of Solsperse 20000 and 800.00 g of PGMEA was stirred for ten minutes, 153.85 g of carbon black (high-resistance carbon black surface-modified with a phenylsulfonic group; "TPK-1227" manufactured by Cabot Corporation; having an average primary particle size of 40 nm) was added, and the resulting mixture was stirred for 30 minutes. The blended amounts (g) of the raw materials are shown in Table 1. In this regard, the average dispersed particle size of the carbon black contained in the pigment dispersion liquid 3 was 120 nm.

Preparation Example 4: Preparation of Pigment Dispersion Liquid 4

A mixture of 30.00 g of "Solsperse" (registered trademark) 20000 and 850.00 g of PGMEA was stirred for ten minutes, 120.00 g of a benzodifuranone pigment ("Irgaphor" (registered trademark) Black S0100, manufactured by BASF SE; having an average primary particle size of 50 nm; "S0100" in Tables) represented by the above-mentioned structural formula (32) as an organic black pigment was added, and the resulting mixture was stirred for 30 minutes. Then, a pigment dispersion liquid 4 was prepared using a horizontal type beads mill in the same manner as in Preparation Example 1. The blended amounts (g) of the raw materials are shown in Table 1. In this regard, the average dispersed particle size of the benzodifuranone pigment contained in the pigment dispersion liquid 4 was 120 nm.

Preparation Examples 5 to 7: Preparation of Pigment Dispersion Liquids 5 to 7

The pigment dispersion liquids 5 to 7 were prepared in the same manner as in Preparation Example 1 except that C.I. Pigment Blue 60 (having an average primary particle size of 60 nm) as an organic blue pigment, C.I. Pigment Red 190 (having an average primary particle size of 55 nm) as an organic red pigment, and C.I. Pigment Yellow 192 (having an average primary particle size of 40 nm) as an organic yellow pigment were used respectively in place of the benzodifuranone pigment represented by the above-mentioned structural formula (32). The blended amounts (g) of the respective raw materials are shown in Table 1. In this regard, the average dispersed particle size of C.I. Pigment Blue 60 contained in the pigment dispersion liquid 5 was 162 nm, the average dispersed particle size of C.I. Pigment Red 190 contained in the pigment dispersion liquid 6 was 110 nm, and the average dispersed particle size of C.I. Pigment Yellow 192 contained in the pigment dispersion liquid 7 was 90 nm.

Preparation Example 8: Preparation of Pigment Dispersion Liquid 8

A pigment dispersion liquid 8 was prepared in the same manner as in Preparation Example 1 except that "Tego dispers" (registered trademark) 655 (an ethylene oxide/styrene oxide polymer dispersing agent having, at a molecular end, a phosphate group as an acidic adsorption group) was used as a dispersing agent in place of "Solsperse" (registered trademark) 20000. The blended amounts (g) of the raw materials are shown in Table 1. In this regard, the average dispersed particle size of the titanium nitride contained in the pigment dispersion liquid 8 was 137 nm.

Preparation Examples 9 to 11: Preparation of Pigment Dispersion Liquids 9 to 11

The pigment dispersion liquids 9 to 11 were prepared in the same manner as in Preparation Examples 5 to 7 respectively except that "Tego dispers" (registered trademark) 655 was used as a dispersing agent in place of "Solsperse" (registered trademark) 20000. The blended amounts (g) of the respective raw materials are shown in Table 1. In this regard, the average dispersed particle size of C.I. Pigment Blue 60 contained in the pigment dispersion liquid 9 was 170 nm, the average dispersed particle size of C.I. Pigment Red 190 contained in the pigment dispersion liquid 10 was 134 nm, and the average dispersed particle size of C.I. Pigment Yellow 192 contained in the pigment dispersion liquid 7 was 105 nm.

Preparation Example 12: Preparation of Pigment Dispersion Liquid 12

A mixture of 400.00 g of the pigment dispersion liquid 5 containing an organic blue pigment, 300.00 g of the pigment dispersion liquid 6 containing an organic red pigment, and 300.00 g of the pigment dispersion liquid 7 containing an organic yellow pigment was stirred for ten minutes to prepare a pigment dispersion liquid 12 that is a pseudo-black dispersion liquid. The blended amounts (g) of the raw materials are shown in Table 1.

Preparation Example 13: Preparation of Pigment Dispersion Liquid 13

A mixture of 400.00 g of the pigment dispersion liquid 9 containing an organic blue pigment, 300.00 g of the pigment dispersion liquid 10 containing an organic red pigment, and 300.00 g of the pigment dispersion liquid 11 containing an organic yellow pigment was stirred for ten minutes to prepare a pigment dispersion liquid 13 as a pseudo-black dispersion liquid. The blended amounts (g) of the raw materials are shown in Table 2.

TABLE 2

| | Pseudo black pigment dispersion liquid type | Mixing ratio of each pigment dispersion liquid | | Solid content of Pigment dispersion |
|---|---|---|---|---|
| | | Type | weight (g) | |
| Preparation Example 12 | Pigment dispersion liquid 12 | Pigment dispersion liquid 5 (including C.I. pigment blue 60) | 400.00 | 15.0 |
| | | Pigment dispersion liquid 6 (including C.I. pigment red 190) | 300.00 | |
| | | Pigment dispersion liquid 7 (including C.I. pigment yellow 192) | 300.00 | |
| Preparation Example 13 | Pigment dispersion liquid 13 | Pigment dispersion liquid 9 (including C.I. pigment blue 60) | 400.00 | 15.0 |
| | | Pigment dispersion liquid 10 (including C.I. pigment red 190) | 300.00 | |
| | | Pigment dispersion liquid 11 (including C.I. pigment yellow 192) | 300.00 | |

Preparation Examples 14 and 15: Preparation of Pigment Dispersion Liquids 14 and 15

The pigment dispersion liquids 14 and 15 were prepared in the same manner as in Preparation Example 1 except that zirconium nitride (having an average primary particle size of 55 nm; "ZrN" in Tables) and amorphous carbon black (having an average primary particle size of 86 nm; "a-CB" in Tables) were respectively used in place of titanium nitride. The blended amounts (g) and average dispersed particle sizes (nm) of the respective raw materials are shown in Table 3. As amorphous carbon black, that which had an $SP^3$ structure at 45 atom % with respect to the total of the $SP^3$ structure and $SP^2$ structure was used. In addition, as zirconium nitride, that which is represented by ZrN was used. In this regard, the average dispersed particle size of the titanium nitride contained in the pigment dispersion liquid 8 was 137 nm, and the average dispersed particle size of the amorphous carbon black contained in the pigment dispersion liquid 15 was 165 nm.

TABLE 3

| | Pigment dispersion liquid type | Pigment | | | | Dispersant (Solsperse 20000) weight (g) | Solvent (PGMEA) weight (g) | Total solid content of Pigment dispersion liquid (wt %) | Average dispersed particle size (nm) |
|---|---|---|---|---|---|---|---|---|---|
| | | (c) Inorganic pigment having near infrared shielding property | | Organic pigment | | | | | |
| | | Type | weight (g) | Type | weight (g) | | | | |
| Preparation Example 14 | Pigment dispersion liquid 14 | Zirconium nitride (ZrN) | 192.31 | — | — | 57.69 | 750.00 | 25.0 | 98 |
| Preparation Example 15 | Pigment dispersion liquid 15 | Amorphous carbon black (a-CB) | 192.31 | — | — | 57.69 | 750.00 | 25.0 | 165 |
| Preparation Example 16 | Pigment dispersion liquid 16 | Titanium nitride (TiN) | 192.31 | — | — | 57.69 | 750.00 | 25.0 | 312 |
| Preparation Example 17 | Pigment dispersion liquid 17 | — | — | Benzodifuranon type organic black pigment expressed by chemical structure (32) | 120.00 | 30.00 | 850.00 | 15.0 | 356 |

Preparation Example 16: Preparation of Pigment Dispersion Liquid 16

A pigment dispersion liquid 16 was prepared in the same manner as in Preparation Example 1 except that wet dispersion treatment was carried out in such a manner that the average dispersed particle size of the titanium nitride was 312 nm. The blended amounts (g) of the raw materials are shown in Table 3.

Preparation Example 17: Preparation of Pigment Dispersion Liquid 17

A pigment dispersion liquid 17 was prepared in the same manner as in Preparation Example 4 except that wet dispersion treatment was carried out in such a manner that the average dispersed particle size of the benzodifuranone pigment was 356 nm. The blended amounts (g) of the raw materials are shown in Table 3.

Example 1

A mixture of 2.18 g of the pigment dispersion liquid 1, 2.97 g of the pigment dispersion liquid 12, 0.45 g of the compound represented by the structural formula (3), 2.50 g of the polyimide resin solution A, 0.69 g of ε-caprolactone-added acrylate of dipentaerythritol (KAYARAD DPCA-60, manufactured by Nippon Kayaku Co., Ltd.; "DPCA-60" in Tables) as the compound represented by the below-mentioned structural formula (41) and having two or more radical polymerizable groups, 0.12 g of "ADEKA ARKLS" (registered trademark) NCI-831 (manufactured by ADEKA Corporation) as a photopolymerization initiator, and 11.09 g of PGMEA was brought into a hermetically enclosed condition and stirred on a shaker for 30 minutes to prepare a photosensitive composition 1 having negative photosensitivity and having a solid content of 15% by weight. The blended amounts (g) of the raw materials are shown in Table 4.

[Chem. 27]

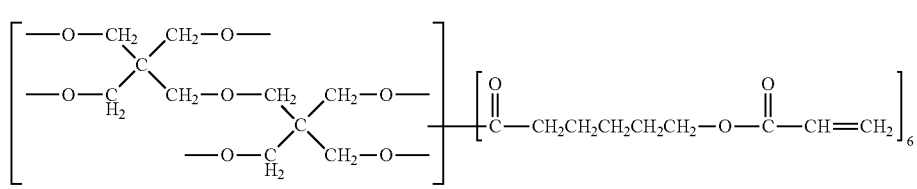

(41)

TABLE 4

| | Type of Composition having negative-type photosensitivity | Pigment dispersion liquid Type | weight (g) | (a-1) component Epoxy compound having long chain alkyl group of carbon numbers 9 to 19 Structure formula | weight (g) |
|---|---|---|---|---|---|
| Example 1 | Photosensitive composition 1 | Pigment dispersion liquid 1<br>Pigment dispersion liquid 12 | 2.18<br>2.97 | Compound expressed by chemical structure (3) | 0.45 |
| Example 2 | Photosensitive composition 2 | Pigment dispersion liquid 1<br>Pigment dispersion liquid 12 | 2.18<br>2.97 | Compound expressed by chemical structure (5) | 0.45 |
| Example 3 | Photosensitive composition 3 | Pigment dispersion liquid 1<br>Pigment dispersion liquid 12 | 2.18<br>2.97 | Compound expressed by chemical structure (7) | 0.45 |
| Example 4 | Photosensitive composition 4 | Pigment dispersion liquid 1<br>Pigment dispersion liquid 12 | 2.18<br>2.97 | Compound expressed by chemical structure (9) | 0.45 |
| Example 5 | Photosensitive composition 5 | Pigment dispersion liquid 1<br>Pigment dispersion liquid 12 | 2.18<br>2.97 | Compound expressed by chemical structure (11) | 0.45 |
| Example 6 | Photosensitive composition 6 | Pigment dispersion liquid 1<br>Pigment dispersion liquid 12 | 2.18<br>2.97 | Compound expressed by chemical structure (13) | 0.45 |
| Example 7 | Photosensitive composition 7 | Pigment dispersion liquid 1<br>Pigment dispersion liquid 12 | 2.18<br>2.97 | Compound expressed by chemical structure (15) | 0.45 |
| Example 8 | Photosensitive composition 8 | Pigment dispersion liquid 1<br>Pigment dispersion liquid 12 | 2.18<br>2.97 | Compound expressed by chemical structure (17) | 0.45 |

| | Polyimide resin solution A (PGMEA solution of solid content 30 wt %) weight (g) | Compound having two or more radical polymerizable groups (DPCA-60) weight (g) | Photo-polymerization initiator (NCI-831) weight (g) | Solvent (PGMEA) weight (g) | Solid content of Photosensitive composition (wt %) |
|---|---|---|---|---|---|
| Example 1 | 2.50 | 0.69 | 0.12 | 11.09 | 15.0 |
| Example 2 | 2.50 | 0.69 | 0.12 | 11.09 | 15.0 |
| Example 3 | 2.50 | 0.69 | 0.12 | 11.09 | 15.0 |
| Example 4 | 2.50 | 0.69 | 0.12 | 11.09 | 15.0 |
| Example 5 | 2.50 | 0.69 | 0.12 | 11.09 | 15.0 |
| Example 6 | 2.50 | 0.69 | 0.12 | 11.09 | 15.0 |
| Example 7 | 2.50 | 0.69 | 0.12 | 11.09 | 15.0 |
| Example 8 | 2.50 | 0.69 | 0.12 | 11.09 | 15.0 |

The surface of TEMPAX (a translucent glass substrate of 50 mm×50 mm size) was coated with the photosensitive composition 1 using the spin coater with the number of revolutions regulated so that a finally obtained cured film could have a thickness of 2.0 am, a coated film was thus obtained, and the resulting coated film was prebaked using the hot plate (SCW-636, manufactured by Dainippon Screen Mfg. Co., Ltd.) at atmospheric pressure at 100° C. for 120 seconds to obtain a prebaked film. An exposed film was obtained using the both-surface alignment one-side surface exposure apparatus (Mask Aligner PEM-6M; manufactured by Union Optical Co., Ltd.) to irradiate the whole surface of the prebaked film with exposure light in the necessary minimum exposure amount obtained in the above-mentioned method, wherein the exposure light was a ray mixture of the j-rays (313 nm), i-rays (wavelength 365 nm), h-rays (wavelength 405 nm), and g-rays (wavelength 436 nm) of an ultrahigh pressure mercury lamp. Then, the small size development device for photolithography (AD-2000, manufactured by Takizawa Sangyo K.K.) was used to develop the exposed film with a 2.38% by weight TMAH aqueous solution at a solution temperature of 23° C. for 60 seconds, the resulting film was rinsed with deionized water at a solution temperature of 23° C. for 30 seconds to obtain a developed film, and the resulting developed film was heated using a high temperature inert gas oven (INH-9CD-S, manufactured by Koyo Thermo Systems Co., Ltd.) under a nitrogen atmosphere at 250° C. for 60 minutes to obtain a substrate for evaluating optical properties wherein the substrate includes a cured film having a thickness of 2.0 am. The results obtained by evaluating the optical properties of the cured film using the above-mentioned method are shown in Table 5.

The surface of an aluminum substrate (70 mm×70 mm) was coated with the photosensitive composition 1 using the spin coater with the number of revolutions regulated so that a finally obtained cured film could have a thickness of 2.0 am, a coated film was thus obtained, and the resulting coated film was prebaked using the hot plate at atmospheric pressure at 100° C. for 120 seconds to obtain a prebaked film. An exposed film was obtained using the both-surface alignment one-side surface exposure apparatus to irradiate the whole surface of the prebaked film with exposure light in the necessary minimum exposure amount obtained in the above-mentioned method, wherein the exposure light was a ray mixture of the j-rays (313 nm), i-rays (wavelength 365 nm), h-rays (wavelength 405 nm), and g-rays (wavelength 436 nm) of an ultrahigh pressure mercury lamp. The exposed film was heated using the high temperature inert gas oven under a nitrogen atmosphere at 250° C. for 60 minutes to obtain a cured film having a thickness of 2.0 am. Further, an aluminum thin film having a film thickness of 70 nm was formed on the surface of the cured film by pattern vapor-deposition to obtain a substrate for evaluating permittivity. The results obtained by evaluating the permittivity of the cured film using the above-mentioned method are shown in Table 5. Here, the hot plate, the both-surface alignment one-side surface exposure apparatus, and the high temperature inert gas oven used were the same as those which were used to produce the substrate for evaluating optical properties.

The surface of a translucent glass substrate (10 cm×10 cm) as a support was coated with the polyamic acid solution A using the spin coater with the number of revolutions regulated so that a finally obtained flexible substrate could have a thickness of 7.0 am, a coated film was thus obtained, and the resulting coated film was dried using the hot plate at 110° C. for 10 minutes. Then, the resulting coated film was heated using the high temperature inert gas oven under a nitrogen atmosphere with the temperature raised from 50° C. at 4° C./minute, heated at 350° C. for 30 minutes, heated with the temperature raised at 10° C./minute, heated at 500° C. for 30 minutes to imidize the polyamic acid, and then left to cool to room temperature to obtain a laminated substrate including a flexible substrate composed of a polyimide resin on the surface of the glass substrate. Under the same conditions as the above-mentioned substrate for evaluating optical properties was produced, the surface of the flexible substrate was further coated with the photosensitive composition 1 so that a finally obtained cured film could have a thickness of 2.0 µm, and the resulting film was prebaked, exposed, developed, and cured to obtain a cured film. The translucent glass substrate side was irradiated with excimer laser beam to decrease the adhesiveness of the flexible substrate, from which only the translucent glass substrate was peeled to obtain a substrate for evaluating flexibility, wherein the obtained substrate had a cured film having a thickness of 2.0 µm formed on the surface of the flexible substrate having a thickness of 7.0 µm. The results obtained by evaluating the flexibility of the cured film using the above-mentioned method are shown in Table 5.

TABLE 5

| | | Photosensitive composition | | | | | |
|---|---|---|---|---|---|---|---|
| | | Pigment component content in total solid content (wt %) | | | (a-1) component Epoxy compound having long chain alkyl group of carbon numbers 9 to 19 | | |
| | Type of Composition having negative-type photosensitivity | (c) Inorganic pigment having near infrared shielding property | Organic pigment | Content in total solid content (wt %) | Structure formula | Carbon numbers of long chain alkyl group | Total numbers of tertialy carbon and quatenary carbon |
| Example 1 | Photosensitive composition 1 | 14.0 (TiN) | 11.9 (Pseudo black) | 15.0 | Compound expressed by chemical structure (3) | 9 | 1 |
| Example 2 | Photosensitive composition 2 | 14.0 (TiN) | 11.9 (Pseudo black) | 15.0 | Compound expressed by chemical structure (5) | 10 | 1 |
| Example 3 | Photosensitive composition 3 | 14.0 (TiN) | 11.9 (Pseudo black) | 15.0 | Compound expressed by chemical structure (7) | 12 | 0 |
| Example 4 | Photosensitive composition 4 | 14.0 (TiN) | 11.9 (Pseudo black) | 15.0 | Compound expressed by chemical structure (9) | 15 | 1 |

TABLE 5-continued

| | | | | | | | |
|---|---|---|---|---|---|---|---|
| Example 5 | Photosensitive composition 5 | 14.0 (TiN) | 11.9 (Pseudo black) | 15.0 | Compound expressed by chemical structure (11) | 17 | 4 |
| Example 6 | Photosensitive composition 6 | 14.0 (TiN) | 11.9 (Pseudo black) | 15.0 | Compound expressed by chemical structure (13) | 17 | 3 |
| Example 7 | Photosensitive composition 7 | 14.0 (TiN) | 11.9 (Pseudo black) | 15.0 | Compound expressed by chemical structure (15) | 17 | 0 |
| Example 8 | Photosensitive composition 8 | 14.0 (TiN) | 11.9 (Pseudo black) | 15.0 | Compound expressed by chemical structure (17) | 19 | 5 |

| (1) Evaluation of cured film | | | | |
|---|---|---|---|---|
| (i) Maximum of light transmission at wave length of 780 to 1000 nm (%) | (ii) Light transmission at wave length of 550 nm (%) | (iii) Permittivity at frequency of 1 kHz | (iv) Pattern linearity | (v) Flexibility Minimum carvature radius (mm) |

| | (i) | (ii) | (iii) | (iv) | (v) |
|---|---|---|---|---|---|
| Example 1 | 4.2 | 0.5 | 4.9 | A | 0.25 |
| Example 2 | 4.2 | 0.5 | 4.8 | A | 0.25 |
| Example 3 | 4.2 | 0.5 | 4.6 | A | 0.25 |
| Example 4 | 4.2 | 0.5 | 4.5 | B | 0.25 |
| Example 5 | 4.2 | 0.5 | 4.2 | A | 0.15 |
| Example 6 | 4.2 | 0.5 | 4.4 | A | 0.15 |
| Example 7 | 4.2 | 0.5 | 4.5 | C | 0.15 |
| Example 8 | 4.2 | 0.5 | 3.9 | C | 0.05 |

Then, the following method was used to produce a substrate having a patterned cured film formed thereon, the cured film being obtained by curing the photosensitive composition 1, and to produce an organic EL display device for evaluating unevenness of luminance, the device including the patterned cured film as a pixel division layer.

FIG. 4 shows a process of producing an organic EL display device, including a step of forming a pixel division layer.

A silver/copper alloy thin film (at a volume ratio of 10:1) having a thickness of 10 nm was formed on the whole surface of a non-alkali glass substrate (15) (in rectangular shape, 46 mm wide and 46 mm long) by a sputtering method, and the thin film was formed into a patterned metal reflection layer (16) by etching. Then, an ITO transparent conductive film having a thickness of 10 nm was formed on the whole surface of the patterned metal reflection layer by a sputtering method and etched to form a second electrode 17 having the same pattern and an auxiliary electrode (18) as an extraction electrode, followed by ultrasonic cleaning with "Semicoclean" (registered trademark) 56 (manufactured by Furuuchi Chemical Corporation) for ten minutes and ultrapure water cleaning to obtain a substrate having electrodes formed thereon.

The surface of the substrate having electrodes formed thereon was coated with the photosensitive composition 1 using the spin coater with the number of revolutions regulated so that a finally obtained pixel division layer could have a thickness of 2.0 µm, and a coated film was thus obtained. The resulting coated film was prebaked using the hot plate at atmospheric pressure at 100° C. for 120 seconds to obtain a prebaked film.

A negative exposure mask was set on the coated film in such a manner that the longitudinal and cross-directional edges of the patterned light-shielding portion of the negative exposure mask were parallel to the longitudinal and cross-directional edges of the non-alkali glass substrate (15) respectively, wherein the negative exposure mask had openings (in rectangular shape, 30 µm wide and 165 µm long) arranged with a pitch of 50 µm between the openings. An exposed film was obtained using the both-surface alignment one-side surface exposure apparatus to irradiate the prebaked film via the pattern with exposure light in the necessary minimum exposure amount, wherein the exposure light was a ray mixture of the j-rays (313 nm), i-rays (wavelength 365 nm), h-rays (wavelength 405 nm), and g-rays (wavelength 436 nm) of an ultrahigh pressure mercury lamp. Then, using the small-size development apparatus for photolithography, the exposed film was developed with a 2.38% by weight TMAH aqueous solution for 60 seconds and then rinsed with deionized water for 30 seconds to obtain a developed film. Here, the negative exposure mask used was a mask in which a chromium-made patterned light-shielding portion was formed on the surface of a soda glass substrate.

Using the high temperature inert gas oven, the developed film was formed into a cured film by further heating under nitrogen atmosphere at 250° C. for 60 minutes to obtain a substrate having a patterned cured film (19), 2.0 µm thick, formed thereon and having an opening rate of 18%, wherein the patterned cured film had openings (in rectangular shape, 30 µm wide and 165 µm long) arranged with a pitch of 50 µm between the openings in a 16 mm long and 16 mm wide area in the central portion of the substrate having electrodes formed thereon. The substrate having the patterned cured film thereon was evaluated for pattern linearity using the above-mentioned method. In an organic EL display device obtained after the below-mentioned process, the openings mentioned here are the portion that finally becomes a light emitting pixel portion, and the patterned cured film mentioned here is the portion that corresponds to the pixel division layer. Here, the hot plate, the both-surface alignment one-side surface exposure apparatus, the small-size development apparatus for photolithography, and the high temperature inert gas oven used were the same as those which were used to produce the substrate for evaluating optical properties.

Then, an organic EL display device was produced using the substrate having a patterned cured film formed thereon. To form an organic EL layer (20) including a light emitting layer by vacuum vapor-deposition, the substrate having a patterned cured film formed thereon was rotated against a vapor-deposition source under the vapor-deposition condition having a degree of vacuum of $1 \times 10^{-3}$ Pa or less, and a compound (HT-1) having a thickness of 10 nm as an electron hole injection layer and a compound (HT-2) having a thickness of 50 nm as an electron hole transport layer were first formed. Next, on the light emitting layer, a compound (GH-1) as a host material and a compound (GD-1) as a dopant material were vapor-deposited to a thickness of 40 nm. After that, as electron transporting materials, a compound (ET-1) and a compound (LiQ) were laminated, at a volume ratio of 1:1, to a thickness of 40 nm.

Then, the compound (LiQ) was vapor-deposited to 2 nm, and a silver/magnesium alloy (at a volume ratio of 10:1) was deposited to 10 nm to form a first electrode (21). After that, under a low-humidity nitrogen atmosphere, a cap-shaped glass sheet was adhered to achieve sealing using an epoxy resin adhesive, and thus, an organic EL display device was obtained. The results obtained by evaluating the unevenness of luminance of the organic EL display device using the above-mentioned method are shown in Table 6. In this regard, the thickness mentioned here refers to a value displayed on a crystal oscillation type of film thickness monitor.

The chemical structures of the compound group (HT-1, HT-2, GH-1, GD-1, ET-1, and LiQ) used to form the organic EL layer are shown below.

[Chem. 28]

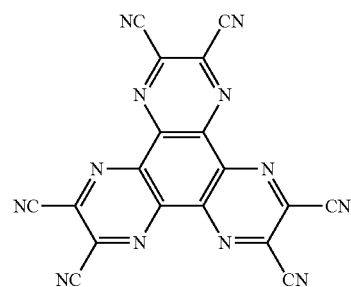

HT-1

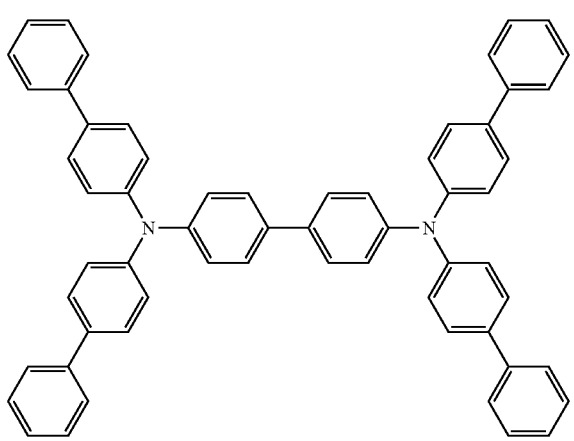

HT-2

[Chem. 29]

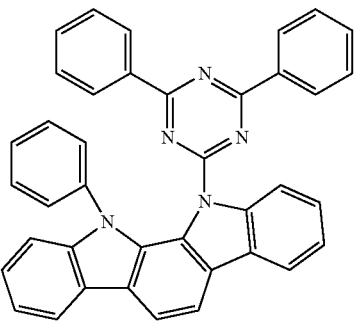

GH-1

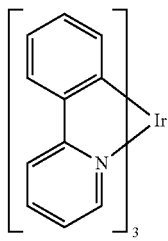

GD-1

[Chem. 30]

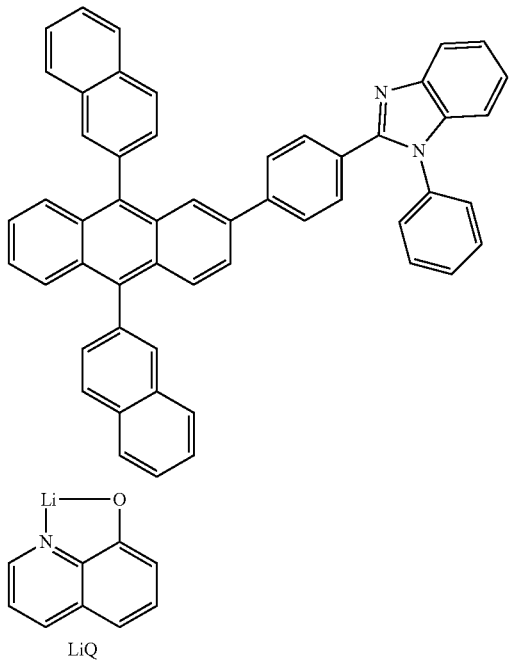

ET-1

LiQ

Then, the following method was used to produce a flexible organic EL display device for evaluating light emission reliability, wherein the device includes, as a pixel division layer, a cured film obtained by curing the photosensitive composition 1.

Using the same procedures as in FIG. 4 showing a process of producing the above-mentioned organic EL display device including a step of forming a pixel division layer except that the non-alkali glass substrate (15) was changed to a laminated substrate in which a flexible substrate composed of a polyimide resin was on the surface of a glass substrate as a support, a metal reflection layer, a second electrode, and an auxiliary electrode were formed, and then, the resulting product was coated with the photosensitive composition 1, prebaked, exposed, developed, and cured to obtain a cured film having a thickness of 2.0 μm and having the same pattern as the above-mentioned patterned cured film (19). Using the same procedures, an organic EL layer and a first electrode were then formed and sealed in. Finally, the glass substrate was peeled off to complete a flexible organic EL display device for evaluating light emission reliability, and the device was evaluated for light emission reliability using the above-mentioned method. The evaluations results are shown in Table 6. Here, as a laminated substrate in which a flexible substrate composed of a polyimide resin was on the surface of a glass substrate, that which was obtained using the same procedures as the above-mentioned substrate for evaluating flexibility was used.

TABLE 6

| | Type of Composition having negative-type photosensitivity | (2) Evaluation of organic EL display device Unevenness of Luminance | (3) Evaluation of Flexible organic EL display device Area prcentage of light emmiting part (%) | | | |
|---|---|---|---|---|---|---|
| | | | after 1 hr | after 50 hrs | after 100 hrs | after 500 hrs |
| Example 1 | Photosensitive composition 1 | B | A | A | C | C |
| Example 2 | Photosensitive composition 2 | A | A | A | B | B |
| Example 3 | Photosensitive composition 3 | A | A | A | B | B |
| Example 4 | Photosensitive composition 4 | A | A | A | B | B |
| Example 5 | Photosensitive composition 5 | A | A | A | A | B |
| Example 6 | Photosensitive composition 6 | A | A | A | A | B |
| Example 7 | Photosensitive composition 7 | A | A | A | B | B |
| Example 8 | Photosensitive composition 8 | A | A | A | A | B |

Examples 2 to 8

The photosensitive compositions 2 to 8 having negative photosensitivity and having a solid content of 15% by weight were prepared in accordance with the kinds and blended amounts (g) of the respective raw materials shown in Table 4 using the same procedures in Example 1 except that the compounds represented by the above-mentioned structural formulae (5), (7), (9), (11), (13), (15), and (17) were used respectively in place of the compound represented by the structural formula (3), and the cured films and organic EL display devices were produced in the same manner as in Example 1 and evaluated. The evaluation results are shown in Tables 5 and 6.

Examples 9 to 11

The photosensitive compositions 9 to 11 having negative photosensitivity and having a solid content of 15% by weight were prepared in accordance with the kinds and blended amounts (g) of the respective raw materials shown in Table 7 using the same procedures in Example 1 except that the pigment dispersion liquid 4 was used in place of the pigment dispersion liquid 12 and that the compounds represented by the above-mentioned structural formulae (11), (3), and (17) were used respectively, and the cured films and organic EL display devices were produced in the same manner as in Example 1 and evaluated. The evaluation results are shown in Tables 8 and 9.

TABLE 7

| Type of Composition having negative-type photosensitivity | Pigment dispersion liquid | | (a-1) component Epoxy compound having long chain alkyl group of carbon numbers 9 to 19 | |
|---|---|---|---|---|
| | Type | weight (g) | Structure formula | weight (g) |
| Example 9 | Photosensitive composition 9 | Pigment dispersion liquid 1<br>Pigment dispersion liquid 4 | 2.18<br>1.77 | Compound expressed by chemical structure (11) | 0.45 |
| Example 10 | Photosensitive composition 10 | Pigment dispersion liquid 1<br>Pigment dispersion liquid 4 | 2.18<br>1.77 | Compound expressed by chemical structure (3) | 0.45 |
| Example 11 | Photosensitive composition 11 | Pigment dispersion liquid 1<br>Pigment dispersion liquid 4 | 2.18<br>1.77 | Compound expressed by chemical structure (17) | 0.45 |
| Example 12 | Photosensitive composition 12 | Pigment dispersion liquid 1<br>Pigment dispersion liquid 4 | 2.18<br>1.77 | Compound expressed by chemical structure (11) | 0.45 |
| Example 13 | Photosensitive composition 13 | Pigment dispersion liquid 16<br>Pigment dispersion liquid 17 | 2.18<br>1.77 | Compound expressed by chemical structure (11) | 0.45 |
| Example 14 | Photosensitive composition 14 | —<br>Pigment dispersion liquid 4 | —<br>5.66 | Compound expressed by chemical structure (11) | 0.45 |
| Example 15 | Photosensitive composition 15 | —<br>Pigment dispersion liquid 12 | —<br>8.25 | Compound expressed by chemical structure (11) | 0.45 |
| Example 16 | Photosensitive composition 16 | Pigment dispersion liquid 1<br>Pigment dispersion liquid 4 | 2.18<br>1.77 | Compound expressed by chemical structure (11) | 0.60 |
| Example 17 | Photosensitive composition 17 | Pigment dispersion liquid 1<br>Pigment dispersion liquid 4 | 1.77<br>2.18 | Compound expressed by chemical structure (11) | 0.75 |
| Example 18 | Photosensitive composition 18 | Pigment dispersion liquid 1<br>Pigment dispersion liquid 4 | 2.18<br>1.77 | Compound expressed by chemical structure (11) | 0.30 |

| | Polyimide resin solution A (PGMEA solution of solid content 30 wt %) weight (g) | Compound having two or more radical polymerizable groups | | Photo-polymerization initiator (NCI-831) weight (g) | Solvent (PGMEA) weight (g) | Solid content of Photosensitive composition (wt %) |
|---|---|---|---|---|---|---|
| | | DPCA-60 weight (g) | DPHA weight (g) | | | |
| Example 9 | 3.10 | 0.69 | — | 0.12 | 11.69 | 15.0 |
| Example 10 | 3.10 | 0.69 | — | 0.12 | 11.69 | 15.0 |
| Example 11 | 3.10 | 0.69 | — | 0.12 | 11.69 | 15.0 |
| Example 12 | 3.10 | — | 0.69 | 0.12 | 11.69 | 15.0 |
| Example 13 | 3.10 | 0.69 | — | 0.12 | 11.69 | 15.0 |
| Example 14 | 2.97 | 0.69 | — | 0.12 | 10.11 | 15.0 |
| Example 15 | 1.68 | 0.69 | — | 0.12 | 8.82 | 15.0 |
| Example 16 | 2.60 | 0.69 | — | 0.12 | 12.04 | 15.0 |
| Example 17 | 2.10 | 0.69 | — | 0.12 | 12.39 | 15.0 |
| Example 18 | 3.60 | 0.69 | — | 0.12 | 11.34 | 15.0 |

TABLE 8

| | Type of Composition having negative-type photosensitivity | Photosensitive composition | | | | | |
|---|---|---|---|---|---|---|---|
| | | Pigment component content in total solid content (wt %) | | (a-1) component Epoxy compound having long chain alkyl group of carbon numbers 9 to 19 | | | |
| | | (c) Inorganic pigment having near infrared shielding property | Organic pigment | Content in total solid content (wt %) | Structure formula | Carbon numbers of long chain alkyl group | Total numbers of tertialy carbon and quatenary carbon |
| Example 9 | Photosensitive composition 9 | 14.0 (TiN) | 7.1 (S0100) | 15.0 | Compound expressed by chemical structure (11) | 17 | 4 |
| Example 10 | Photosensitive composition 10 | 14.0 (TiN) | 7.1 (S0100) | 15.0 | Compound expressed by chemical structure (3) | 9 | 1 |
| Example 11 | Photosensitive composition 11 | 14.0 (TiN) | 7.1 (S0100) | 15.0 | Compound expressed by chemical structure (17) | 19 | 5 |
| Example 12 | Photosensitive composition 12 | 14.0 (TiN) | 7.1 (S0100) | 15.0 | Compound expressed by chemical structure (11) | 17 | 4 |
| Example 13 | Photosensitive composition 13 | 14.0 (TiN) | 7.1 (S0100) | 15.0 | Compound expressed by chemical structure (11) | 17 | 4 |

TABLE 8-continued

| | | | | | | | |
|---|---|---|---|---|---|---|---|
| Example 14 | Photosensitive composition 14 | — | 22.6 (S0100) | 15.0 | Compound expressed by chemical structure (11) | 17 | 4 |
| Example 15 | Photosensitive composition 15 | — | 33.0 (pseudo black) | 15.0 | Compound expressed by chemical structure (11) | 17 | 4 |
| Example 16 | Photosensitive composition 16 | 14.0 (TiN) | 7.1 (S0100) | 20.0 | Compound expressed by chemical structure (11) | 17 | 4 |
| Example 17 | Photosensitive composition 17 | 14.0 (TiN) | 7.1 (S0100) | 25.0 | Compound expressed by chemical structure (11) | 17 | 4 |
| Example 18 | Photosensitive composition 18 | 14.0 (TiN) | 7.1 (S0100) | 10.0 | Compound expressed by chemical structure (11) | 17 | 4 |

(1) Evaluation of cured film

| | (i) Maximum of light transmission at wave length of 780 to 1000 nm (%) | (ii) Light transmission at wave length of 550 nm (%) | (iii) Permittivity at frequency of 1 kHz | (iv) Pattern linearity | (v) Flexibility Minimum carvature radius (mm) |
|---|---|---|---|---|---|
| Example 9 | 4.2 | 0.5 | 4.2 | A | 0.05 |
| Example 10 | 4.2 | 0.5 | 4.9 | A | 0.15 |
| Example 11 | 4.2 | 0.5 | 3.9 | B | 0.05 |
| Example 12 | 4.2 | 0.5 | 4.2 | A | 0.15 |
| Example 13 | 4.9 | 0.9 | 4.4 | B | 0.40 |
| Example 14 | 92.0 | 1.0 | 3.6 | A | 0.25 |
| Example 15 | 91.6 | 1.0 | 3.6 | A | 0.40 |
| Example 16 | 4.2 | 0.5 | 4.0 | A | 0.05 |
| Example 17 | 4.2 | 0.5 | 3.9 | B | 0.25 |
| Example 18 | 4.2 | 0.5 | 4.5 | A | 0.15 |

TABLE 9

| | Type of Composition having negative-type photosensitivity | (2) Evaluation of organic EL display Unevenness of Luminance | (3) Evaluation of Flexible organic EL display device Area percentage of light emmiting part (%) | | | |
|---|---|---|---|---|---|---|
| | | | after 1 hr | after 50 hrs | after 100 hrs | after 500 hrs |
| Example 9 | Photosensitive composition 9 | A | A | A | A | B |
| Example 10 | Photosensitive composition 10 | B | A | B | B | C |
| Example 11 | Photosensitive composition 11 | A | A | A | A | B |
| Example 12 | Photosensitive composition 12 | A | A | A | A | B |
| Example 13 | Photosensitive composition 13 | A | A | A | A | B |
| Example 14 | Photosensitive composition 14 | A | A | A | A | B |
| Example 15 | Photosensitive composition 15 | A | A | A | A | C |
| Example 16 | Photosensitive composition 16 | A | A | A | A | B |
| Example 17 | Photosensitive composition 17 | A | A | A | B | C |
| Example 18 | Photosensitive composition 18 | A | A | A | B | C |

Example 12

A photosensitive composition 12 having negative photosensitivity and having a solid content of 15% by weight was prepared using the same procedures in Example 9 except that dipentaerythritol hexaacrylate ("DPHA" in Tables) was used in place of ε-caprolactone-added acrylate of dipentaerythritol, and the cured film and organic EL display device were produced in the same manner as in Example 1 and evaluated. The evaluation results are shown in Tables 8 and 9.

Example 13

A photosensitive composition 13 having negative photosensitivity and having a solid content of 15% by weight were prepared in accordance with the kinds and blended amounts (g) of the raw materials shown in Table 7 using the same procedures in Example 1 except that the pigment dispersion liquid 16 was used in place of the pigment dispersion liquid 1 and that the pigment dispersion liquid 17 was used in place of the pigment dispersion liquid 4, and the cured film and organic EL display device were produced in the same manner as in Example 1 and evaluated. The evaluation results are shown in Tables 8 and 9.

Example 14 and 15

The photosensitive compositions 14 and 15 having negative photosensitivity and having a solid content of 15% by weight were prepared in accordance with the kinds and blended amounts (g) of the respective raw materials shown in Table 7 using the same procedures in Example 1 except that the pigment dispersion liquid 1 was not used and that the pigment dispersion liquids 4 and 12 were used respectively, and the cured films and organic EL display devices were produced in the same manner as in Example 1 and evaluated. The evaluation results are shown in Tables 8 and 9.

Examples 16 to 18

The photosensitive compositions 16 to 18 having negative photosensitivity and having a solid content of 15% by weight were prepared in accordance with the kinds and blended amounts (g) of the respective raw materials shown in Table 7 using the same procedures in Example 9 except that the ratio of the compound represented by the above-mentioned structural formula (11) to the polyimide resin solution A was changed, and the cured films and organic EL display devices were produced in the same manner as in Example 1 and evaluated. The evaluation results are shown in Tables 8 and 9.

Examples 19 to 21

The photosensitive compositions 19 and 21 having negative photosensitivity and having a solid content of 15% by weight were prepared in accordance with the kinds and blended amounts (g) of the respective raw materials shown in Table 10 using the pigment dispersion liquids 2, 4, 12, 14, and 15, and the cured films and organic EL display devices were produced in the same manner as in Example 1 and evaluated. The evaluation results are shown in Tables 11 and 12.

TABLE 10

| | Type of Composition having negative-type photosensitivity | Pigment dispersion liquid Type | weight (g) | (a-1) component Epoxy compound having long chain alkyl group of carbon numbers 9 to 19 Structure formula | weight (g) | Polyimide resin solution A (PGMEA solution of solid content 30 wt %) weight (g) |
|---|---|---|---|---|---|---|
| Example 19 | Photosensitive composition 19 | Pigment dispersion liquid 2 | 2.18 | Compound expressed by chemical structure (11) | 0.45 | 3.10 |
| | | Pigment dispersion liquid 4 | 1.77 | | | |
| Example 20 | Photosensitive composition 20 | Pigment dispersion liquid 14 | 2.18 | Compound expressed by chemical structure (11) | 0.45 | 3.10 |
| | | Pigment dispersion liquid 4 | 1.77 | | | |
| Example 21 | Photosensitive composition 21 | Pigment dispersion liquid 14 | 2.56 | Compound expressed by chemical structure (11) | 0.45 | 2.60 |
| | | Pigment dispersion liquid 15 | 1.28 | | | |
| Example 22 | Photosensitive composition 22 | Pigment dispersion liquid 1 | 2.18 | Compound expressed by chemical structure (11) | 0.45 | 2.70 |
| | | Pigment dispersion liquid 4 | 1.77 | | | |
| Example 23 | Photosensitive composition 23 | Pigment dispersion liquid 1 | 2.18 | Compound expressed by chemical structure (11) | 0.45 | 2.10 |
| | | Pigment dispersion liquid 12 | 2.97 | | | |
| Example 24 | Photosensitive composition 24 | Pigment dispersion liquid 3 | 1.03 | Compound expressed by chemical structure (11) | 0.45 | 2.94 |
| | | Pigment dispersion liquid 4 | 4.00 | | | |

| | Compound having two or more radical polymerizable groups (DPCA-60) weight (g) | Near infrared absorbing dye solution A (2 wt % FDN-08 PGMEA solution) weight (g) | Photo-polymerization initiator (NCI-831) weight (g) | Solvent (PGMEA) weight (g) | Solid content of Photosensitive composition (wt %) |
|---|---|---|---|---|---|
| Example 19 | 0.69 | — | 0.12 | 11.69 | 15.0 |
| Example 20 | 0.69 | — | 0.12 | 11.69 | 15.0 |
| Example 21 | 0.69 | — | 0.12 | 12.30 | 15.0 |
| Example 22 | 0.69 | 6.00 | 0.12 | 6.09 | 15.0 |
| Example 23 | 0.69 | 6.00 | 0.12 | 5.49 | 15.0 |
| Example 24 | 0.69 | — | 0.12 | 10.77 | 15.0 |

TABLE 11

| | Type of Composition having negative-type photosensitivity | Photosensitive composition | | | | | | |
|---|---|---|---|---|---|---|---|---|
| | | Pigment component content in total solid content (wt %) | | Dye component content in total solid content (wt %) Near infrared absorbing dye | (a-1) component Epoxy compound having long chain alkyl group of carbon numbers 9 to 19 | | | |
| | | (c) Inorganic pigment having near infrared shielding property | Organic pigment | | Content in total solid content (wt %) | Structure formula | Carbon numbers of long chain alkyl group | Total numbers of tertialy carbon and quatenary carbon |
| Example 19 | Photosensitive composition 19 | 14.0 (TiON) | 7.1 (S0100) | — | 15.0 | Compound expressed by chemical structure (11) | 17 | 4 |
| Example 20 | Photosensitive composition 20 | 14.0 (ZrN) | 7.1 (S0100) | — | 15.0 | Compound expressed by chemical structure (11) | 17 | 4 |
| Example 21 | Photosensitive composition 21 | 16.4/8.2 (ZrN/a-CB) | — | — | 15.0 | Compound expressed by chemical structure (11) | 17 | 4 |
| Example 22 | Photosensitive composition 22 | 14.0 (TiN) | 7.1 (S0100) | 4.0 (VO-Pc) | 15.0 | Compound expressed by chemical structure (11) | 17 | 4 |
| Example 23 | Photosensitive composition 23 | 14.0 (TiN) | 11.9 (Pseudo black) | 4.0 (VO-Pc) | 15.0 | Compound expressed by chemical structure (11) | 17 | 4 |
| Example 24 | Photosensitive composition 24 | 6.60 (TPK-1227) | 16.02 (S0100) | — | 15.0 | Compound expressed by chemical structure (11) | 17 | 4 |

| | (1) Evaluation of cured film | | | | |
|---|---|---|---|---|---|
| | (i) Maximum of light transmission at wave length of 780 to 1000 nm (%) | (ii) Light transmission at wave length of 550 nm (%) | (iii) Permittivity at frequency of 1 kHz | (iv) Pattern linearity | (v) Flexibility Minimum carvature radius (mm) |
| Example 19 | 4.4 | 0.7 | 4.7 | A | 0.15 |
| Example 20 | 5.0 | 0.5 | 4.4 | A | 0.15 |
| Example 21 | 4.2 | 0.5 | 4.8 | A | 0.15 |
| Example 22 | 1.7 | 0.5 | 4.2 | A | 0.05 |
| Example 23 | 1.7 | 0.5 | 4.2 | A | 0.05 |
| Example 24 | 35.4 | 6.1 | 5.0 | A | 0.40 |

TABLE 12

| | Type of Composition having negative-type photosensitivity | (2) Evaluation of organic EL display Unevenness of Luminance | (3) Evaluation of Flexible organic EL display device Area percentage of light emmiting part (%) | | | |
|---|---|---|---|---|---|---|
| | | | after 1 hr | after 50 hrs | after 100 hrs | after 500 hrs |
| Example 19 | Photosensitive composition 19 | A | A | A | A | B |
| Example 20 | Photosensitive composition 20 | A | A | A | A | B |
| Example 21 | Photosensitive composition 21 | A | A | A | A | B |
| Example 22 | Photosensitive composition 22 | A | A | A | A | B |
| Example 23 | Photosensitive composition 23 | A | A | A | A | B |
| Example 24 | Photosensitive composition 24 | C | A | A | B | C |

Examples 22 and 23

The photosensitive compositions 22 and 23 having a solid content of 15% by weight were prepared in accordance with the kinds and blended amounts (g) of the respective raw materials shown in Table 10 using the same procedures as in Example 9 except that a near infrared absorbing dye solution A obtained by adding 0.20 g of FDN-08 ("VO-Pc" in Tables), which was a vanadyl phthalocyanine near infrared absorbing dye having the maximum absorption wavelength at a wavelength of 992 nm, to 9.80 g of PGMEA and stirring the resulting mixture for three hours was further used, and the cured films and organic EL display devices were produced in the same manner as in Example 1 and evaluated. The evaluation results are shown in Tables 11 and 12.

Example 24

A photosensitive composition 24 having negative photosensitivity and having a solid content of 15% by weight was prepared in accordance with the kinds and blended amounts (g) of the raw materials shown in Table 10 using the same procedures in Example 5 except that the pigment dispersion liquids 3 and 4 were used in place of the pigment dispersion liquids 1 and 12, and the cured film and organic EL display device were produced in the same manner as in Example 1 and evaluated. The evaluation results are shown in Tables 11 and 12.

Example 25

A mixture of 2.18 g of the pigment dispersion liquid 1, 2.97 g of the pigment dispersion liquid 12, 2.10 g of the polyimide resin solution A, 5.00 g of the polyimide resin solution B, 0.51 g of ε-caprolactone-added acrylate of dipentaerythritol (KAYARAD DPCA-60) as a compound having two or more radical polymerizable groups, 0.12 g of "ADEKAARKLS" (registered trademark) NCI-831 as a photopolymerization initiator, and 7.12 g of PGMEA was brought into a hermetically enclosed condition and stirred on a shaker for 30 minutes to prepare a photosensitive composition 25 having negative photosensitivity and having a solid content of 15% by weight.

The cured film and organic EL display device were produced in the same manner as in Example 1 and evaluated. The kinds and blended amounts (g) of the raw materials are shown in Table 13, and the evaluation results are shown in Tables 14 and 15.

TABLE 13

| | Type of Composition having negative-type photosensitivity | Pigment dispersion liquid Type | weight (g) | (a-2) component Resin having chemical structure expressed by general formula (1) (PGMEA solution of solid content 15 wt %) Type | weight (g) | (a-3) component Resin having chemical structure expressed by general formula (2) (PGMEA solution of solid content of 15 wt %) Type | weight (g) |
|---|---|---|---|---|---|---|---|
| Example 25 | Photosensitive composition 25 | Pigment dispersion liquid 1 | 2.18 | Polyimide resin solution B | 5.00 | — | — |
| | | Pigment dispersion liquid 12 | 2.97 | | | | |
| Example 26 | Photosensitive composition 26 | Pigment dispersion liquid 1 | 2.18 | — | — | Cardo resin solution A | 5.00 |
| | | Pigment dispersion liquid 12 | 2.97 | | | | |

| | Polyimide resin solution A (PGMEA solution of solid content 30 wt %) weight (g) | Compound having two or more radical polymerizable groups (DPCA-60) weight (g) | Photo-polymerization initiator (NCI-831) weight (g) | Solvent (PGMEA) weight (g) | Solid content of Photosensitive composition (wt %) |
|---|---|---|---|---|---|
| Example 25 | 2.10 | 0.51 | 0.12 | 7.12 | 15.0 |
| Example 26 | 2.10 | 0.51 | 0.12 | 7.12 | 15.0 |

TABLE 14

| | | Photosensitive composition | | | | | |
|---|---|---|---|---|---|---|---|
| | | Pigment component content in total solid content (wt %) | | | (a-2) component, (a-3) component | | |
| | Type of Composition having negative-type photosensitivity | (c) Inorganic pigment having near infrared shielding property | Organic pigment | Content in total solid content (wt %) | Structure formula | Carbon numbers of long chain alkyl group | Total numbers of tertialy carbon and quatenary carbon |
| Example 25 | Photosensitive composition 25 | 14.0 (TiN) | 11.9 (Pseudo black) | 25.0 | Resin having chemical structure expressed by general formula (1) | 17 | 4 |

TABLE 14-continued

| | | | | | | | |
|---|---|---|---|---|---|---|---|
| Example 26 | Photosensitive composition 26 | 14.0 (TiN) | 11.9 (Pseudo black) | 25.0 | Resin having chemical structure expressed by general formula (2) | 17 | 4 |

| | | (1) Evaluation of cured film | | | | |
|---|---|---|---|---|---|---|
| | | (i) Maximum of light transmission at wave length of 780 to 1000 nm (%) | (ii) Light transmission at wave length of 550 nm (%) | (iii) Permittivity at frequency of 1 kHz | (iv) Pattern linearity | (v) Flexibility Minimum carvature radius (mm) |
| | Example 25 | 4.2 | 0.5 | 4.7 | B | 0.15 |
| | Example 26 | 4.2 | 0.5 | 4.5 | B | 0.15 |

TABLE 15

| | Type of Composition having negative-type photosensitivity | (2) Evaluation of organic EL display Unevenness of Luminance | (3) Evaluation of Flexible organic EL display device Area percentage of light emmiting part (%) | | | |
|---|---|---|---|---|---|---|
| | | | after 1 hr | after 50 hrs | after 100 hrs | after 500 hrs |
| Example 25 | Photosensitive composition 25 | A | A | A | B | B |
| Example 26 | Photosensitive composition 26 | A | A | A | B | C |

Example 26

A photosensitive composition 26 having negative photosensitivity and having a solid content of 15% by weight were prepared in accordance with the kinds and blended amounts (g) of the raw materials shown in Table 7 using the same procedures in Example 25 except that the polyimide resin solution B was changed to the cardo resin solution A, and the cured film and organic EL display device were produced in the same manner as in Example 1 and evaluated. The evaluation results are shown in Tables 14 and 15.

Comparative Examples 1 to 7

The photosensitive compositions 27 to 33 having negative photosensitivity and having a solid content of 15% by weight were prepared in accordance with the kinds and blended amounts (g) of the respective raw materials shown in Table 16 without using the above-mentioned (a-1) to (a-3) components essential in the photosensitive composition according to the present invention, and the cured films and organic EL display devices were produced in the same manner as in Example 1 and evaluated. The evaluation results are shown in Tables 17 and 18.

TABLE 16

| | Type of Composition having negative-type photosensitivity | Pigment dispersion liquid | | Polyimide resin solution A (PGMEA solution of solid content 30 wt %) | Alkali-soluble cardo resin solution (PGMEA solution of solid content 44 wt %: WR-301) |
|---|---|---|---|---|---|
| | | Type | weight (g) | weight (g) | weight (g) |
| Comparative Example 1 | Photosensitive composition 27 | Pigment dispersion liquid 1 Pigment dispersion liquid 12 | 2.18 2.97 | 3.80 | — |
| Comparative Example 2 | Photosensitive composition 28 | Pigment dispersion liquid 1 Pigment dispersion liquid 4 | 2.18 1.77 | 4.40 | — |
| Comparative Example 3 | Photosensitive composition 29 | — Pigment dispersion liquid 12 | — 8.25 | 2.98 | — |
| Comparative Example 4 | Photosensitive composition 30 | — Pigment dispersion liquid 4 | — 5.66 | 4.27 | — |
| Comparative Example 5 | Photosensitive composition 31 | — Pigment dispersion liquid 4 | — 5.66 | 4.27 | — |
| Comparative Example 6 | Photosensitive composition 32 | — Pigment dispersion liquid 4 | — 5.66 | 3.27 | 0.68 |

TABLE 16-continued

| | | | | | |
|---|---|---|---|---|---|
| Comparative Example 7 | Photosensitive composition 33 | Pigment dispersion liquid 3 Pigment dispersion liquid 4 | 1.03 4.00 | 4.24 | — |
| Comparative Example 8 | Photosensitive composition 34 | Pigment dispersion liquid 1 Pigment dispersion liquid 12 | 2.18 2.97 | 2.50 | — |
| Comparative Example 9 | Photosensitive composition 35 | Pigment dispersion liquid 1 Pigment dispersion liquid 12 | 2.18 2.97 | 2.50 | — |
| Comparative Example 10 | Photosensitive composition 36 | Pigment dispersion liquid 1 Pigment dispersion liquid 12 | 2.18 2.97 | 3.30 | — |

| | Compound other than (a-1) to (a-3) components | | Compound having two or more radical polymerizable groups | | Photo-polymerization initiator | Solvent | Solid content of Photosensitive composition (wt %) |
|---|---|---|---|---|---|---|---|
| | Structure formula | weight (g) | DPCA-60 weight (g) | DPHA weight (g) | (NCI-831) weight (g) | (PGMEA) weight (g) | |
| Comparative Example 1 | — | — | 0.75 | — | 0.12 | 10.18 | 15.0 |
| Comparative Example 2 | — | — | 0.75 | — | 0.12 | 10.78 | 15.0 |
| Comparative Example 3 | — | — | 0.75 | — | 0.12 | 7.91 | 15.0 |
| Comparative Example 4 | — | — | 0.75 | — | 0.12 | 9.20 | 15.0 |
| Comparative Example 5 | — | — | — | 0.75 | 0.12 | 9.20 | 15.0 |
| Comparative Example 6 | — | — | — | 0.75 | 0.12 | 9.52 | 15.0 |
| Comparative Example 7 | — | — | 0.75 | — | 0.12 | 9.86 | 15.0 |
| Comparative Example 8 | Compound expressed by chemical structure (42) | 0.45 | 0.69 | — | 0.12 | 11.09 | 15.0 |
| Comparative Example 9 | Compound expressed by chemical structure (43) | 0.45 | 0.69 | — | 0.12 | 11.09 | 15.0 |
| Comparative Example 10 | Compound expressed by chemical structure (43) | 0.15 | 0.75 | — | 0.12 | 10.53 | 15.0 |

TABLE 17

| | Photosensitive composition | | | | | | |
|---|---|---|---|---|---|---|---|
| | | Pigment component content in total solid content (wt %) | | Compound other than (a-1) to (a-3) components | | | |
| | Type of Composition having negative-type photosensitivity | (c) Inorganic pigment having near infrared shielding property | Organic pigment | Content in total solid content (wt %) | Structure formula | Carbon numbers of long chain alkyl group | Total numbers of tertialy carbon and quatenary carbon |
| Comparative Example 1 | Photosensitive composition 27 | 14.0 (TiN) | 11.9 (Pseudo black) | — | — | — | — |
| Comparative Example 2 | Photosensitive composition 28 | 14.0 (TiN) | 7.1 (S0100) | — | — | — | — |
| Comparative Example 3 | Photosensitive composition 29 | — | 33.0 (Pseudo black) | — | — | — | — |
| Comparative Example 4 | Photosensitive composition 30 | — | 22.6 (S0100) | — | — | — | — |
| Comparative Example 5 | Photosensitive composition 31 | — | 22.6 (S0100) | — | — | — | — |
| Comparative Example 6 | Photosensitive composition 32 | — | 22.6 (S0100) | — | — | — | — |
| Comparative Example 7 | Photosensitive composition 33 | 6.60 (TPK-1227) | 16.0 (S0100) | — | — | — | — |
| Comparative Example 8 | Photosensitive composition 34 | 14.0 (TiN) | 11.9 (Pseudo black) | 15.0 | Compound expressed by chemical structure (42) | 8 | 2 |
| Comparative Example 9 | Photosensitive composition 35 | 14.0 (TiN) | 11.9 (Pseudo black) | 15.0 | Compound expressed by chemical structure (43) | 20 | 0 |

TABLE 17-continued

| | | | | | | | |
|---|---|---|---|---|---|---|---|
| Comparative Example 10 | Photosensitive composition 36 | 14.0 (TiN) | 11.9 (Pseudo black) | 5.0 | Compound expressed by chemical structure (43) | 20 | 0 |

| | (1) Evaluation of cured film | | | | |
|---|---|---|---|---|---|
| | (i) Maximum of light transmission at wave length of 780 to 1000 nm (%) | (ii) Light transmission at wave length of 550 nm (%) | (iii) Permittivity at frequency of 1 kHz | (iv) Pattern linearity | (v) Flexibility Minimum carvature radius (mm) |
| Comparative Example 1 | 4.2 | 0.5 | 5.6 | A | 1.00 |
| Comparative Example 2 | 4.2 | 0.5 | 5.6 | A | 1.00 |
| Comparative Example 3 | 91.9 | 1.0 | 3.6 | A | 1.00 |
| Comparative Example 4 | 91.6 | 1.0 | 3.6 | A | 1.00 |
| Comparative Example 5 | 91.6 | 1.0 | 3.6 | A | 1.00 |
| Comparative Example 6 | 91.6 | 1.0 | 3.6 | A | 1.00 |
| Comparative Example 7 | 35.5 | 6.1 | 7.2 | A | 0.40 |
| Comparative Example 8 | 4.2 | 0.5 | 5.6 | A | 1.00 |
| Comparative Example 9 | 4.2 | 0.5 | 3.9 | D | 0.05 |
| Comparative Example 10 | 4.2 | 0.5 | 4.6 | D | 0.25 |

TABLE 18

| | Type of Composition having negative-type photosensitivity | (2) Evaluation of organic EL display Unevenness of Luminance | (3) Evaluation of Flexible organic EL display device Area percentage of light emmiting part (%) | | | |
|---|---|---|---|---|---|---|
| | | | after 1 hr | after 50 hrs | after 100 hrs | after 500 hrs |
| Comparative Example 1 | Photosensitive composition 27 | D | A | A | C | D |
| Comparative Example 2 | Photosensitive composition 28 | D | A | A | C | D |
| Comparative Example 3 | Photosensitive composition 29 | A | A | A | B | D |
| Comparative Example 4 | Photosensitive composition 30 | A | A | A | B | D |
| Comparative Example 5 | Photosensitive composition 31 | A | A | A | C | D |
| Comparative Example 6 | Photosensitive composition 32 | A | A | A | C | D |
| Comparative Example 7 | Photosensitive composition 33 | D | A | B | C | D |
| Comparative Example 8 | Photosensitive composition 34 | D | A | A | C | D |
| Comparative Example 9 | Photosensitive composition 35 | A | A | A | B | B |
| Comparative Example 10 | Photosensitive composition 36 | B | A | A | C | D |

Comparative Examples 8 to 10

The photosensitive compositions 34 to 36 having negative photosensitivity and having a solid content of 15% by weight were prepared in accordance with the kinds and blended amounts (g) of the respective raw materials shown in Table 16 using the compounds represented by the below-mentioned structural formulae (42) and (43) in place of the compound represented by the structural formula (3), and the cured films and organic EL display devices were produced in the same manner as in Example 1 and evaluated. The evaluation results are shown in Tables 17 and 18. In this regard, the compounds represented by the below-mentioned structural formulae (42) and (43) are not the compounds corresponding to the above-mentioned (a-1) to (a-3) components.

[Chem. 31]

(42)

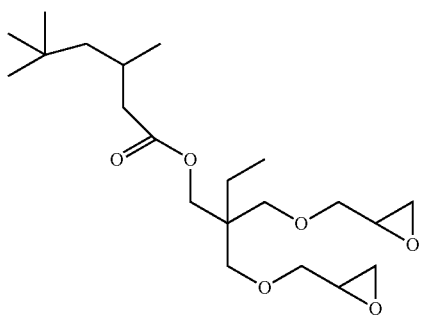

[Chem. 32]

(43)

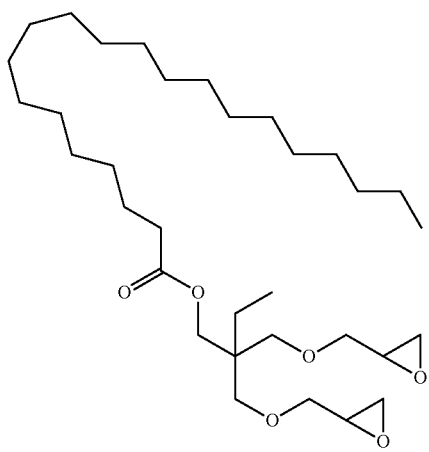

Comparative Examples 11 to 17

The photosensitive compositions 27 to 33 having negative photosensitivity and having a solid content of 15% by weight were prepared in accordance with the kinds and blended amounts (g) of the respective raw materials shown in Table 19 using the compounds represented by the below-mentioned structural formulae (44) to (49) in place of the compound represented by the structural formula (3), and the cured films and organic EL display devices were produced in the same manner as in Example 1 and evaluated. The evaluation results are shown in Tables 20 and 21. In this regard, the compounds represented by the below-mentioned structural formulae (44) to (49) are not the compounds corresponding to the above-mentioned (a-1) to (a-3) components.

[Chem. 33]

(44)

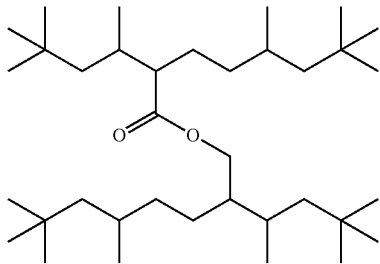

[Chem. 34]

(45)

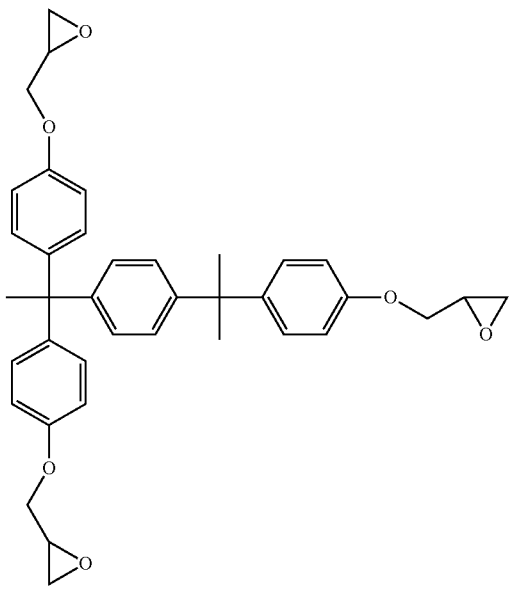

[Chem. 35]

(46)

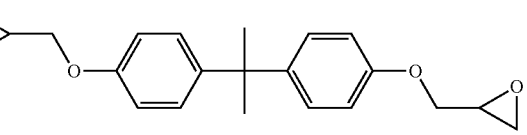

[Chem. 36]

(47)

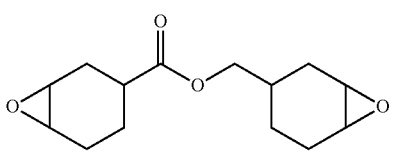

[Chem. 37]

(48)

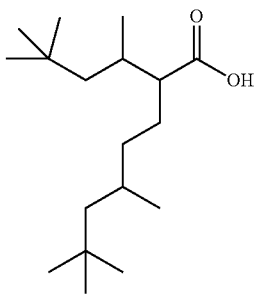

-continued

[Chem. 38]

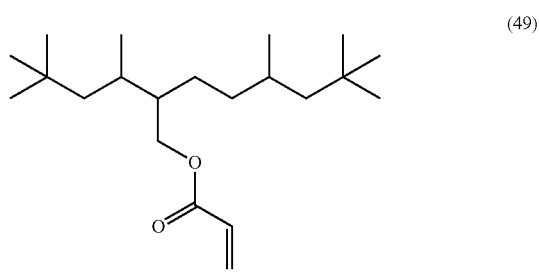

(49)

TABLE 19

| Type of Composition having negative-type photosensitivity | Pigment dispersion liquid | | Polyimide resin solution A (PGMEA solution of solid content 30 wt %) weight (g) | Compound other than (a-1) to (a-3) components | |
|---|---|---|---|---|---|
| | | Type | weight (g) | Structure formula | weight (g) |
| Comparative Example 11 | Photosensitive composition 37 | Pigment dispersion liquid 1 | 2.18 | 3.10 | Compound expressed by chemical structure (44) | 0.45 |
| | | Pigment dispersion liquid 4 | 1.77 | | | |
| Comparative Example 12 | Photosensitive composition 38 | Pigment dispersion liquid 1 | 2.18 | 3.10 | Compound expressed by chemical structure (45) | 0.45 |
| | | Pigment dispersion liquid 4 | 1.77 | | | |
| Comparative Example 13 | Photosensitive composition 39 | Pigment dispersion liquid 1 | 2.18 | 3.10 | Compound expressed by chemical structure (44) | 0.45 |
| | | Pigment dispersion liquid 4 | 1.77 | | Compound expressed by chemical structure (45) | |
| Comparative Example 14 | Photosensitive composition 40 | Pigment dispersion liquid 1 | 2.18 | 3.10 | Compound expressed by chemical structure (46) | 0.45 |
| | | Pigment dispersion liquid 4 | 1.77 | | | |
| Comparative Example 15 | Photosensitive composition 41 | Pigment dispersion liquid 1 | 2.18 | 3.10 | Compound expressed by chemical structure (47) | 0.45 |
| | | Pigment dispersion liquid 4 | 1.77 | | | |
| Comparative Example 16 | Photosensitive composition 42 | Pigment dispersion liquid 1 | 2.18 | 3.10 | Compound expressed by chemical structure (48) | 0.45 |
| | | Pigment dispersion liquid 4 | 1.77 | | | |
| Comparative Example 17 | Photosensitive composition 43 | Pigment dispersion liquid 1 | 2.18 | 3.10 | Compound expressed by chemical structure (49) | 0.45 |
| | | Pigment dispersion liquid 4 | 1.77 | | | |

| | Compound having two or more radical polymerizable group (DPCA-60) weight (g) | Photo-polymerization initiator (NCI-831) weight (g) | Solvent (PGMEA) weight (g) | Solid content of Photosensitive composition (wt %) |
|---|---|---|---|---|
| Comparative Example 11 | 0.69 | 0.12 | 11.69 | 15.0 |
| Comparative Example 12 | 0.69 | 0.12 | 11.69 | 15.0 |
| Comparative Example 13 | 0.69 | 0.12 | 11.69 | 15.0 |
| Comparative Example 14 | 0.69 | 0.12 | 11.69 | 15.0 |
| Comparative Example 15 | 0.69 | 0.12 | 11.69 | 15.0 |
| Comparative Example 16 | 0.69 | 0.12 | 11.69 | 15.0 |
| Comparative Example 17 | 0.69 | 0.12 | 11.69 | 15.0 |

TABLE 20

| | Type of Composition having negative-type photosensitivity | Pigment component content in total solid content (wt %) | | Compound other than (a-1) to (a-3) components | | Carbon numbers of long chain alkyl group having carbon numbers of 9 to 19 | Total numbers of tertialy carbon and quatenary carbon of long chain alkyl group of carbon numbers 9 to 19 | Presence or absence of epoxy group |
|---|---|---|---|---|---|---|---|---|
| | | (c) Inorganic pigment having near infrared shielding property | Organic pigment | Content in total solid content (wt %) | Structure formula | | | |
| Comparative Example 11 | Photosensitive composition 37 | 14.0 (TiN) | 7.1 (S0100) | 15.0 | Compound expressed by chemical structure (44) | 17, 18 | 4, 4 | absence |
| Comparative Example 12 | Photosensitive composition 38 | 14.0 (TiN) | 7.1 (S0100) | 15.0 | Compound expressed by chemical structure (45) | — | — | presence |
| Comparative Example 13 | Photosensitive composition 39 | 14.0 (TiN) | 7.1 (S0100) | 7.5 | Compound expressed by chemical structure (44) | 17, 18 | 4, 4 | absence |
| | | | | 7.5 | Compound expressed by chemical structure (45) | — | — | presence |
| Comparative Example 14 | Photosensitive composition 40 | 14.0 (TiN) | 7.1 (S0100) | 15.0 | Compound expressed by chemical structure (46) | — | — | presence |
| Comparative Example 15 | Photosensitive composition 41 | 14.0 (TiN) | 7.1 (S0100) | 15.0 | Compound expressed by chemical structure (47) | — | — | presence |
| Comparative Example 16 | Photosensitive composition 42 | 14.0 (TiN) | 7.1 (S0100) | 15.0 | Compound expressed by chemical structure (48) | 17 | 3 | absence |
| Comparative Example 17 | Photosensitive composition 43 | 14.0 (TiN) | 7.1 (S0100) | 15.0 | Compound expressed by chemical structure (49) | 18 | 4 | absence |

| | (1) Evaluation of cured film | | | | |
|---|---|---|---|---|---|
| | (i) Maximum of light transmission at wave length of 780 to 1000 nm (%) | (ii) Light transmission at wave length of 550 nm (%) | (iii) Permittivity at frequency of 1 kHz | (iv) Pattern linearity | (v) Flexibility Minimum carvature radius (mm) |
| Comparative Example 11 | 4.0 | 0.5 | 5.8 | D | out of measurement range |
| Comparative Example 12 | 4.2 | 0.5 | 5.5 | A | 1.00 |
| Comparative Example 13 | 4.1 | 0.5 | 5.6 | C | out of measurement range |
| Comparative Example 14 | 4.2 | 0.5 | 5.4 | A | 1.00 |
| Comparative Example 15 | 4.2 | 0.5 | 5.5 | A | 1.00 |
| Comparative Example 16 | 4.0 | 0.5 | 5.8 | D | out of measurement range |
| Comparative Example 17 | 4.0 | 0.5 | 5.8 | C | out of measurement range |

TABLE 21

| | Type of Composition having negative-type | (2) Evaluation of organic EL display Unevenness of Luminance | (3) Evaluation of Flexible organic EL display device Area percentage of light emmiting part (%) | | | |
|---|---|---|---|---|---|---|
| | | | after 1 hr | after 50 hrs | after 100 hrs | after 500 hrs |
| Comparative Example 11 | Photosensitive composition 37 | D | B | C | C | F |
| Comparative Example 12 | Photosensitive composition 38 | D | A | A | C | D |
| Comparative Example 13 | Photosensitive composition 39 | D | B | C | C | E |

TABLE 21-continued

| | Type of Composition having negative-type | (2) Evaluation of organic EL display Unevenness of Luminance | (3) Evaluation of Flexible organic EL display device Area percentage of light emmiting part (%) | | | |
|---|---|---|---|---|---|---|
| | | | after 1 hr | after 50 hrs | after 100 hrs | after 500 hrs |
| Comparative Example 14 | Photosensitive composition 40 | D | A | A | C | D |
| Comparative Example 15 | Photosensitive composition 41 | D | A | A | C | D |
| Comparative Example 16 | Photosensitive composition 42 | D | B | C | C | F |
| Comparative Example 17 | Photosensitive composition 43 | D | A | C | D | E |

Example 27

A mixture of 2.18 g of the pigment dispersion liquid 8, 0.67 g of the pigment dispersion liquid 13, 0.45 g of the compound represented by the structural formula (11), 4.35 g of the polyimide resin solution A, 0.60 g of quinonediazide compound a, and 11.75 g of PGMEA was brought into a hermetically enclosed condition and stirred on a shaker for 30 minutes to prepare a photosensitive composition 44 having positive photosensitivity and having a solid content of 15% by weight. The cured film and organic EL display device were produced and evaluated in the same manner as in Example 1 except that pattern exposure was not carried out in producing a substrate for evaluating optical properties, a substrate for evaluating permittivity, and a substrate for evaluating flexibility and that a positive exposure mask having openings and light-shielding portions that were inversed in the negative exposure mask was used in producing a substrate having a patterned cured film formed thereon. The blended amounts (g) of the raw materials are shown in Table 22, and the evaluation results are shown in Tables 23 and 24.

TABLE 22

| | Type of Composition having positive-type photosensitivity | Pigment dispersion liquid | | (a-1) component Epoxy compound having long chain alkyl group of carbon numbers 9 to 19 | |
|---|---|---|---|---|---|
| | | Type | weight (g) | Structure formula | weight (g) |
| Example 27 | Photosensitive composition 44 | Pigment dispersion liquid 8 | 2.18 | Compound expressed by chemical structure (11) | 0.45 |
| | | Pigment dispersion liquid 13 | 0.67 | | |
| Comparative Example 18 | Photosensitive composition 45 | Pigment dispersion liquid 8 | 2.18 | — | — |
| | | Pigment dispersion liquid 13 | 0.67 | | |

| | Polyimide solution A (PGMEA solution of solid content 30 wt %) weight (g) | Sensitizer (Quinonediazide compound a) weight (g) | Solvent (PGMEA) weight (g) | Solid content of Photosensitive composition (wt %) |
|---|---|---|---|---|
| Example 27 | 4.35 | 0.60 | 11.75 | 15.0 |
| Comparative Example 18 | 5.85 | 0.60 | 10.70 | 15.0 |

TABLE 23

| | | Photosensitive composition | | | | | |
|---|---|---|---|---|---|---|---|
| | | Pigment component | | | (a-1) component Epoxy compound having long chain alkyl group of carbon numbers 9 to 19 | | |
| | Type of Composition having positive-type photosensitivity | content in total solid content (wt %) | | Content in total solid content (wt %) | | Carbon numbers of long chain alkyl group | Total numbers of tertialy carbon and quatenary carbon |
| | | (c) Inorganic pigment having near infrared shielding property | Organic pigment | | Structure formula | | |
| Example 27 | Photosensitive composition 44 | 14.0 (TiN) | 2.7 (Pseudo black) | 15.0 | Compound expressed by chemical structure (11) | 17 | 4 |

TABLE 23-continued

| | | | | | | | | |
|---|---|---|---|---|---|---|---|---|
| Comparative Example 18 | Photosensitive composition 45 | 14.0 (TiN) | 2.7 (Pseudo black) | — | — | | — | — |

| | (1) Evaluation of cured film | | | | |
|---|---|---|---|---|---|
| | (i) Maximum of light transmission at wave length of 780 to 1000 nm (%) | (ii) Light transmission at wave length of 550 nm (%) | (iii) Permittivity at frequency of 1 kHz | (iv) Pattern linearity | (v) Flexibility Minimum carvature radius (mm) |
| Example 27 | 4.2 | 2.6 | 4.4 | B | 0.15 |
| Comparative Example 18 | 4.2 | 2.6 | 5.8 | B | 1.00 |

TABLE 24

| | Type of Composition having positive-type | (2) Evaluation of organic EL display Unevenness of Luminance | (3) Evaluation of Flexible organic EL display device Area percentage of light emmiting part (%) | | | |
|---|---|---|---|---|---|---|
| | | | after 1 hr | after 50 hrs | after 100 hrs | after 500 hrs |
| Example 27 | Photosensitive composition 44 | A | A | A | A | B |
| Comparative Example 18 | Photosensitive composition 45 | D | A | A | B | D |

Comparative Example 18

A photosensitive composition 45 having positive photosensitivity and having a solid content of 15% by weight were prepared in accordance with the kinds and blended amounts (g) of the raw materials shown in Table 22 using the same procedures in Example 27 except that the compound represented by the above-mentioned structural formula (11) was not used, and the cured film and organic EL display device were produced in the same manner as in Example 27 and evaluated. The evaluation results are shown in Tables 23 and 24.

Synthesis Example: Synthesis of Polybenzoxazole Precursor Solution A

A dicarboxylic acid derivative mixture (0.16 mol) obtained by allowing 41.32 g (0.16 mol) of diphenylether-4,4'-dicarboxylic acid to react with 43.24 g (0.32 mol) of 1-hydroxy-1,2,3-benzotriazole under a dry nitrogen gas stream and 73.25 g (0.20 mol) of 2,2-bis(3-amino-4-hydroxyphenyl)hexafluoropropane were dissolved in 570.00 g of NMP, and then, the resulting mixture was allowed to react at 75° C. for 12 hours. Then, a solution of 13.13 g (0.08 mol) of 5-norbornene-2,3-dicarboxylic anhydride preliminarily dissolved in 70.00 g of NMP was added, and the resulting mixture was further allowed to react with stirring for 12 hours. The reaction mixture was filtered, and then, the reaction mixture was poured in a solution of water and methanol mixed at a ratio of 3:1 (by volume) to provide a white precipitate. This precipitate was collected by filtration, washed with water three times, and dried in a vacuum dryer at 80° C. for 24 hours to obtain an alkali-soluble polybenzoxazole precursor. This was dissolved in PGMEA to obtain a polybenzoxazole precursor solution A having a solid content of 30% by weight.

Example 28

A photosensitive composition 46 having negative photosensitivity and having a solid content of 15% by weight was prepared in accordance with the kinds and blended amounts (g) of the raw materials shown in Table 25 using the compound represented by the above-mentioned structural formula (11) in place of the compound represented by the structural formula (3) and using the polybenzoxazole precursor solution A in place of the polyimide resin solution A, and the cured film and organic EL display device were produced in the same manner as in Example 1 and evaluated. The evaluation results are shown in Tables 26 and 27.

Comparative Example 19

A photosensitive composition 47 having negative photosensitivity and having a solid content of 15% by weight was prepared in accordance with the kinds and blended amounts (g) of the raw materials shown in Table 25 without using the compound represented by the above-mentioned structural formula (11), and the cured film and organic EL display device were produced in the same manner as in Example 1 and evaluated. The evaluation results are shown in Tables 26 and 27.

TABLE 25

| | Type of Composition having negative-type photosensitivity | Pigment dispersion liquid Type | weight (g) | (a-1) component Epoxy compound having long chain alkyl group of carbon numbers 9 to 19 Structure formula | weight (g) | Polybenzoxazol precursor solution A (PGMEA solution of solid content 30 wt %) weight (g) |
|---|---|---|---|---|---|---|
| Example 28 | Photosensitive composition 46 | Pigment dispersion liquid 1 | 2.18 | Compound expressed by chemical structure (11) | 0.45 | 2.50 |
| | | Pigment dispersion liquid 12 | 2.97 | | | |
| Comparative Example 19 | Photosensitive composition 47 | Pigment dispersion liquid 1 | 2.18 | — | — | 3.80 |
| | | Pigment dispersion liquid 12 | 2.97 | | | |

| | Compound having two or more radical polymerizable groups (DPCA-60) weight (g) | Photo-polymerization initiator (NCI-831) weight (g) | Solvent (PGMEA) weight (g) | Solid content of Photosensitive composition (wt %) |
|---|---|---|---|---|
| Example 28 | 0.69 | 0.12 | 11.09 | 15.0 |
| Comparative Example 19 | 0.75 | 0.12 | 10.18 | 15.0 |

TABLE 26

| | Type of Composition having negative-type photosensitivity | Pigment component content in total solid content (wt %) (c) Inorganic pigment having near infrared sheilding property | Organic pigment | (a-1) component Epoxy compound having long chain alkyl group of carbon numbers 9 to 19 Content in total solid content (wt %) | Structure formula | Carbon numbers of long chain alkyl group | Total numbers of tertialy carbon and quatenary carbon |
|---|---|---|---|---|---|---|---|
| Example 28 | Photosensitive composition 46 | 14.0 (TiN) | 11.9 (Pseudo black) | 15.0 | Compound expressed by chemical structure (11) | 17 | 4 |
| Comparative Example 19 | Photosensitive composition 47 | 14.0 (TiN) | 11.9 (Pseudo black) | — | — | — | — |

| | (1) Evaluation of cured film | | | | |
|---|---|---|---|---|---|
| | (i) Maximum of light transmission at wave length of 780 to 1000 nm (%) | (ii) Light transmission at wave length of 550 nm (%) | (iii) Permittivity at frequency of 1 kHz | (iv) Pattern linearity | (v) Flexibility Minimum carvature radius (mm) |
| Example 28 | 4.2 | 0.5 | 4.2 | A | 0.15 |
| Comparative Example 19 | 4.2 | 0.5 | 5.6 | A | 1.00 |

TABLE 27

| | Type of Composition having negative-type photosensitivity | (2) Evaluation of organic EL display Unevenness of Luminance | (3) Evaluation of Flexible organic EL display device Area perecentage of light emitting part (%) | | | |
|---|---|---|---|---|---|---|
| | | | after 1 hr | after 50 hrs | after 100 hrs | after 500 hrs |
| Example 28 | Photosensitive composition 46 | A | A | A | A | B |
| Comparative Example 19 | Photosensitive composition 47 | D | A | A | C | D |

Example 29

A photosensitive composition 48 having positive photosensitivity and having a solid content of 15% by weight was prepared in accordance with the kinds and blended amounts (g) of the raw materials shown in Table 28 using the polybenzoxazole precursor solution A in place of the polyimide resin solution A. The cured film and organic EL display device were produced and evaluated in the same manner as in Example 1 except that pattern exposure was not carried out in producing a substrate for evaluating optical properties, a substrate for evaluating permittivity, and a substrate for evaluating flexibility and that a positive exposure mask having openings and light-shielding portions that were inversed in the negative exposure mask was used in producing a substrate having a patterned cured film formed thereon. The evaluation results are shown in Tables 29 and 30.

Comparative Example 20

A photosensitive composition 49 having positive photosensitivity and having a solid content of 15% by weight were prepared in accordance with the kinds and blended amounts (g) of the raw materials shown in Table 28 without using the compound represented by the above-mentioned structural formula (11), and the cured film and organic EL display device were produced in the same manner as in Example 29 and evaluated. The evaluation results are shown in Tables 29 and 30.

TABLE 28

| | Type of Composition having positive-type photosensitivity | Pigment dispersion liquid | | (a-1) component Epoxy compound having long chain alkyl group of carbon numbers 9 to 19 | |
|---|---|---|---|---|---|
| | | Type | weight (g) | Structure formula | weight (g) |
| Example 29 | Photosensitive composition 48 | Pigment dispersion liquid 8 | 2.18 | Compound expressed by chemical structure (11) | 0.45 |
| | | Pigment dispersion liquid 13 | 0.67 | | |
| Comparative Example 20 | Photosensitive composition 49 | Pigment dispersion liquid 8 | 2.18 | — | — |
| | | Pigment dispersion liquid 13 | 0.67 | | |

| | Polybenzoxazol precursor solution A (PGMEA solution of solid content 30 wt %) weight (g) | Sensitizer (Quinonediazide compound a) weight (g) | Solvent (PGMEA) weight (g) | Solid content of Photosensitive composition (wt %) |
|---|---|---|---|---|
| Example 29 | 4.35 | 0.60 | 11.75 | 15.0 |
| Comparative Example 20 | 5.85 | 0.60 | 10.70 | 15.0 |

TABLE 29

| | | Photosensitive composition | | | | | |
|---|---|---|---|---|---|---|---|
| | | Pigment component content in total solid content (wt %) | | | (a-1) component Epoxy compound having long chain alkyl group of carbon numbers 9 to 19 | | |
| | Type of Composition having positive-type photosensitivity | (c) Inorganic pigment having near infrared shieding property | Organic pigment | Content in total solid content (wt %) | Structure formula | Carbon numbers of long chain alkyl group | Total numbers of tertialy carbon and quaternary carbon |
| Example 29 | Photosensitive composition 48 | 14.0 (TiN) | 2.7 (Pseudo black) | 15.0 | Compound expressed by chemical structure (11) | 17 | 4 |
| Comparative Example 20 | Photosensitive composition 49 | 14.0 (TiN) | 2.7 (Pseudo black) | — | — | — | — |

| | (1) Evaluation of cured film | | | | |
|---|---|---|---|---|---|
| | (i) Maximum of light transmission at wave length of 780 to 1000 nm (%) | (ii) Light transmission at wave length of 550 nm (%) | (iii) Permittivity at frequency of 1 kHz | (iv) Pattern linearity | (v) Flexibility Minimum carvature radius (mm) |
| Example 29 | 4.2 | 2.6 | 4.4 | B | 0.15 |
| Comparative Example 20 | 4.2 | 2.6 | 5.8 | B | 1.00 |

TABLE 30

|  | Type of Composition having positive-type photosensitivity | (2) Evaluation of organic EL display Unevenness of Luminance | (3) Evaluation of Flexible organic EL display device Area percentage of light emmiting part (%) | | | |
|---|---|---|---|---|---|---|
|  |  |  | after 1 hr | after 50 hrs | after 100 hrs | after 500 hrs |
| Example 29 | Photosensitive composition 48 | A | A | A | A | B |
| Comparative Example 20 | Photosensitive composition 49 | D | A | A | B | D |

Examples and Comparative Examples will be discussed below.

The results have revealed that Examples 14 to 15 have obtained better pattern linearity compared with Comparative Examples 3 to 6 having the same level of optical properties and at the same time, have achieved enhanced flexibility and light emission reliability.

The results have revealed that Examples 1 to 8 containing the compound having a $C_9$-$C_{19}$ long-chain alkyl group, the compound being contained in the above-mentioned (a-1) component, have achieved enhanced flexibility and light emission reliability compared with Comparative Example 1 having the same level of optical properties.

In addition, the results have revealed that Example 25 containing the above-mentioned (a-2) component and Example 26 containing the above-mentioned (a-3) component have achieved enhanced flexibility and light emission reliability compared with Comparative Example 1 having the same level of optical properties.

Comparative Example 8 containing the compound having a $C_8$ alkyl group has exhibited no enhanced flexibility nor enhanced light emission reliability. The results have revealed that Comparative Example 9 containing the compound having a $C_{20}$ long-chain alkyl group has exhibited enhanced light emission reliability, but exhibited much deteriorated pattern linearity, and that Comparative Example 10 having the content adjusted to a lower level has also exhibited deteriorated pattern linearity.

The above-mentioned findings have revealed that it is essential that the number of carbon atoms of the long-chain alkyl group in the above-mentioned (a-1) to (a-3) components contained in the photosensitive composition is in the range from 9 to 19 in order to obtain the effect of the present invention.

On the other hand, Comparative Examples 11, 16 and 17 containing the compound that is represented by the structural formula (44), (48), or (49) and had a $C_9$-$C_{19}$ long-chain alkyl group but had no epoxy group have exhibited no improvement compared with Comparative Example 2 having the same level of optical properties. Comparative Examples 12 to 15 each containing the compound that is represented by the structural formula (45), (46), or (47) and contrarily had an epoxy group but had no $C_9$-$C_{19}$ long-chain alkyl group have exhibited no improvement compared with Comparative Example 2 having the same level of optical properties. Comparative Example 13 that contains a mixture of the compound having a $C_9$-$C_{19}$ long-chain alkyl group but having no epoxy group and the compound having an epoxy group but having no $C_9$-$C_{19}$ long-chain alkyl group has also exhibited no improvement compared with Comparative Example 2 having the same level of optical properties.

From the above-mentioned findings, a difference in effect from the compound that has both a $C_9$-$C_{19}$ long-chain alkyl group and an epoxy group in the molecule, the component being the above-mentioned (a-1) component, is obvious.

Examples 14 and 15 each containing only an organic pigment as a colorant have a high light transmittance that was 90% or more in the near infrared range, and, this indicates that an organic pigment is a colorant having extremely low near infrared light-shielding property. On the other hand, the results have revealed that, compared with Example 15, Example 5 containing titanium nitride in addition to blue, yellow, and red organic pigments has achieved high light-shielding property in the near infrared and visible light ranges with a lower pigment concentration and also achieved high flexibility. This effect is considered to be because an organic pigment has a specific gravity in the range from 1.4 to 1.6, but titanium nitride has a high specific gravity that is 5.3, the pigment has high light-shielding property per volume, the amount of pigment component contained at the same level accordingly makes it possible to decrease the volume occupied by the particles in the film, and, as a result, enhanced flexibility was obtained.

Example 9 containing an organic black pigment having a high coloring power in the visible light range makes it possible to decrease the amount of colorant needed to obtain the same level of optical properties and results in affording enhanced flexibility, compared with Example 5 containing a mixture of blue, yellow, and red organic pigments.

In addition, the results have revealed that although Comparative Examples 1 to 2, 7 to 8, and 18 have high near infrared light-shielding property imparted by (c) an inorganic pigment having near infrared light-shielding property, the Comparative Examples have exhibited a problem of unevenness of luminance as an adverse effect, but that Examples 1 to 13 and 16 to 24 have successfully achieved both high near infrared light-shielding property and suppressed unevenness of luminance. This difference is considered to be due to an effect brought about by the fact that an increase in permittivity to be caused by (c) an inorganic pigment having near infrared light-shielding property was avoided owing to containing the above-mentioned (a-1) component.

Examples 22 and 23 in which a vanadyl phthalocyanine near infrared absorbing dye was used in addition to (c) an inorganic pigment having near infrared light-shielding property have achieved further higher near infrared light-shielding property without impairing any one of permittivity, flexibility, and light emission reliability, compared with Example 9.

Example 28 compared with Comparative Example 19 and Example 29 compared with Comparative Example 20 have each achieved enhanced flexibility and light emission reliability. These tendencies have much in common with the excellent characteristics that Example 5 compared with Comparative Example 1 and Example 27 compared with Comparative Example 18 each have. That is, the effect of the present invention is achieved whether the alkali soluble resin contained in the photosensitive composition according to the present invention is an alkali soluble polyimide resin or an alkali soluble polybenzoxazole precursor. In addition, the effect of the present invention is achieved whether the photosensitivity of the photosensitive composition according to the present invention is negative photosensitivity or positive photosensitivity.

All the above-mentioned Examples and Comparative Examples have revealed that the photosensitive composition according to the present invention is useful.

INDUSTRIAL APPLICABILITY

The photosensitive composition according to the present invention can be used not only as a pixel division layer of an organic EL display device but also as a material for forming a TFT planarization layer, and is particularly useful in applications for electronic equipment such as bendable or foldable smartphones.

REFERENCE SIGNS LIST

1: TFT
2: wiring line
3: TFT insulating film
4: planarization layer
5: second electrode (ITO electrode)
6: substrate
7: contact hole
8: pixel division layer
9: light emitting pixel
10: first electrode
11: opening
12: patterned cured film
13: cured film
14: flexible substrate
15: non-alkali glass substrate
16: metal reflection layer
17: second electrode
18: auxiliary electrode
19: patterned cured film
20: organic EL layer
21: first electrode

The invention claimed is:

1. A photosensitive composition, comprising at least one compound selected from the group consisting of the following (a-1) to (a-3) and (b) a photosensitizer:
    (a-1) an epoxy compound having a $C_9$-$C_{19}$ long-chain alkyl group,
    (a-2) a resin having a structure represented by formula (1), and
    (a-3) a resin having a structure represented by formula (2):

[Chem. 1]

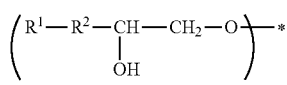

(1)

wherein $R^1$ represents a $C_9$-$C_{19}$ long-chain alkyl group, $R^2$ represents COOCH$_2$ or an oxymethylene group, and * represents a bonding position,

[Chem. 2]

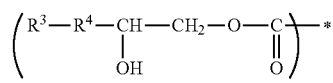

(2)

wherein $R^3$ represents a $C_9$-$C_{19}$ long-chain alkyl group, $R^4$ represents COOCH$_2$ or an oxymethylene group, and * represents a bonding position, and
wherein the $C_9$-$C_{19}$ long-chain alkyl group of each of (a-1), (a-2) and (a-3) is a branched alkyl group having a total of three or more tertiary carbons and/or quaternary carbons.

2. The photosensitive composition according to claim 1, further comprising (c) an inorganic pigment having near infrared shielding property.

3. The photosensitive composition according to claim 2, wherein the (c) inorganic pigment having near infrared shielding property contains at least one inorganic pigment selected from an inorganic black pigment one or more titanium atoms, an inorganic black pigment having one or more zirconium atoms, and amorphous carbon black having an $SP^3$ structure at 30 to 70 atom % with respect to the total of the $SP^3$ structure and $SP^2$ structure.

4. The photosensitive composition according to claim 1, the long-chain alkyl group of the compound selected from the group consisting of the (a-1) to the (a-3) is a branched alkyl group represented by the following structural formula (50):

[Chem. 3]

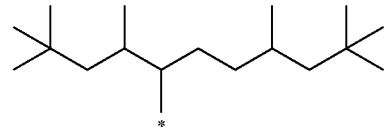

(50)

wherein * represents a binding position.

5. The photosensitive composition according to claim 1, comprising at least one compound of the (a-2) and the (a-3), wherein the resin having a structure represented by the formula (1) is a polyimide resin, and wherein the resin having a structure represented by the formula (2) is a cardo resin.

6. The photosensitive composition according to claim 1, further comprising (d) an organic black pigment.

7. The photosensitive composition according to claim 1, having negative photosensitivity, wherein the (b) photosensitizer comprises a compound having two or more radical polymerizable groups and comprises a photopolymerization initiator.

8. The photosensitive composition according to claim 1, having positive photosensitivity, wherein the (b) photosensitizer comprises a photo-acid generator.

9. The photosensitive composition according to claim 1, further comprising (e) a vanadyl phthalocyanine near infrared absorbing dye.

10. The photosensitive composition according to claim 1, wherein a cured film having a thickness of 2.0 μm that is formed of the photosensitive composition has a maximum light transmittance of 5.0% or less in wavelengths from 780 to 1,000 nm and a permittivity of less than 5.0 at a frequency of 1 kHz.

11. A cured film composed of a cured product of the photosensitive composition according to claim 1.

12. An organic EL display device comprising a cured film of the photosensitive composition according to claim 1.

13. An organic EL display device comprising a flexible substrate composed of a polyimide resin and comprising a cured film of the photosensitive composition according to claim 1.

14. An organic EL display device comprising a pixel division layer composed of the cured film according to claim 11.

15. An organic EL display device according to claim 14, wherein the pixel division layer has an opening rate of 20% or less in the display area of the organic EL display device.

* * * * *